US012582000B2

(12) United States Patent
Lee et al.

(10) Patent No.: US 12,582,000 B2
(45) Date of Patent: Mar. 17, 2026

(54) DISPLAY DEVICE

(71) Applicant: Samsung Display Co., LTD., Yongin-si (KR)

(72) Inventors: Hang Jae Lee, Yongin-si (KR); Kyong Sub Kim, Yongin-si (KR); Yuk Hyun Nam, Yongin-si (KR); Sung Jae Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 767 days.

(21) Appl. No.: 17/868,688

(22) Filed: Jul. 19, 2022

(65) Prior Publication Data

US 2023/0028194 A1     Jan. 26, 2023

(30) Foreign Application Priority Data

Jul. 23, 2021    (KR) ......................... 10-2021-0097369

(51) Int. Cl.
H01L 29/24        (2006.01)
H01L 25/16        (2023.01)
            (Continued)

(52) U.S. Cl.
CPC ............ H01L 25/167 (2013.01); H01L 24/24 (2013.01); H01L 24/25 (2013.01);
            (Continued)

(58) Field of Classification Search
CPC ....... H01L 25/167; H01L 24/24; H01L 24/25; H01L 2224/24051; H01L 2224/24145;
            (Continued)

(56) References Cited

U.S. PATENT DOCUMENTS 10,002,910 B2    6/2018  Oh et al.
10,763,311 B2    9/2020  Kim
            (Continued)

FOREIGN PATENT DOCUMENTS

JP          2021-034441 A      3/2021
KR    10-2017-0052766 A      5/2017
            (Continued)

OTHER PUBLICATIONS

International Search Report dated Nov. 9, 2022 for corresponding PCT Application No. PCT/KR2022/010770 (3 pages).
            (Continued)

*Primary Examiner* — Monica D Harrison
*Assistant Examiner* — David M Helberg
(74) *Attorney, Agent, or Firm* — Womble Bond Dickinson (US) LLP

(57)                ABSTRACT

A display device includes: a substrate; a plurality of pixel columns on the substrate, each of the plurality of pixel columns including a plurality of pixel groups each including a first pixel and a second pixel arranged along a first direction; and a bank enclosing a perimeter of each of the plurality of pixel groups, the bank including a first opening corresponding to each of the plurality of pixel groups, and a second opening located between two pixel groups adjacent to each other in the first direction among the plurality of pixel groups.

20 Claims, 29 Drawing Sheets

(51) Int. Cl.

| | | |
|---|---|---|
| *H01L 23/00* | (2006.01) | |
| *H10H 20/851* | (2025.01) | |
| *H10H 20/857* | (2025.01) | |

(52) U.S. Cl.

CPC ............... *H01L 2224/24051* (2013.01); *H01L 2224/24145* (2013.01); *H01L 2224/244* (2013.01); *H01L 2224/245* (2013.01); *H01L 2224/25175* (2013.01); *H01L 2924/01022* (2013.01); *H01L 2924/01024* (2013.01); *H01L 2924/01029* (2013.01); *H01L 2924/01042* (2013.01); *H01L 2924/01047* (2013.01); *H01L 2924/0542* (2013.01); *H01L 2924/0549* (2013.01); *H10H 20/8515* (2025.01); *H10H 20/857* (2025.01)

(58) Field of Classification Search

CPC ......... H01L 2224/244; H01L 2224/245; H01L 2224/25175; H01L 2924/01022; H01L 2924/01024; H01L 2924/01029; H01L 2924/01042; H01L 2924/01047; H01L 2924/0542; H01L 2924/0549; H01L 25/0753; H10H 20/8515; H10H 20/857; H10H 29/142; H10H 20/8506; G02B 5/201; H10D 86/441

See application file for complete search history.

(56) References Cited

U.S. PATENT DOCUMENTS

| | | | |
|---|---|---|---|
| 11,410,976 B2 | 8/2022 | Abe | |
| 12,058,911 B2 * | 8/2024 | Park | G02B 5/201 |
| 12,199,229 B2 * | 1/2025 | Li | H10H 20/857 |
| 2021/0296550 A1 | 9/2021 | Li et al. | |
| 2022/0123026 A1 | 4/2022 | Oh et al. | |

FOREIGN PATENT DOCUMENTS

| | | | |
|---|---|---|---|
| KR | 10-2017-0104086 A | 9/2017 | |
| KR | 10-2020-0017013 A | 2/2020 | |
| KR | 10-2020-0072160 A | 6/2020 | |
| KR | 10-2020-0072162 A | 6/2020 | |
| KR | 10-2020-0088954 A | 7/2020 | |
| KR | 10-2020-0118937 A | 10/2020 | |
| KR | 10-2020-0130606 A | 11/2020 | |
| KR | 10-2021-0081506 A | 7/2021 | |

OTHER PUBLICATIONS

Notice of Allowance dated Jun. 25, 2025 regarding Korean Patent Application No. 10-2021-0097369 corresponding to U.S. Appl. No. 17/868,688 (6 pages).

* cited by examiner

DISPLAY DEVICE

CROSS-REFERENCE TO RELATED APPLICATION

This application claims priority to and the benefit of Korean patent application number 10-2021-0097369 filed on Jul. 23, 2021, the entire content of which is incorporated by reference herein.

BACKGROUND

1. Field

Various embodiments of the present disclosure relate to a display device.

2. Description of Related Art

With an increase in interest in an information display and an increase in demand to use portable information media, demand for display devices is markedly increased, and commercialization thereof is in progress.

SUMMARY

Various embodiments of the present disclosure are directed to a display device in which a supply (or discharge) surface area of ink including light emitting elements may be secured, so that light output efficiency of the display device can be enhanced.

A display device in accordance with one or more embodiments of the present disclosure may include: a substrate; a plurality of pixel columns on the substrate, each of the plurality of pixel columns comprising a plurality of pixel groups each including a first pixel and a second pixel arranged along a first direction; and a bank enclosing a perimeter of each of the plurality of pixel groups, the bank including a first opening corresponding to each of the plurality of pixel groups, and a second opening located between two pixel groups adjacent to each other in the first direction among the plurality of pixel groups.

In one or more embodiments, each of the plurality of pixel groups may include an emission area corresponding to the first opening.

In one or more embodiments, in each of the plurality of pixel columns, one pixel group of the plurality of pixel groups of the corresponding pixel column and the second opening are alternately located along the first direction.

In one or more embodiments, each of the first and the second pixels may include: a first electrode and a second electrode extending in the first direction and spaced from each other in a second direction intersecting the first direction; and a plurality of light emitting elements located between the first electrode and the second electrode.

In one or more embodiments, the first electrode of the first pixel and the first electrode of the second pixel may be electrically disconnected (or separated) from each other in the first opening. The second electrode of the first pixel and the second electrode of the second pixel may be electrically disconnected from each other in the first opening.

In one or more embodiments, the emission area may include a first emission area in which light is emitted from the first pixel, and a second emission area in which light is emitted from the second pixel.

In one or more embodiments, each of the first and the second pixels may further include: a first connection electrode electrically connecting the first electrode with the light emitting elements; a second connection electrode electrically connecting the second electrode with the light emitting elements; and a color conversion layer located over the light emitting elements, and converting a first color of light emitted from the light emitting elements to a second color of light.

In one or more embodiments, the display device may further include a light block pattern disposed between the color conversion layer of the first pixel and the color conversion layer of the second pixel. The light block pattern may correspond to an area between the first emission area and the second emission area.

In one or more embodiments, the plurality of pixel columns may include a first pixel column, a second pixel column, and a third pixel column that are successively arranged along the second direction.

In one or more embodiments, the plurality of pixel groups of the first pixel column, the plurality of pixel groups of the second pixel column, the plurality of pixel groups of the third pixel column may emit the second colors of light different from each other.

In one or more embodiments, the light to be emitted from each of the plurality of pixel groups of the first pixel column may be red light. The light to be emitted from each of the plurality of pixel groups of the second pixel column may be green light. The light to be emitted from each of the plurality of pixel groups of the third pixel column may be blue light.

In one or more embodiments, the plurality of pixel groups of the first pixel column, the plurality of pixel groups of the second pixel column, the plurality of pixel groups of the third pixel column may be in a same pixel row in the second direction.

In one or more embodiments, at least one of the plurality of pixel groups of the first pixel column, at least one of the plurality of pixel groups of the second pixel column, and at least one of the plurality of pixel groups of the third pixel column each may be located on a pixel row different from at least one pixel group of a pixel column adjacent thereto in the second direction.

In one or more embodiments, each of the first and the second pixels may include a pixel circuit layer on the substrate and including at least one transistor electrically connected with the light emitting elements.

In one or more embodiments, each of the first and the second pixels may further include a bank pattern located each between the pixel circuit layer and the first electrode and between the pixel circuit layer and the second electrode.

In one or more embodiments, each of the first and the second pixels may include: a first electrode, a second electrode, a third electrode, and a fourth electrode extending in the first direction, and spaced from each other; and a plurality of light emitting elements located between two adjacent electrodes of the first to the fourth electrodes. The light emitting elements may include at least one first light emitting element located between the first electrode and the second electrode, and at least one second light emitting element located between the third electrode and the fourth electrode.

In one or more embodiments, the first electrode of the first pixel and the first electrode of the second pixel may be electrically disconnected from each other in the first opening. The second electrode of the first pixel and the second electrode of the second pixel may be electrically disconnected from each other in the first opening. The third electrode of the first pixel and the third electrode of the second pixel may be electrically disconnected from each other in the first opening. The fourth electrode of the first pixel and the fourth electrode of the second pixel may be electrically disconnected from each other in the first opening.

In one or more embodiments, each of the first and the second pixels may include: a first connection electrode on the first electrode, and electrically connecting one end of the first light emitting element with the first electrode; an intermediate electrode on each of the second and the fourth electrodes and electrically connecting a remaining end of the first light emitting element with one end of the second light emitting element; and a second connection electrode on the third electrode, and configured to electrically connect a remaining end of the second light emitting element with the third electrode.

A display device in accordance with one or more embodiments of the disclosure may include: a substrate including a display area and a non-display area; a first pixel column in the display area, the first pixel column including a plurality of first pixel groups each including two pixels arranged along a first direction; a second pixel column in the display area at a position adjacent to the first pixel column in a second direction intersecting the first direction, the second pixel column including a plurality of second pixel groups each including two pixels arranged along the first direction; a third pixel column in the display area at a position adjacent to the second pixel column in the second direction, the third pixel column including a plurality of third pixel groups each including two pixels arranged along the first direction; and a bank enclosing a perimeter of each of the plurality of first pixel groups, the plurality of second pixel groups, and the plurality of third pixel groups, the bank including a first opening corresponding to each of the plurality of first pixel groups, the plurality of second pixel groups, and the plurality of third pixel groups, and a second opening located between two pixel groups adjacent to each other in the first direction among the pixel groups included in each of the first to the third pixel columns.

In one or more embodiment, each of the plurality of first pixel groups, the plurality of second pixel groups, and the plurality of third pixel groups may include an emission area corresponding to the first opening.

In one or more embodiments, in the first pixel column, one first pixel group of the plurality of first pixel groups and the second opening may be alternately located along the first direction. In the second pixel column, one second pixel group of the plurality of second pixel groups and the second opening may be alternately located along the first direction. In the third pixel column, one third pixel group of the plurality of third pixel groups and the second opening may be alternately located along the first direction.

DETAILED DESCRIPTION

Figure 1A:
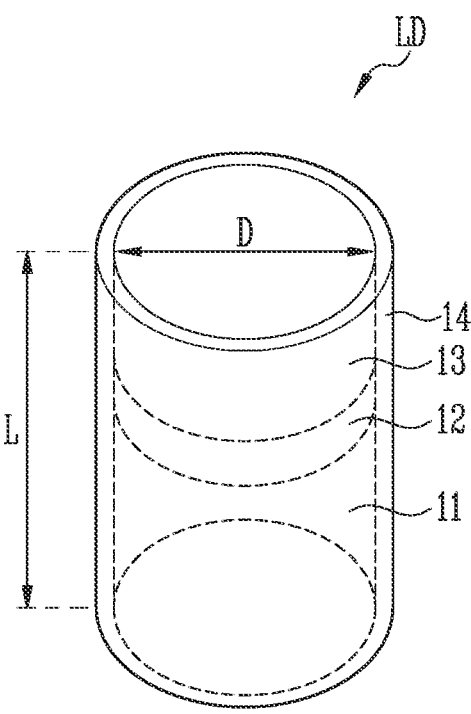
FIGS. 1A and 1B are perspective views schematically illustrating a light emitting element in accordance with one or more embodiments.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the technical scope of the present disclosure are encompassed in the disclosure.

Throughout the present disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

It will be understood that when an element (e.g., a first element) is referred to as being (operatively or communicatively) "coupled with/to," or "connected with/to" another element (e.g., a second element), the first element can be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) intervenes between the element and the other element.

Embodiments and required details of the present disclosure are described with reference to the accompanying drawings in order to describe the present disclosure in detail so that those having ordinary knowledge in the technical field to which the present disclosure pertains can easily practice the present disclosure. Furthermore, a singular form may include a plural form as long as it is not specifically mentioned in a sentence.

Figure 1B:
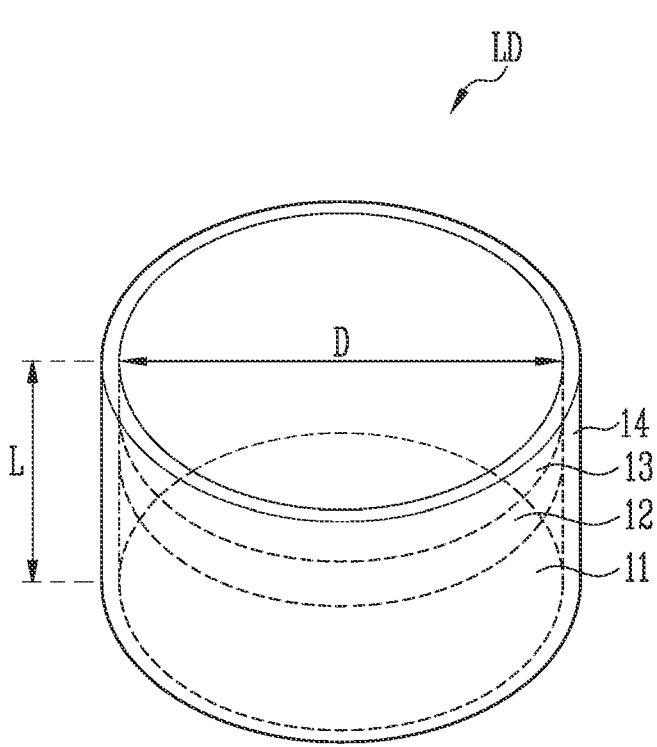
Figure 2:
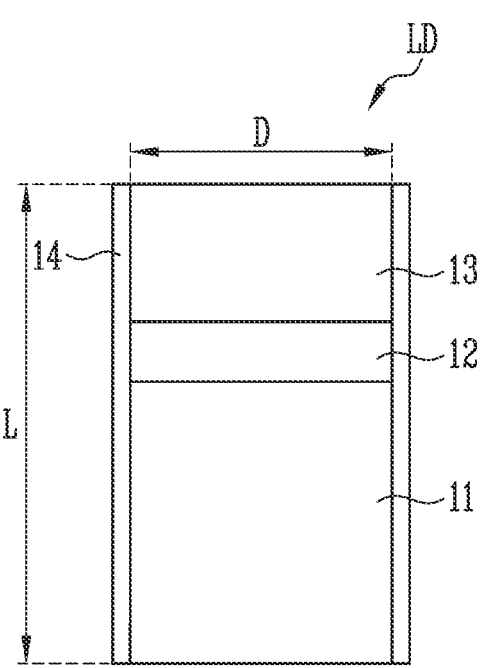
FIG. 2 is a cross-sectional view illustrating the light emitting element of FIG. 1A.

FIGS. 1A and 1B are perspective views schematically illustrating a light emitting element LD in accordance with one or more embodiments. FIG. 2 is a cross-sectional view illustrating the light emitting element LD of FIG. 1A.

In one or more embodiments of the present disclosure, the type and/or shape of the light emitting element LD is not limited to the embodiment illustrated in FIGS. 1A to 2.

Referring to FIGS. 1A to 2, the light emitting element LD may include a first semiconductor layer 11, a second semiconductor layer 13, and an active layer 12 interposed between the first semiconductor layer 11 and the second semiconductor layer 13. For example, the light emitting element LD may be implemented as a stack (or referred to as "emission stack") formed by successively stacking the first semiconductor layer 11, the active layer 12, and the second semiconductor layer 13.

The light emitting element LD may be formed in a shape extending in one direction. If the direction in which the light emitting element LD extends is defined as a longitudinal direction, the light emitting element LD may have one end (or a lower end) and a remaining end (or an upper end) with respect to the longitudinal direction. Any one semiconductor layer of the first and second semiconductor layers 11 and 13 may be disposed on the one end (or the lower end) of the light emitting element LD. The other semiconductor layer of the first and second semiconductor layers 11 and 13 may be disposed on the remaining end (or the upper end) of the light emitting element LD. For example, the first semiconductor layer 11 may be disposed on the one end (or the lower end) of the light emitting element LD, and the second semiconductor layer 13 may be disposed on the remaining end (or the upper end) of the light emitting element LD.

The light emitting element LD may have various shapes. For example, as illustrated in FIG. 1A, the light emitting element LD may have a rod-like shape, a bar-like shape, or a pillar-like shape which is long (i.e., to have an aspect ratio greater than 1) with respect to the longitudinal direction. In one or more embodiments, the length L of the light emitting element LD with respect to the longitudinal direction may be greater than the diameter (e.g., the diameter D, or a width of a cross-section) thereof. However, the present disclosure is not limited thereto. In one or more embodiments, as illustrated in FIG. 1B, the light emitting element LD may have a rod-like shape, a bar-like shape, or a pillar-like shape which is short with respect to the longitudinal direction (i.e., to have an aspect ratio less than 1). The light emitting element LD may have a rod-like shape, a bar-like shape, or a pillar-like shape in which the length L and the diameter D thereof are the same as each other.

The light emitting element LD may include a light emitting diode (LED) fabricated to have a subminiature size, e.g., with a diameter D and/or a length L corresponding to the micrometer scale or the nanometer scale.

In case that the light emitting element LD is long (i.e., to have an aspect ratio greater than 1) with respect to the longitudinal direction, the diameter D of the light emitting element LD may approximately range from 0.5 $\mu$m to 6 $\mu$m, and the length L thereof may approximately range from 1 $\mu$m to 10 $\mu$m. However, the diameter D and the length L of the light emitting element LD are not limited thereto. The size of the light emitting element LD may be changed to meet conditions (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer which includes any one semiconductor material of InAlGaN, GaN, AlGaN, InGaN, AlN, and InN and is doped with a first conductive dopant (or an n-type dopant) such as Si, Ge, or Sn. However, the constituent material of the first semiconductor layer 11 is not limited to thereto, and the first semiconductor layer 11 may be formed of various other materials. In one or more embodiments, the first semiconductor layer 11 may include gallium nitride (GaN) semiconductor material doped with a first conductive dopant (or an n-type dopant). The first semiconductor layer 11 may include, with regard to the longitudinal direction of the light emitting element LD, an upper surface that contacts the active layer 12, and a lower surface exposed to the outside. The lower surface of the first semiconductor layer 11 may correspond to the one end (or the lower end) of the light emitting element LD.

The active layer 12 may be disposed on the first semiconductor layer 11 and have a single or multiple quantum well structure. For example, in case that the active layer 12 has a multiple quantum well structure, the active layer 12 may be formed by periodically repeatedly stacking a barrier layer, a stain reinforcing layer, and a well layer that are provided as one unit. The stain reinforcing layer may have a lattice constant less than that of the barrier layer so that strain, e.g., compressive strain, to be applied to the well layer can be further reinforced. However, the structure of the active layer 12 is not limited to that of the foregoing embodiment.

The active layer 12 may emit light having a wavelength ranging from 400 nm to 900 nm, and use a double hetero structure. In one or more embodiments, a clad layer doped with a conductive dopant may be formed over or under the active layer 12 with respect to the longitudinal direction of the light emitting element LD. For example, the cladding layer may be formed of an AlGaN layer or an InAlGaN layer. In one or more embodiments, material such as AlGaN or InAlGaN may be used to form the active layer 12, and various other materials may be used to form the active layer 12. The active layer 12 may include a first surface that contacts the first semiconductor layer 11, and a second surface that contacts the second semiconductor layer 13.

If an electric field having a suitable voltage (e.g., a set or predetermined voltage) or more is applied to the opposite ends of the light emitting element LD, the light emitting element LD may emit light by coupling of electron-hole pairs in the active layer 12. Because light emission of the light emitting element LD can be controlled based on the foregoing principle, the light emitting element LD may be used as a light source (e.g., a light emitting source) of various light emitting devices as well as a pixel of the display device.

The second semiconductor layer 13 may be disposed on the second surface of the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer that includes any one semiconductor material of InAlGaN, GaN, AlGaN, InGaN, AlN, and InN, and is doped with a second conductive dopant (or a p-type dopant) such as Mg. However, the material for forming the second semiconductor layer 13 is not limited thereto, and the second semiconductor layer 13 may be formed of various other materials. In one or more embodiments, the second semiconductor layer 13 may include gallium nitride (GaN) semiconductor material doped with a second conductive dopant (or a p-type dopant). The second semiconductor layer 13 may include, with regard to the longitudinal direction of the light emitting element LD, a lower surface that contacts the second surface of the active layer 12, and an upper surface exposed to the outside. Here, the upper surface of the second semiconductor layer 13 may correspond to the remaining end (or the upper end) of the light emitting element LD.

In one or more embodiments, the first semiconductor layer 11 and the second semiconductor layer 13 may have different thicknesses with respect to the longitudinal direction of the light emitting element LD. For example, the first semiconductor layer 11 may have a thickness greater than that of the second semiconductor layer 13 with respect to the longitudinal direction of the light emitting element LD. Hence, the active layer 12 of the light emitting element LD may be disposed at a position closer to the upper surface of the second semiconductor layer 13 than to the lower surface of the first semiconductor layer 11.

Although the first semiconductor layer 11 and the second semiconductor layer 13 each is formed of a single layer, the present disclosure is not limited thereto. In one or more embodiments, depending on the material of the active layer 12, the first semiconductor layer 11 and the second semiconductor layer 13 each may further include one or more layers, for example, a clad layer and/or a tensile strain barrier reducing (TSBR) layer. The TSBR layer may be a strain relief layer of which a lattice structure is disposed between other semiconductor layers so that the strain relief layer functions as a buffer layer to reduce a difference in lattice constant. Although the TSBR layer may be formed of a p-type semiconductor layer such as p-GaInP, p-AlInP, or p-AlGaInP, the present disclosure is not limited thereto.

In one or more embodiments, the light emitting element LD may further include a contact electrode (hereinafter referred to as a 'first contact electrode') disposed over the second semiconductor layer 13 (e.g., the upper end of the light emitting element LD), as well as including the first semiconductor layer 11, the active layer 12, and the second semiconductor layer 13. Furthermore, in one or more embodiments, the light emitting element LD may further include another contact electrode (hereinafter referred to as a 'second contact electrode') disposed on one end of the first semiconductor layer 11 (e.g., the lower end of the light emitting element LD).

Each of the first and second contact electrodes may be an ohmic contact electrode, but the present disclosure is not limited thereto. In one or more embodiments, each of the first and second contact electrodes may be a Schottky contact electrode. The first and second contact electrodes may include conductive material. For example, the first and second contact electrodes may include opaque metal such as chrome (Cr), titanium (Ti), aluminum (Al), gold (Au), nickel (Ni), and oxides or alloys thereof, which are used alone or in combination, but the present disclosure is not limited thereto. In one or more embodiments, the first and second contact electrodes may also include transparent conductive oxides such as indium tin oxide (ITO), indium zinc oxide (IZO), zinc oxide (ZnO), indium gallium zinc oxide (IGZO), and indium tin zinc oxide (ITZO).

Materials included in the first and second contact electrodes may be the same as or different from each other. The first and second contact electrodes may be substantially transparent or translucent. Therefore, light generated from the light emitting element LD may pass through the first and second contact electrodes and then be emitted outside the light emitting element LD. In one or more embodiments, in case that light generated from the light emitting element LD is emitted outside the light emitting element LD through an area other than the opposite ends of the light emitting element LD rather than passing through the first and second contact electrodes, the first and second contact electrodes may include opaque metal.

In one or more embodiments, the light emitting element LD may further include an insulating layer 14. However, in one or more embodiments, the insulating layer 14 may be omitted, or may be provided to cover outer surfaces (e.g., the outer peripheral or circumferential surfaces) of only some of the first semiconductor layer 11, the active layer 12, and the second semiconductor layer 13.

The insulating layer 14 may prevent the active layer 12 from short-circuiting due to making contact with conductive material except the first and second semiconductor layers 11 and 13. Furthermore, the insulating layer 14 may reduce or minimize a surface defect of the light emitting element LD, thus enhancing the lifetime of the light emitting element LD and the emission efficiency thereof. In case that a plurality of light emitting elements LD are disposed in close contact with each other, the insulating layer 14 may prevent an undesired short-circuit from occurring between the light emitting elements LD. It is not limited whether the insulating layer 14 is provided or not, so long as the active layer 12 can be prevented from short-circuiting with external conductive material.

The insulating layer 14 may be provided to enclose an overall outer surface (e.g., an overall outer peripheral or circumferential surface) of the emission stack including the first semiconductor layer 11, the active layer 12, and the second semiconductor layer 13.

Although in the foregoing embodiment the insulating layer 14 has been described as enclosing the entirety of the respective outer surfaces (e.g., the respective outer peripheral or circumferential surfaces) of the first semiconductor layer 11, the active layer 12, and the second semiconductor layer 13, the present disclosure is not limited thereto. In one or more embodiments, in case that the light emitting element LD includes the first contact electrode, the insulating layer 14 may enclose the entirety of the respective outer surfaces (e.g., the respective outer peripheral or circumferential surfaces) of the first semiconductor layer 11, the active layer 12, the second semiconductor layer 13, and the first contact electrode. In one or more embodiments, the insulating layer 14 may not enclose the entirety of the outer surface (e.g. the outer peripheral or circumferential surface) of the first contact electrode, or may enclose only a portion of the outer surface (e.g., the outer circumferential surface) of the first contact electrode but not enclose the other portion of the outer surface (e.g., the outer circumferential surface) of the first contact electrode. Furthermore, in one or more embodiments, in case that the first contact electrode is disposed on the remaining end (or the upper end) of the light emitting element LD and the second contact electrode is disposed on the one end (or the lower end) of the light emitting element LD, the insulating layer 14 may allow at least one area of each of the first and second contact electrodes to be exposed.

The insulating layer 14 may include transparent insulating material. For example, the insulating layer 14 may be include one or more insulating materials selected from the group constituting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanstrontium oxide ($SrTiO_x$), cobalt oxide ($CoxO_y$), magnesium oxide (MgO), zinc oxide ($ZnO_x$), ruthenium Oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($VxO_y$), ZnO:Al, ZnO:B, $In_xO_y$:H, niobium oxide ($NbxO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the present disclosure is not limited thereto, and various materials having insulation may be used as the material of the insulating layer 14. Here, the zinc oxide ($ZnO_x$) may be zinc oxide (ZnO) and/or zinc peroxide ($ZnO_2$).

The insulating layer 14 may be provided in the form of a single layer or in the form of multiple layers including at least double layers. For example, in the case where the insulating layer 14 is formed of a double layer structure including a first layer and a second layer that are successively stacked, the first layer and the second layer may be made of different materials (or substances) and may be formed through different processes. In one or more embodiments, the first layer and the second layer of the insulating layer 14 may include the same material and may be formed through a successive process.

In one or more embodiments, the light emitting element LD may be implemented as a light emitting pattern having a core-shell structure. In this case, the first semiconductor layer 11 may be disposed in a core of the light emitting element LD, i.e., a central portion of the light emitting element LD. The active layer 12 may be provided and/or formed to enclose the outer surface (e.g., the outer peripheral surface) of the first semiconductor layer 11. The second semiconductor layer 13 may be provided and/or formed to enclose the outer surface (e.g., the outer peripheral surface) of the active layer 12. Furthermore, the light emitting element LD may further include a contact electrode formed to enclose at least one side of the second semiconductor layer 13. In one or more embodiments, the light emitting element LD may further include an insulating layer 14 that is provided on the outer surface (e.g., the outer peripheral surface) of the light emitting pattern having a core-shell structure and has transparent insulating material. The light emitting element LD implemented as the light emitting pattern having the core-shell structure may be manufactured in a growth manner.

The light emitting element LD may be employed as a light emitting source (or referred to as "light source") for various display devices. The light emitting element LD may be fabricated through a surface treatment process. For example, the light emitting element LD may be surface-treated so that, when a plurality of light emitting elements LD are mixed with a fluidic solution (or solvent) and then supplied to each pixel area (e.g., an emission area of each pixel or an emission area of each sub-pixel), the light emitting elements LD may be evenly distributed rather than unevenly aggregating in the solution.

A light emitting unit (or a light emitting device) including the light emitting element LD described above may be used in various types of devices including a display device that requires a light source. For instance, in case that a plurality of light emitting elements LD are disposed in the pixel area of each pixel of a display panel, the light emitting elements LD may be used as a light source of the pixel. However, the application field of the light emitting element LD is not limited to the above-mentioned examples. For example, the light emitting element LD may also be used in other types of electronic devices such as a lighting device, which requires a light source.

Figure 3:
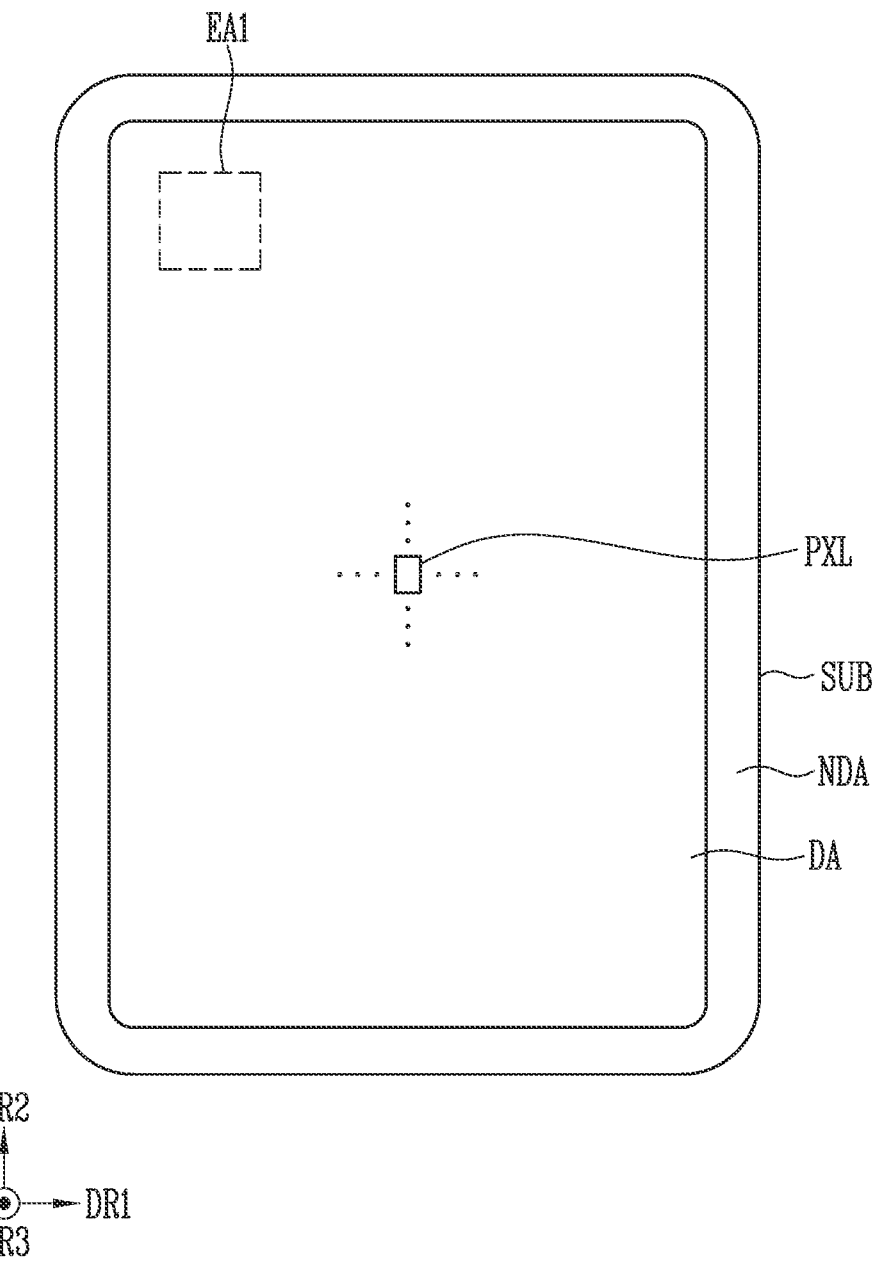
FIG. 3 illustrates a display device in accordance with one or more embodiments, and particularly, is a schematic plan view illustrating a display device using the light emitting element illustrated in FIG. 1A as a light source.

FIG. 3 illustrates a display device in accordance with one or more embodiments, and particularly, is a schematic plan view illustrating a display device using the light emitting element illustrated in FIG. 1A as a light source.

For the sake of explanation, FIG. 3 schematically illustrates the structure of the display device, focused on a display area DA on which an image is displayed.

Referring to FIGS. 1A to 3, the display device in accordance with one or more embodiments may include a substrate SUB, a plurality of pixels PXL provided on the substrate SUB and each including at least one light emitting element LD, a driver provided on the substrate SUB and configured to drive the pixels PXL, and a line component provided to connect the pixels PXL with the driver.

If the display device is an electronic device having a display surface on at least one surface thereof, e.g., a smartphone, a television, a tablet PC, a mobile phone, a video phone, an electronic reader, a desktop PC, a laptop PC, a netbook computer, a workstation, a server, a PDA, a portable multimedia player (PMP), an MP3 player, a medical appliance, a camera, or a wearable device, the present disclosure may be applied to the display device of FIG. 3.

The display device may be classified into a passive matrix type display device and an active matrix type display device according to a method of driving the light emitting element LD. For example, in case that the display device is implemented as an active matrix type, each of the pixels PXL may include a driving transistor configured to control the amount of current to be supplied to the light emitting element LD, and a switching transistor configured to transmit a data signal to the driving transistor.

The display device may be provided in various forms, for example, in the form of a rectangular plate having two pairs of parallel sides, but the present disclosure is not limited thereto. In case that the display device is provided in the form of a rectangular plate, one pair of sides of the two pairs of sides may be longer than the other. For the sake of explanation, there is illustrated the case where the display device has a rectangular shape with a pair of long sides and a pair of short sides. In FIG. 3, a direction in which the long sides extend is indicated by a second direction DR2, and a direction in which the short sides extend is indicated by a first direction DR1. Furthermore, a third direction DR3 in the drawings may refer to a thickness-wise direction of the substrate SUB. In the display device provided in a rectangular planar shape, each corner on which one long side and one short side contact (or meet) each other may have a round shape, but the present disclosure is not limited thereto.

The substrate SUB may include a display area DA and a non-display area NDA around (or surrounding) the display area DA along the edge or periphery of the display area DA.

The display area DA may be an area in which the pixels PXL for displaying an image are provided. The non-display area NDA may be an area in which the driver for driving the pixels PXL and a portion of the line component for coupling the pixels PXL to the driver are provided. For the sake of explanation, FIG. 3 illustrates only one pixel PXL, but a plurality of pixels PXL may be substantially provided in the display area DA of the substrate SUB.

The non-display area NDA may be provided on at least one side of the display area DA. The non-display area NDA may enclose the perimeter (or edges) of the display area DA. The line component electrically connected to the pixels PXL, and the driver electrically connected to the line component and configured to drive the pixels PXL may be provided in the non-display area NDA.

The line component may electrically connect the driver with the pixels PXL. The line component may include a fan-out line coupled with signal lines, e.g., a scan line, a data line, and an emission control line, which are coupled to each pixel PXL to provide signals to the pixel PXL. Furthermore, the line component may include a fan-out line electrically connected to signal lines, e.g., a control line and a sensing line that are electrically connected to each pixel PXL to compensate in real time for variation in electrical characteristics of the pixel PXL.

The substrate SUB may include transparent insulating material to allow light transmission. The substrate SUB may be a rigid substrate or a flexible substrate.

One area on the substrate SUB may be provided as the display area DA in which the pixels PXL are disposed, and the other area thereof may be provided as the non-display area NDA. For example, the substrate SUB may include the display area DA including a plurality of pixel areas on which the respective pixels PXL are disposed, and the non-display area NDA disposed around the perimeter of the display area DA (or adjacent to the display area DA).

The pixels PXL may be provided in the display area DA on the substrate SUB. In one or more embodiments, the pixels PXL may be arranged in the display area DA in a stripe arrangement manner or the like, but the present disclosure is not limited thereto.

Each of the pixels PXL may include at least one light emitting element LD configured to be driven in response to a corresponding scan signal and a corresponding data signal. The light emitting element LD may have a small size corresponding to the nanometer scale or the micrometer scale and may be electrically connected in parallel to light emitting elements LD disposed adjacent thereto, but the present disclosure is not limited thereto. The light emitting element LD may form a light source of each pixel PXL.

Each of the pixels PXL may include at least one light source, e.g., the light emitting element LD illustrated in FIG. 1A, which is driven by a suitable signal (e.g., a set or predetermined signal, such as, a scan signal and a data signal) and/or a suitable power supply (e.g., a set or predetermined power supply, such as, a first driving power supply and a second driving power supply). However, in one or more embodiments, the type of the light emitting element LD that may be used as a light source of each pixel PXL is not limited thereto.

The driver may provide a suitable signal (e.g., a set or predetermined signal) and a suitable power voltage (e.g., a set or predetermined power voltage) to each of the pixels PXL through the line component and thus control the operation of the pixel PXL. The driver may include a scan driver, an emission driver, a data driver, and a timing controller.

Figure 4:
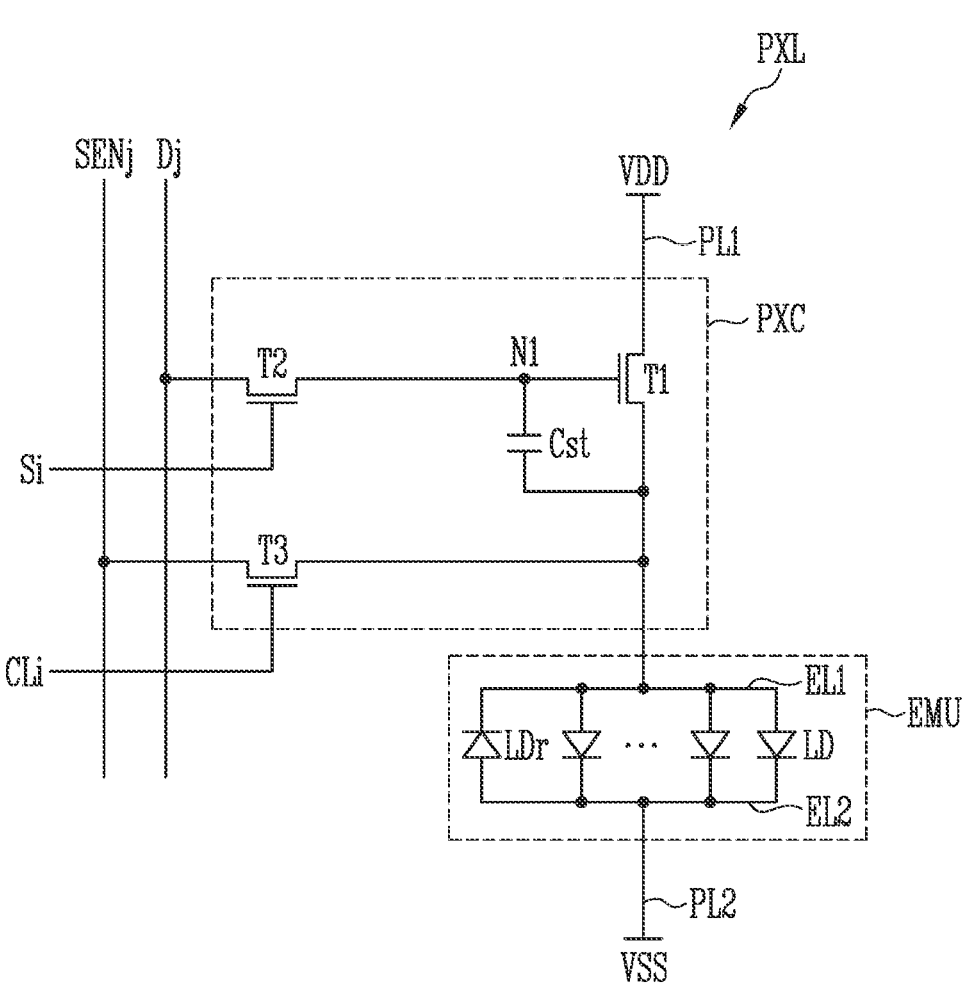
FIG. 4 is a circuit diagram illustrating an embodiment of electrical connection relationship of components included in each pixel illustrated in FIG. 3.

FIG. 4 is a circuit diagram illustrating an embodiment of electrical connection relationship of components included in each pixel PXL illustrated in FIG. 3.

For example, FIG. 4 illustrates the electrical connection relationship of components included in a pixel PXL that may be employed in an active display device in accordance with one or more embodiments. However, the types of the components included in the pixel PXL to which embodiments of the present disclosure may be applied are not limited thereto.

In FIG. 4, not only the components included in each of the pixels PXL illustrated in FIG. 3 but also an area in which the components are provided is embraced in the definition of the term "pixel PXL".

Referring to FIGS. 1A to 4, each pixel PXL (hereinafter, referred to as 'pixel') may include an emission unit EMU (or an emitter) configured to generate light having a luminance corresponding to a data signal. Furthermore, the pixel PXL may selectively further include a pixel circuit PXC configured to drive the emission unit EMU.

In one or more embodiments, the emission unit EMU may include a plurality of light emitting elements LD electrically connected between a first power line PL1 to which a voltage of a first driving power supply VDD is applied, and a second power line PL2 to which a voltage of a second driving power supply VSS is applied. For example, the emission unit EMU may include a first electrode EL1 (or "first alignment electrode") electrically connected to the first driving power supply VDD via the pixel circuit PXC and the first power line PL1, a second electrode EL2 (or "second alignment electrode") electrically connected to the second driving power supply VSS through the second power line PL2, and a plurality of light emitting elements LD electrically connected in parallel to each other in the same direction between the first and second electrodes EL1 and EL2. In one or more embodiments, the first electrode EL1 may be an anode, and the second electrode EL2 may be a cathode.

Each of the light emitting elements LD included in the emission unit EMU may include one end electrically connected to the first driving power supply VDD through the first electrode EL1, the pixel circuit PXC, and the first power line PL1, and a remaining end electrically connected to the second driving power supply VSS through the second electrode EL2 and the second power line PL2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL.

As described above, the light emitting elements LD that are electrically connected in parallel to each other in the same direction (e.g., in a forward direction) between the first electrode EL1 and the second electrode EL2 to which voltages having different potentials are respectively supplied may form respective valid light sources. The valid light sources may collectively form the emission unit EMU of the pixel PXL.

The light emitting elements LD of the emission unit EMU may emit light having a luminance corresponding to driving current supplied thereto through the pixel circuit PXC. For example, during each frame period, the pixel circuit PXC may supply driving current corresponding to a gray scale value of corresponding frame data to the emission unit EMU. The driving current supplied to the emission unit EMU may be divided into parts that flow into the respective light emitting elements LD. Hence, each of the light emitting elements LD may emit light having a luminance corresponding to current applied thereto, so that the emission unit EMU may emit light having a luminance corresponding to the driving current.

Although there has been illustrated the embodiment in which the opposite ends of the light emitting elements LD are electrically connected in the same direction between the first and second driving power supplies VDD and VSS, the present disclosure is not limited thereto. In one or more embodiments, the emission unit EMU may further include at least one invalid light source, e.g., a reverse light emitting element LDr, as well as including the light emitting elements LD that form the respective valid light sources. The reverse light emitting element LDr, along with the light emitting elements LD that form the valid light sources, may be electrically connected in parallel to each other between the first and second electrodes EL1 and EL2. Here, the reverse light emitting element LDr may be electrically connected between the first and second electrodes EU and EL2 in a direction opposite to that of the light emitting elements LD. Even when a suitable driving voltage (e.g., a set or predetermined driving voltage, such as, a normal directional driving voltage) is applied between the first and second electrodes EL1 and EL2, the reverse light emitting element LDr remains disabled. Hence, current substantially does not flow through the reverse light emitting element LDr.

The pixel circuit PXC may be electrically connected to a scan line Si and a data line Dj of the corresponding pixel PXL. For example, in the case where the pixel PXL is disposed on an i-th row (i is a natural number) and a j-th column (j is a natural number) of the display area DA, the pixel circuit PXC of the pixel PXL may be electrically connected to an i-th scan line Si and a j-th data line Dj of the display area DA. Furthermore, the pixel circuit PXC may be coupled to an i-th control line CLi and a j-th sensing line SENj of the display area DA.

The pixel circuit PXC may include first to third transistors T1 to T3, and a storage capacitor Cst.

The first transistor T1 may be a driving transistor configured to control driving current to be applied to the emission unit EMU and may be electrically connected between the first driving power supply VDD and the emission unit EMU. In detail, a first terminal of the first transistor T1 may be electrically connected to the first driving power supply VDD through the first power line PL1. A second terminal of the first transistor T1 may be electrically connected to the first electrode EL1 for the light emitting elements LD. A gate electrode of the first transistor T1 may be electrically connected to a first node N1. Here, the first terminal and the second terminal of the first transistor T1 are different terminals. For example, if the first terminal is a drain electrode, then the second terminal is a source electrode or vice versa. The first transistor T1 may control the amount of driving current to be supplied to the light emitting elements LD in response to the voltage of the first node N1.

The second transistor T2 may be a switching transistor that selects a pixel PXL in response to a scan signal and activates the pixel PXL, and may be electrically connected between the data line Dj and the first node N1. A first terminal of the second transistor T2 may be electrically connected to the data line Dj, and a second terminal thereof may be electrically connected to the first node N1. Here, the first terminal and the second terminal of the second transistor T2 are different terminals. For example, if the first terminal is a source electrode, then the second terminal is a drain electrode or vice versa. A gate electrode of the second transistor T2 may be electrically connected to the i-th scan line Si.

When a scan signal having a voltage (e.g., a high-level voltage) capable of turning on the second transistor T2 is supplied from the scan line Si, the second transistor T2 is turned on to electrically connect the data line Dj with the first node N1. Here, a data signal of a corresponding frame is supplied to the data line Dj, whereby the data signal is transmitted to the first node N1. The data signal transmitted to the first node N1 may be charged to the storage capacitor Cst (e.g., the storage capacitor Cst may hold a charge corresponding to the data signal transmitted to the first node N1).

The third transistor T3 may be electrically connected between the first transistor T1 and the j-th sensing line SENj. For example, a first terminal of the third transistor T3 may be electrically connected to the second terminal (e.g., a source electrode) of the first transistor T1 electrically connected to the first electrode EL1. A second terminal of the third transistor T3 may be electrically connected to the j-th sensing line SENj. A gate electrode of the third transistor T3 may be electrically connected to the i-th control line CLi. The third transistor T3 may be turned on by a control signal of a gate-on voltage (e.g., a high-level voltage) supplied to the i-th control cline CLi during a sensing period (e.g., a set or predetermined sensing period) so that the j-th sensing line SENj and the first transistor T1 may be electrically connected to each other.

The sensing period may be a period in which characteristic information of each of the pixels PXL disposed in the display area DA (e.g., a threshold voltage, etc. of the first transistor T1) is extracted.

A first electrode of the storage capacitor Cst may be electrically connected to the first node N1, and a second electrode thereof may be electrically connected to the second terminal (e.g., a source electrode) of the first transistor T1 electrically connected to the first electrode EL1. The storage capacitor Cst may be charged with a voltage corresponding to a data signal supplied to the first node N1, and maintain the charged voltage until a data signal of a subsequent frame is supplied.

Although FIG. 4 illustrates an embodiment where all of the first to third transistors T1 to T3 are N-type transistors, the present disclosure is not limited thereto. For example, at least one of the first to third transistors T1 to T3 may be changed to a P-type transistor. Furthermore, although FIG. 4 illustrates an embodiment where the emission unit EMU is electrically connected between the pixel circuit PXC and the second driving power supply VSS, the emission unit EMU may be electrically connected between the first driving power supply VDD and the pixel circuit PXC.

The structure of the pixel circuit PXC may be changed in various ways. For example, the pixel circuit PXC may further include at least one transistor element such as a transistor element configured to initialize the first node N1, and/or a transistor element configured to control an emission time of the light emitting elements LD, or other circuit elements such as a boosting capacitor for boosting the voltage of the first node N1.

Figure 5:
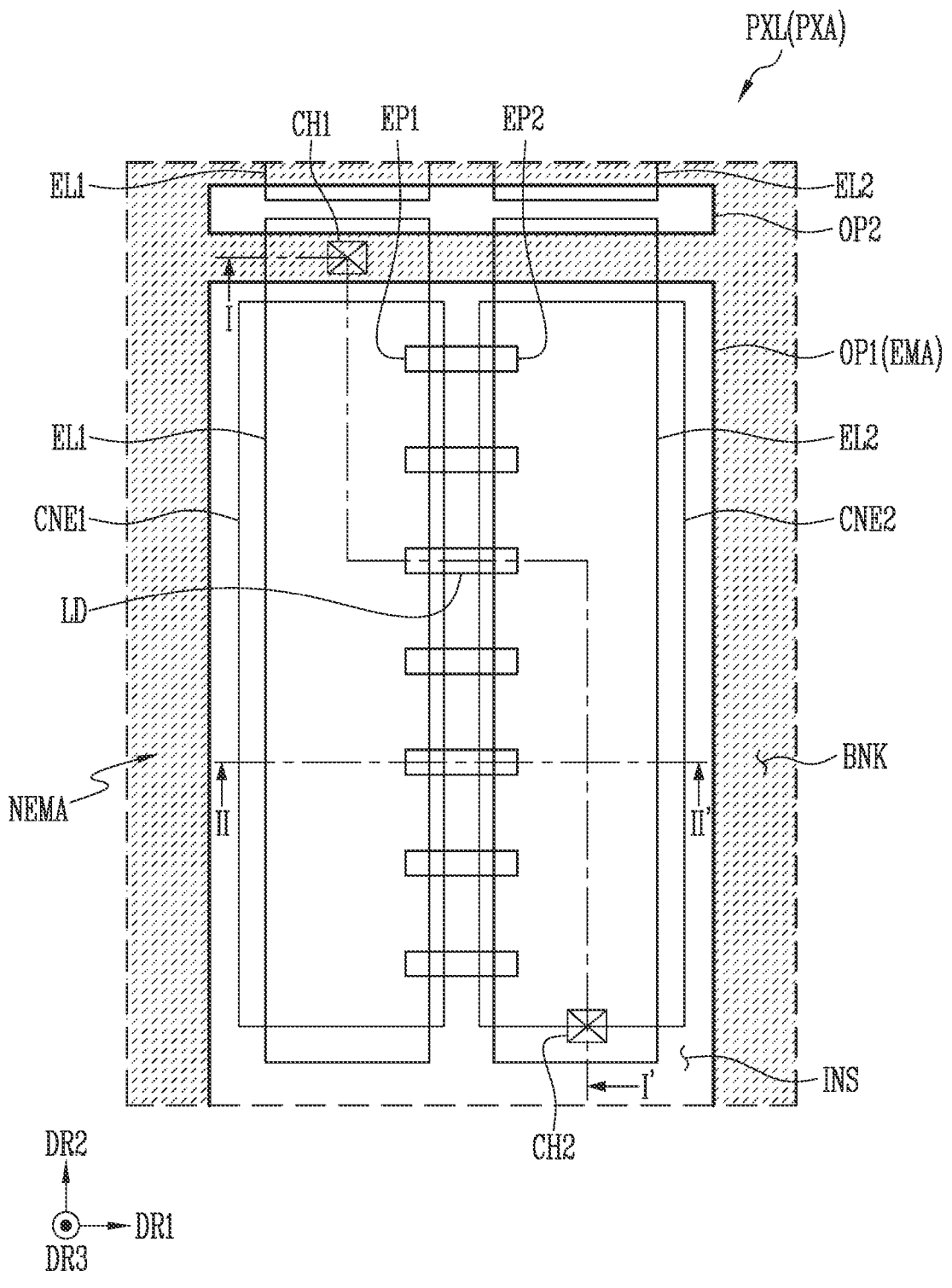
FIG. 5 is a plan view schematically illustrating each pixel illustrated in FIG. 3.

Furthermore, although FIGS. 4 and 5 illustrate an embodiment in which all of the light emitting elements LD that form the emission unit EMU are electrically connected in parallel to each other, the present disclosure is not limited thereto. In one or more embodiments, the emission unit EMU may include at least one serial set including a plurality of light emitting elements LD electrically connected in parallel to each other. In other words, the emission unit EMU may be formed of a serial/parallel combination structure.

The structure of the pixel PXL that may be applied to the present disclosure is not limited to the embodiment illustrated in FIG. 4, and the pixel PXL may have various structures. For example, each pixel PXL may be configured in a passive light emitting display device, or the like. In this case, the pixel circuit PXC may be omitted, and the opposite ends of the light emitting elements LD included in the emission unit EMU may be directly electrically connected to the i-th scan lines Si, the j-th data linen Dj, the first power line PL1 to which the first driving power supply VDD is to be applied, the second power line PL2 to which the second driving power supply VSS is to be applied, and/or a control line (e.g., a set or predetermined control line).

FIG. 5 is a plan view schematically illustrating each pixel PXL illustrated in FIG. 3.

In FIG. 5, for the sake of explanation, illustration of the transistors T electrically connected to the light emitting elements LD and the signal lines electrically connected to the transistors T are omitted.

In one or more embodiments, for the sake of explanation, a transverse direction (or a horizontal direction) in a plan view is indicated by a first direction DR1, a longitudinal direction (or a vertical direction) in a plan view is indicated by a second direction DR2, and a thickness-wise direction of the substrate SUB in a sectional view is indicated by a third direction DR3. The first to third directions DR1, DR2, and DR3 may refer to the directions indicated by the first to third directions DR1, DR2, and DR3, respectively.

Referring to FIGS. 3 to 5, each pixel PXL may be provided and/or formed in a pixel area PXA defined on the substrate SUB. The pixel area PXA may include an emission area EMA and a non-emission area NEMA.

In one or more embodiments, each pixel PXL may include a bank BNK disposed in the non-emission area NEMA.

The bank BNK may be a structure for defining (or partitioning) the respective pixel areas PXA or the respective emission area EMA of the corresponding pixel PXL (or sub-pixel) and pixels PXL adjacent thereto and, for example, may be a pixel defining layer.

In one or more embodiments, the bank BNK may be a pixel defining layer or a dam structure for defining each emission area EMA to which the light emitting elements LD are to be supplied, during a process of supplying (or inputting) the light emitting elements LD to each pixel PXL. For example, because the emission area EMA of each pixel PXL is defined by the bank BNK, a mixed solution (e.g., ink) including a target amount and/or type of light emitting elements LD may be supplied (or input) to the emission area EMA.

The bank BNK may include at least one light block material and/or reflective material, thus preventing a light leakage defect in which light (or rays) leaks between each pixel PXL and the pixels PXL adjacent thereto. In one or more embodiments, the bank BNK may include transparent material (or substance). The transparent material may include, for example, polyamides resin, polyimides resin, etc., but the present disclosure is not limited thereto. In one or more embodiments, in order to enhance the efficiency of light emitted from each pixel PXL, a separate reflective material layer may be provided and/or formed on the bank BNK.

The bank BNK may include at least one opening that exposes components disposed under the bank BNK in the pixel area PXA of the corresponding pixel PXL. For example, the bank BNK may include first and second openings OP1 and OP2 that expose components disposed under the bank BNK in the pixel area PXA of the corresponding pixel PXL. In one or more embodiments, the emission area EMA of each pixel PXL and the first opening OP1 of the bank BNK may correspond to each other.

In the pixel area PXA, the second opening OP2 of the bank BNK may be disposed at a position spaced from the first opening OP1 in the second direction DR2, and disposed adjacent to one side (e.g., an upper side or a lower side) of the pixel area PXA.

Each pixel PXL may include a first electrode EL1 and a second electrode EL2 spaced from each other in the first direction DR1. The first electrode EL1 may correspond to the first electrode EL1 described with reference to FIG. 4. The second electrode EL2 may correspond to the second electrode EL2 described with reference to FIG. 4.

The first electrode EL1 and the second electrode EL2 may be disposed on an insulating layer INS (e.g., a set or predetermined insulating layer INS). The pixel circuit (refer to "PXC" of FIG. 4) and lines electrically connected to the pixel circuit (refer to "PXC" of FIG. 4) and configured to drive the corresponding pixel PXL may be formed under the insulating layer INS.

The first electrode EL1 and the second electrode EL2 may be successively arranged along the first direction DR1. The first electrode EL1 and the second electrode EL2 may extend in the second direction DR2 different from the first direction DR1.

The first and second electrodes EL1 and EL2 may be separated from other electrodes (e.g., first and second electrodes EL1 and EL2 provided in each of pixels PXL adjacent thereto in the second direction DR2) in the first opening OP1 and the second opening OP2 after the light emitting elements LD are supplied and aligned in the pixel area PXA during a process of fabricating the display device. For example, one end of the first electrode EL1 may be separated, in the second opening OP2, from the first electrode EL1 of the pixel PXL disposed on an upper side of the corresponding pixel PXL in the second direction DR2. A remaining end of the first electrode EL1 may be separated, in the first opening OP1, from a first electrode of a pixel disposed on a lower side of the corresponding pixel PXL in the second direction DR2. Furthermore, one end of the second electrode EL2 may be separated, in the second opening OP2, from the second electrode EL2 of the pixel PXL disposed on the upper side of the corresponding pixel PXL in the second direction DR2. A remaining end of the second electrode EL2 may be separated, in the first opening OP1, from a second electrode of the pixel disposed on the lower side of the corresponding pixel PXL in the second direction DR2. In one or more embodiments, the second opening OP2 of the bank BNK may be provided for a separation process for the first and second electrodes EL1 and EL2.

The first electrode EL1 may be electrically connected with the first transistor T1 described with reference to FIG. 4 through a first contact hole CH1. The second electrode EL2 may be electrically connected with the second driving power supply VSS (or the second power line PL2 (e.g., DVL of FIG. 6)) described with reference to FIG. 4 through a second contact hole CH2. The first electrode EL1 may be an anode of the emission unit (refer to 'EMU' of FIG. 4) of each pixel PXL. The second electrode EL2 may be a cathode of the emission unit EMU.

In the pixel area PXA (or the emission area EMA) of each pixel PXL, the first electrode EL1 and the second electrode EL2 may be spaced from each other in the first direction DR1.

The first electrode EL1 and the second electrode EL2 may have a multi-layer structure including a reflective electrode and a conductive capping layer. Furthermore, the reflective electrode may have a single- or multi-layer structure. For example, the reflective electrode may include at least one opaque metal layer, and selectively further include at least one transparent conductive layer disposed over and/or under the opaque metal layer.

Each of the first and second electrodes EL1 and EL2 may function as an alignment electrode (or an alignment line) configured to receive, before the light emitting elements LD are aligned in the emission area EMA of each pixel PXL, an alignment signal (e.g., a set or predetermined alignment signal) or an alignment voltage from an alignment pad disposed in the non-display area (refer to "NDA" of FIG. 3), and then to align the light emitting elements LD.

For example, the first electrode EL1 may be used as a first alignment electrode (or a first alignment line) to receive a first alignment signal (or a first alignment voltage) from the first alignment pad. For example, the second electrode EL2 may be used as a second alignment electrode (or a second alignment line) to receive a second alignment signal (or a second alignment voltage) from the second alignment pad.

The above-mentioned first and second alignment signals may be signals having a voltage difference and/or a phase difference enabling the light emitting elements LD to be aligned between the first and second electrodes EU and EL2. At least one alignment signal of the first and second alignment signals may be an AC signal (or voltage), but the present disclosure is not limited thereto.

Each pixel PXL may include a plurality of light emitting elements LD. In one or more embodiments, each pixel PXL may further include a reverse light emitting element LDr described with reference to FIG. 4.

Although at least two to several tens of light emitting elements LD may be aligned and/or provided in the emission area EMA of each pixel PXL, the number of light emitting elements LD is not limited thereto. In one or more embodiments, the number of light emitting elements LD aligned and/or provided in the pixel area PXA may be changed in various ways.

The light emitting elements LD may be disposed between the first electrode EL1 and the second electrode EL2. Each of the light emitting elements LD may include a first end EP1 (or one end) and a second end EP2 (or a remaining end) that are disposed on opposite ends thereof with respect to the longitudinal direction. In one or more embodiments, the second semiconductor layer 13 including a p-type semiconductor layer may be disposed on the first end EP1, and the first semiconductor layer 11 including an n-type semiconductor layer may be disposed on the second end EP2. The light emitting elements LD may be electrically connected in parallel between the first electrode EL1 and the second electrode EL2. Each of the light emitting elements LD may have the same configuration as that of the light emitting element LD described with reference to FIG. 1A.

Each of the light emitting elements LD may be formed of a light emitting diode that is made of material having an inorganic crystal structure and has a subminiature size, e.g., ranging from the nanometer scale to the micrometer scale.

Each of the light emitting elements LD may emit any one light of color light and/or white light. Each of the light emitting elements LD may be disposed between the first electrode EL1 and the second electrode EL2 such that an extension direction (or a longitudinal direction) thereof is parallel to the first direction DR1. In one or more embodiments, the light emitting elements LD may be aligned between the first electrode EL1 and the second electrode EL2 such that at least some of the light emitting elements LD are not completely parallel to the first direction DR1. For example, some light emitting elements LD may be aligned to be inclined with respect to the first direction DR1 between the first electrode EL1 and the second electrode EL2. The light emitting elements LD may be diffused in a solution, and the solution including the light emitting elements LD may be supplied (or input) to the emission area EMA of each pixel PXL.

The light emitting elements LD may be input (or supplied) to the emission area EMA of each pixel PXL by an inkjet printing scheme, a slit coating scheme, or other various schemes. For example, the light emitting elements LD may be mixed with a volatile solvent and then input (or supplied) to the emission area EMA by an inkjet printing scheme or a slit coating scheme. Here, if the first electrode EL1 and the second electrode EL2 are supplied with corresponding alignment signals, an electric field may be formed between the first electrode EL1 and the second electrode EL2. Hence, the light emitting elements LD may be aligned between the first electrode EL1 and the second electrode EL2. After the light emitting elements LD are aligned, the solvent may be removed by a volatilization scheme or other schemes. In this way, the light emitting elements LD may be reliably aligned between the first electrode EL1 and the second electrode EL2.

In one or more embodiments, each pixel PXL may include a first connection electrode CNE1 and a second connection electrode CNE2.

The first connection electrode CNE1 and the second connection electrode CNE2 may be components configured to more reliably electrically connect the first and second electrodes EU and EL2 and the light emitting elements LD.

The first connection electrode CNE1 may be formed on the first end EP1 of the light emitting element LD and at least one area of the first electrode EU corresponding to the first end EP1, so that the first end EP1 of the light emitting element LD may be physically and/or electrically connected to the first electrode EL1.

In a plan view, the first connection electrode CNE1 may have a bar-like shape extending in the second direction DR2, but the present disclosure is not limited thereto. In one or more embodiments, the shape of the first connection electrode CNE1 may be changed in various ways within a range in which the first connection electrode CNE1 can be reliably electrically connected with the first end EP1 of the light emitting element LD. Furthermore, the shape of the first connection electrode CNE1 may be changed in various ways, taking into account the connection relationship with the first electrode EL1 disposed thereunder.

The second connection electrode CNE2 may be formed on the second end EP2 of the light emitting element LD and at least one area of the second electrode EL2 corresponding to the second end EP2, so that the second end EP2 of the light emitting element LD may be physically and/or electrically connected to the second electrode EL2.

In a plan view, the second connection electrode CNE2 may have a bar-like shape extending in the second direction DR2, but the present disclosure is not limited thereto. In one or more embodiments, the shape of the second connection electrode CNE2 may be changed in various ways within a range in which the second connection electrode CNE2 can be reliably electrically connected with the second end EP2 of the light emitting element LD. Furthermore, the shape of the second connection electrode CNE2 may be changed in various ways, taking into account the connection relationship with the second electrode EL2 disposed thereunder.

Hereinafter, the stacked structure of each pixel PXL in accordance with the foregoing embodiment will be mainly described with reference to FIGS. 6 and 7.

Figure 6:
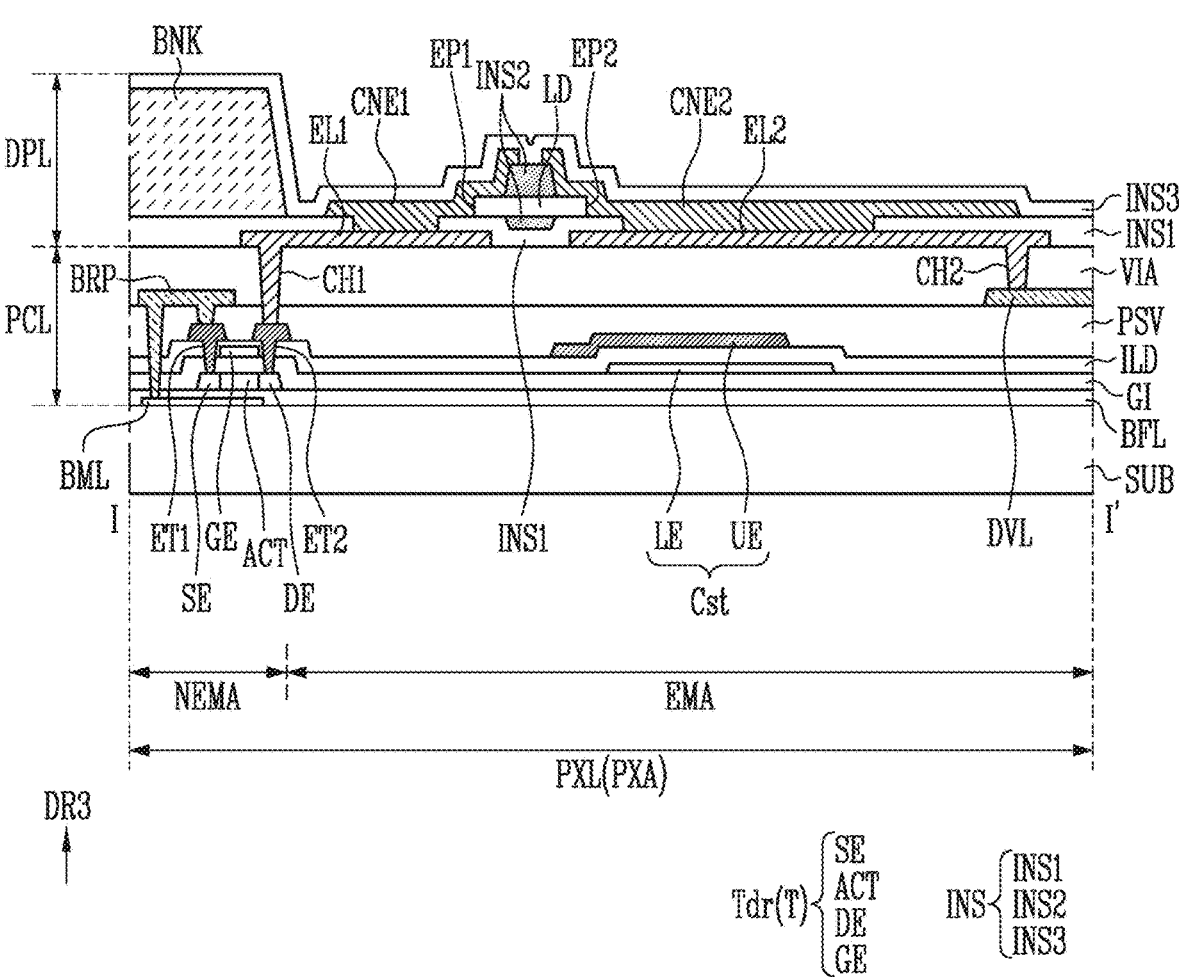
FIG. 6 is a cross-sectional view taken along the line I-I' of FIG. 5.

FIG. 6 is a cross-sectional view taken along the line I-I' of FIG. 5. FIG. 7 is a cross-sectional view taken along the line II-II' of FIG. 5.

Figure 7:
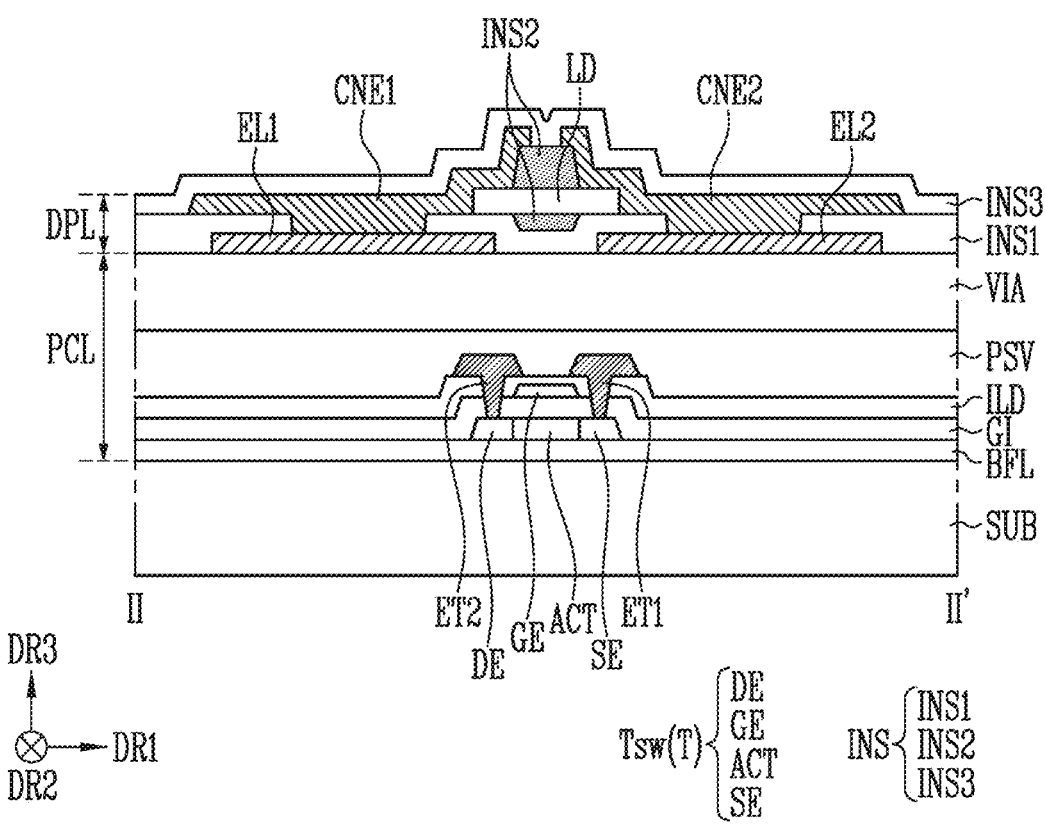
FIG. 7 is a cross-sectional view taken along the line II-II' of FIG. 5.

Although FIGS. 6 to 7 simply illustrate a pixel PXL, e.g., illustrating that each electrode is formed of a single electrode and each insulating layer is formed of a single insulating layer, the present disclosure is not limited thereto.

Referring to FIGS. 5 to 7, the pixel PXL may include a substrate SUB, a pixel circuit layer PCL, and a display element layer DPL.

The substrate SUB may include transparent insulating material to allow light transmission. The substrate SUB may be a rigid substrate or a flexible substrate.

For example, the rigid substrate SUB may be one of a glass substrate, a quartz substrate, a glass ceramic substrate, and a crystalline glass substrate.

The flexible substrate SUB may be either a film substrate or a plastic substrate that includes polymer organic material. For example, the flexible substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The pixel circuit layer PCL may include a buffer layer BFL, at least one transistor T, at least one storage capacity Cst, and a via layer VIA.

The buffer layer BFL may be disposed on the overall surface of the substrate SUB. The buffer layer BFL may prevent impurities from diffusing into a transistor T included in the pixel circuit (refer to "PXC" of FIG. 4). The buffer layer BFL may be an inorganic insulating layer formed of inorganic material. The buffer layer BFL may include at least one of silicon nitride ($SiN_x$), silicon oxide ($SiO_x$), silicon oxynitride ($SiO_xN_y$), and metal oxide such as aluminum oxide ($AlO_x$). Although the buffer layer BFL may be provided in a single-layer structure, the buffer layer BFL may be provided in a multi-layer structure having at least two or more layers. In the case where the buffer layer BFL has a multi-layer structure, the respective layers may be formed of the same material or different materials. The buffer layer BFL may be omitted depending on the material of the substrate SUB or processing conditions. A bottom metal layer BML may be disposed between the substrate SUB and the buffer layer BFL.

The transistor T may include a driving transistor Tdr configured to control driving current of the light emitting elements LD, and a switching transistor Tsw electrically connected to the driving transistor Tdr. However, the present disclosure is not limited thereto. The pixel circuit PXC may further include circuit elements configured to perform other functions, as well as including the driving transistor Tdr and the switching transistor Tsw. The driving transistor Tdr may be the first transistor T1 described with reference to FIG. 4. The switching transistor Tsw may be the second transistor T2 described with reference to FIG. 4. In the following embodiments, the driving transistor Tdr and the switching transistor Tsw may be embraced in the term "transistor T" or "transistors T".

Each of the driving transistor Tdr and the switching transistor Tsw may include a semiconductor pattern, and a gate electrode that overlaps a portion of the semiconductor pattern. Here, the semiconductor pattern may include an active pattern ACT, a source area SE, and a drain area DE. The semiconductor pattern (e.g., ACT, SE, and DE) may be formed on the buffer layer BFL.

The gate electrode GE may have a single-layer structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag) to reduce line resistance.

A gate insulating layer GI may be provided and/or formed on the overall surfaces of the semiconductor pattern and the buffer layer BFL. The gate insulating layer GI may be an inorganic insulating layer including inorganic material. For example, the gate insulating layer GI may include at least one of metal oxides such as silicon nitride ($SiN_x$), silicon oxide ($SiO_x$), silicon oxynitride ($SiO_xN_y$), and aluminum oxide ($AlO_x$). However, the material of the gate insulating layer GI is not limited to that of the foregoing embodiments. In one or more embodiments, the gate insulating layer GI may be formed of an organic insulating layer including organic material. Although the gate insulating layer GI may be provided in a single-layer structure, the gate insulating layer GI may be provided in a multi-layer structure having at least two or more layers. The gate electrode GE may be disposed on the gate insulating layer GI overlapping the active pattern ACT in the third direction DR3.

The active pattern ACT, the source area SE, and the drain area DE may be provided and/or formed on the buffer layer BFL.

The active pattern ACT, the source area SE, and the drain area DE each may be a semiconductor pattern formed of poly silicon, amorphous silicon, an oxide semiconductor, etc. The active pattern ACT, the source area SE, and the drain area DE each may be formed of an undoped semiconductor layer or a semiconductor layer doped with an impurity. For example, each of the source area SE and the drain area DE may be formed of a semiconductor layer doped with an impurity. The active pattern ACT may be formed of an undoped semiconductor layer. For example, an n-type impurity may be used as the impurity, but the present disclosure is not limited thereto.

The active pattern ACT may be an area that overlaps the gate electrode GE of the corresponding transistor T in the third direction DR3, and may be a channel area of the transistor T. For example, the active pattern ACT of the driving transistor Tdr may overlap the gate electrode GE of the driving transistor Tdr in the third direction DR3 and thus form a channel area of the driving transistor Tdr. The active pattern ACT of the switching transistor Tsw may overlap the gate electrode GE of the switching transistor Tsw in the third direction DR3 and thus form a channel area of the switching transistor Tsw.

The source area SE of the driving transistor Tdr may be electrically connected to (or brought into contact with) one end of the active pattern ACT of the corresponding transistor T. Furthermore, the source area SE of the driving transistor Tdr may be electrically connected to the bridge pattern BRP through a first connector ET1.

The first connector ET1 may be provided and/or formed on an interlayer insulating layer ILD disposed on the gate electrode GE and the gate insulating layer GI. One end of the first connector ET1 may be electrically and physically connected with the source area SE of the driving transistor Tdr through a contact hole successively passing through the interlayer insulating layer ILD and the gate insulating layer GI. Furthermore, a remaining end of the first connector ET1 may be electrically and physically connected to the bridge pattern BRP through a contact hole passing through the passivation layer PSV. The first connector ET1 may include the same material as that of the gate electrode GE, or include one or more materials selected from among materials exemplified as the material for forming the gate electrode GE.

The interlayer insulating layer ILD may be provided and/or formed on the overall surfaces of the gate electrode GE, a lower electrode LE of the storage capacitor Cst, and the gate insulating layer GI. The interlayer insulating layer ILD may include the same material as that of the gate insulating layer GI, or may include one or more materials selected from among materials exemplified as the material for forming the gate insulating layer GI.

The passivation layer may be disposed on the interlayer insulating layer ILD, the first connector ET1, the second connector ET2, and an upper electrode UE of the storage capacitor Cst. The bridge pattern BRP may be provided and/or formed on the passivation layer PSV. One end of the bridge pattern BRP may be electrically connected to the source area SE of the driving transistor Tdr by the first connector ET1. Furthermore, a remaining end of the bridge pattern BRP may be electrically and physically connected with a bottom metal layer BML through a contact hole that successively passes through the passivation layer PSV, the interlayer insulating layer ILD, the gate insulating layer GI, and the buffer layer BFL. The bottom metal layer BML and the source area SE of the driving transistor Tdr may be electrically connected to each other by the bridge pattern BRP and the first connector ET1.

The bottom metal layer BML may be a first conductive layer of the conductive layers provided on the substrate SUB. For example, the bottom metal layer BML may be a first conductive layer disposed between the substrate SUB and the buffer layer BFL. The bottom metal layer BML may be electrically connected to the driving transistor Tdr and thus increase a driving range of a voltage (e.g., a set or predetermined voltage) to be supplied to the gate electrode GE of the driving transistor Tdr. For example, the bottom metal layer BML may be electrically connected to the source area SE of the driving transistor Tdr and thus stabilize the channel area of the driving transistor Tdr. Furthermore, the bottom metal layer BML may be electrically connected to the source area SE of the driving transistor Tdr, thus preventing the bottom metal layer BML from floating.

The drain area DE of the driving transistor Tdr may be electrically connected to (or brought into contact with) a remaining end of the active pattern ACT of the corresponding transistor T. Furthermore, the drain area DE of the driving transistor Tdr may be electrically connected to (or brought into contact with) a second connector ET2.

The second connector ET2 may be provided and/or formed on the interlayer insulating layer ILD. One end of the second connector ET2 may be electrically and physically connected with the drain area DE of the driving transistor Tdr through a contact hole passing through the interlayer insulating layer ILD and the gate insulating layer GI. A remaining end of the second connector ET2 may be electrically and/or physically connected with the first electrode EL1 of the display element layer DPL through the first contact hole CH1 that passes through the via layer VIA and the passivation layer PSV. In one or more embodiments, the second connector ET2 may be a medium for connecting the driving transistor Tdr of the pixel circuit layer PCL with the first electrode EL1 of the display element layer DPL.

The source area SE of the switching transistor Tsw may be electrically connected to (or brought into contact with) one end of the active pattern ACT of the corresponding transistor T. Furthermore, although not illustrated, the source area SE of the switching transistor Tsw may be electrically connected with the gate electrode GE of the driving transistor Tdr. For example, the source area SE of the switching transistor Tsw may be electrically connected with the gate electrode GE of the driving transistor Tdr by an additional first connector ET1. The additional first connector ET1 may be provided and/or formed on the interlayer insulating layer ILD.

The drain area DE of the switching transistor Tsw may be electrically connected to (or brought into contact with) a remaining end of the active pattern ACT of the corresponding transistor T. Furthermore, although not illustrated, the drain area DE of the switching transistor Tsw may be electrically connected with the data line (refer to "Dj" of FIG. 4). For example, the drain area DE of the switching transistor Tsw may be electrically connected with the data line Dj by an additional second connector ET2. The additional second connector ET2 may be provided and/or formed on the interlayer insulating layer ILD.

The interlayer insulating layer ILD may be provided and/or formed on the driving transistor Tdr and the switching transistor Tsw.

Although in the foregoing embodiment there has been illustrated the case where each of the transistors T is a thin-film transistor having a top gate structure, the present disclosure is not limited thereto. The structure of the transistors T may be changed in various ways.

The storage capacitor Cst may include a lower electrode LE provided on the gate insulating layer GI, and an upper electrode UE which is provided on the interlayer insulating layer ILD and overlaps the lower electrode LE in the third direction DR3.

The lower electrode LE may be provided on the same layer as that of the gate electrode GE of the driving transistor Tdr and include the same material as that of the gate electrode GE. The lower electrode LE may be integrally provided with the gate electrode GE of the driving transistor Tdr. In this case, the lower electrode LE may be regarded as being one area of the gate electrode GE of the driving transistor Tdr. In one or more embodiments, the lower electrode LE may be provided as a component separate from the gate electrode GE of the driving transistor Tdr. In this case, the lower electrode LE may be electrically connected with the gate electrode GE of the driving transistor Tdr by a separate connector.

The upper electrode UE may overlap the lower electrode LE in the third direction DR3 and cover the lower electrode LE. The capacity of the storage capacity Cst may be increased by increasing an overlapping area between the upper electrode UE and the lower electrode LE. In one or more embodiments, the upper electrode UE may be electrically connected with the first power line (refer to "PL1" of FIG. 4). The upper electrode UE may be provided on the same layer as that of the first and second connectors ET1 and ET2 and include the same material as that thereof.

The storage capacitor Cst and the transistors T may be covered with the passivation layer PSV.

The passivation layer PSV may be an inorganic layer (an inorganic insulating layer) including inorganic material, or an organic layer (or an organic insulating layer) including organic material. In one or more embodiments, the passivation layer PSV may have material identical with that of the interlayer insulating layer ILD, but the present disclosure is not limited thereto. The passivation layer PSV may be provided in a single-layer structure or a multi-layer structure having at least two or more layers. The passivation layer PSV may include a first contact hole CH1 that exposes the second connector ET2 electrically connected with the drain area DE of the driving transistor Tdr.

The pixel circuit layer PCL may include a driving voltage line DVL provided and/or formed on the passivation layer PSV. The driving voltage line DVL may have the same configuration as that of the second power line PL2 described with reference to FIG. 4. Hence, the voltage of the second power supply VSS may be applied to the driving voltage line DVL. The pixel circuit layer PCL may further include the first power line PL1 coupled to the first driving power supply VDD. Although not directly illustrated in FIGS. 5 to 7, the first power line PL1 may be provided on the same layer as that of the driving voltage line DVL or provided at a layer different from that of the driving voltage line DVL. Although in the foregoing embodiment the driving voltage line DVL has been described as being provided and/or formed on the passivation layer PSV, the present disclosure is not limited thereto. In one or more embodiments, the driving voltage line DVL may be provided on or at the same layer as that of any one conductive layer of the conductive layers provided on the pixel circuit layer PCL. In other words, the location of the driving voltage line DVL in the pixel circuit PCL may be changed in various ways. For example, the driving voltage line DVL may be provided and/or formed on the interlayer insulating layer ILD on which the first and second connectors ET1 and ET2 electrically connected with the transistors T are disposed. In this case, the conductive layer disposed on the passivation layer PSV may be omitted.

Each of the first power line PL1 and the driving voltage line DVL may include conductive material. For example, each of the first power line PL1 and the driving voltage line DVL may have a single-layer structure formed of one or combination selected from the group consisting of copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag) to reduce line resistance. For instance, each of the first power line PL1 and the driving voltage line DVL may have a double-layer structure formed by stacking layers in a sequence of titanium (Ti) and copper (Cu).

The first power line PL1 may be electrically coupled with a component of the display element layer DPL, e.g., the first electrode EL1 of the display element layer DPL. The driving voltage line DVL may be electrically coupled with another component of the display element layer DPL, e.g., the second electrode EL2 of the display element layer DPL.

The via layer VIA may be provided and/or formed on the transistors T, the bridge pattern BRP, and the driving voltage line DVL.

The via layer VIA may be provided in the form of an organic insulating layer, an inorganic insulating layer, or a structure including an organic insulating layer disposed on an inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). The organic insulating layer may include, for example, at least one of polyacrylates resin, epoxy resin, phenolic resin, polyamides resin, polyimides rein, unsaturated polyesters resin, poly-phenylene ethers resin, poly-phenylene sulfides resin, and benzocyclobutene resin.

The via layer VIA may include a first contact hole CH1 corresponding to the first contact hole CH1 of the passivation layer PSV that expose the second connector ET2 electrically connected with the driving transistor Tdr, and a second contact hole CH2 that exposes the driving voltage line DVL.

The display element layer DPL may be provided on the via layer VIA.

The display element layer DPL may include the bank BNK, the first and second electrodes EL1 and EL2, the light emitting elements LD, the first and second connection electrodes CNE1 and CNE2, and the insulating layer INS. Here, the insulating layer INS may include first to third insulating layers INS1 to INS3.

The bank BNK may be provided and/or formed on the first insulating layer INS1 disposed in the non-emission area NEMA of each pixel PXL and define (or partition) the emission area EMA of the corresponding pixel PXL. The bank BNK may include a first opening OP1 and a second opening OP2 spaced from the first opening OP1 in the second direction DR2. The first opening OP1 of the bank BNK may correspond to the emission area EMA of each of the pixels PXL.

The first electrode EL1 and the second electrode EL2 may be spaced from each other in the first direction DR1. In one or more embodiments, one end of opposite ends of each of the first and second electrodes EL1 and EL2 may be disposed in the first opening OP1 of the bank BNK, and a remaining end thereof may be disposed in the second opening OP2 of the bank BNK. The first and second electrodes EU and EL2 may be separated from other electrodes in the respective first and second openings OP1 and OP2, after the light emitting elements LD are supplied and aligned in the emission area EMA of the corresponding pixel PXL during a process of fabricating the display device.

The first electrode EL1 and the second electrode EL2 each may be formed of material having a constant (or regular) reflectivity to enable light emitted from each of the light emitting elements LD to travel in an image display direction (e.g., in the frontal direction or the third direction DR3) of the display device. For example, the first electrode EL1 and the second electrode EL2 each may be formed of conductive material (or substance) having a constant reflectivity. The conductive material (or substance) may include opaque metal that may be suitable in reflecting, in the third direction DR3 (e.g., in the image display direction of the display device), light emitted from the light emitting elements LD. For example, the opaque metal may include metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), and an alloy thereof. In one or more embodiments, each of the first electrode EL1 and the second electrode EL2 may be formed of transparent conductive material (or substance). The transparent conductive material (or substance) may include transparent conductive oxides such as indium tin oxide (ITO), indium zinc oxide (IZO), zinc oxide (ZnO), indium gallium zinc oxide (IGZO), and indium tin zinc oxide (ITZO), and a conductive polymer such as PEDOT (poly(3,4-ethylenedioxythiophene)). In the case where the first electrode EL1 and the second electrode EL2 include transparent conductive material (or substance), a separate conductive layer formed of opaque metal for reflecting light emitted from the light emitting elements LD in the image display direction of the display device may be added. The material of the first electrode EL1 and the second electrode EL2 is not limited to the foregoing materials.

Although each of the first electrode EL1 and the second electrode EL2 may be provided and/or formed in a single-layer structure, the present disclosure is not limited thereto. In one or more embodiments, each of the first electrode EL1 and the second electrode EL2 may be provided and/or formed in a multi-layer structure formed by stacking at least two materials among metals, alloys, conductive oxides, and conductive polymers. Each of the first electrode EL1 and the second electrode EL2 may be formed of a multi-layer structure including at least two layers to reduce or minimize distortion resulting from a signal delay when signals (or voltages) are transmitted to opposite ends EP1 and EP2 of each of the light emitting elements LD. For example, each of the first electrode EL1 and the second electrode EL2 may be formed of a multi-layer structure formed by stacking layers in a sequence of indium tin oxide (ITO)/silver(Ag)/indium tin oxide (ITO). Alternatively, each of the first electrode EL1 and the second electrode EL2 may be formed of a single-layer structure made of aluminum (Al), a double-layer structure formed of stacking layers in a sequence of molybdenum (Mo)/aluminum (Al), a multi-layer structure formed of stacking layers in a sequence of aluminum (AD/molybdenum (Mo)/aluminum (Al), or a double-layer structure formed of stacking layers in a sequence of titanium (Ti)/copper (Cu).

The first electrode EL1 may be electrically connected with the driving transistor Tdr of the pixel circuit layer PCL through the first contact hole CH1 of the passivation layer PSV and the first contact hole CH1 of the via layer VIA. The second electrode EL2 may be electrically connected with the driving voltage line DVL of the pixel circuit layer PCL through the second contact hole CH2 of the via layer VIA.

Each of the first and second electrodes EL1 and EL2 may function as an alignment electrode for aligning the light emitting elements LD in each pixel PXL. Furthermore, after the light emitting elements LD are aligned, the first and second electrodes EL1 and EL2 along with the first and second connection electrodes CNE1 and CNE2 may be used as driving electrodes for driving the light emitting elements LD. Furthermore, the first and second electrodes EL1 and EL2 may be used as reflective electrodes for reflecting light emitted from the light emitting elements LD in the image display direction of the display device.

The first insulating layer INS1 may be provided and/or formed on the first electrode EL1 and the second electrode EL2.

The first insulating layer INS1 may be formed of an inorganic insulating layer including inorganic material, or an organic insulating layer including organic material. The first insulating layer INS1 may be formed of an inorganic insulating layer suitable for protecting the light emitting elements LD from the pixel circuit layer PCL. For example, the first insulating layer INS1 may include at least one of silicon nitride ($SiN_x$), silicon oxide ($SiO_x$), silicon oxynitride ($SiO_xN_y$), and metal oxide such as aluminum oxide ($AlO_x$), but the present disclosure is not limited thereto. In one or more embodiments, the first insulating layer INS1 may be formed of an organic insulating layer that that is adapted for planarization of support surfaces of the light emitting elements LD.

The first insulating layer INS1 may be formed of a single layer or multiple layers. In case that the first insulating layer INS1 is formed of multiple layers, the first insulating layer INS1 may have a distributed bragg reflector (DBR) structure formed by alternately stacking first layers and second layers that are formed of inorganic insulating layers and have different refractive indexes. For example, the first insulating layer INS1 may have a stacked structure by alternating the first layers having a low refractive index and the second layers having a refractive index greater than that of the first layers. As described above, in case that the first insulating layer INS1 is formed of multiple layers, the first insulating layer INS1 may be used as a reflector configured to reflect light emitted from the light emitting elements LD in a target direction using constructive interference due to a difference in refractive index between the first layers and the second layers. Here, each of the first and second layers may include at least one of silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), silicon oxycarbide ($SiO_xC_y$), aluminum oxide ($AlO_x$), aluminum nitride ($AlN_x$), hafnium oxide ($HfO_x$), zirconium oxide ($ZrO_x$), titanium oxide ($TiO_x$), and tantalum oxide ($TaO_x$).

The first insulating layer INS1 may be provided and/or formed on the via layer VIA to cover the overall surfaces of the first electrode EL1 and the second electrode EL2. After the light emitting elements LD are supplied and aligned on the first insulating layer INS1, the first insulating layer INS1 may be partially open to expose one area of each of the first and second electrodes EL1 and EL2, as illustrated in FIGS. 6 and 7. The first insulating layer INS1 may be patterned in the form of an individual pattern that is sectionally disposed under the light emitting elements LD after the supply and alignment of the light emitting elements LD. The first insulating layer INS1 may cover the other areas of the first and second electrodes EL1 and EL2 except the one area of each of first and second electrodes EL1 and EL2. In one or more embodiments, the first insulating layer INS1 may be omitted.

The bank BNK may be provided and/or formed on the first insulating layer INS1. The bank BNK may be formed, to enclose the emission area EMA of each pixel PXL, between other pixels PXL so that a pixel defining layer for defining the emission area EMA of the corresponding pixel PXL may be formed. At the step of supplying the light emitting elements LD to the emission area EMA, the bank BNK may be a dam structure configured to prevent a solution mixed with the light emitting elements LD from being drawn into the emission area EMA of an adjacent pixel PXL or control the amount of solution such that a constant amount of solution is supplied to each emission area EMA.

The light emitting elements LD may be supplied to and aligned in the emission area EMA of each pixel PXL in which the first insulating layer INS1 is formed. For example, a plurality of light emitting elements LD may be supplied (or input) to the emission area EMA through an inkjet scheme or the like, and the light emitting elements LD may be aligned between the first electrode EL1 and the second electrode EL2 by suitable alignment signals (e.g., set or predetermined alignment signals) or alignment voltages that are respectively applied to the first and second electrodes EL1 and EL2.

A second insulating layer INS2 may be provided and/or formed on the light emitting elements LD. The second insulating layer INS2 may be provided and/or formed on the light emitting elements LD to partially cover the outer surface (e.g., the outer circumferential surface or the surface) of each of the light emitting elements LD such that the first end EP1 and the second end EP2 of each of the light emitting element LD are exposed to the outside.

The second insulating layer INS2 may have a single-layer structure or a multi-layer structure, and include an inorganic insulating layer including at least one inorganic material or an organic insulating layer including at least one organic material. The second insulating layer INS2 may include an inorganic insulating layer that may be suitable in protecting the active layer (refer to "12" of FIG. 1A) of each of the light emitting elements LD from external oxygen, water, etc. However, the present disclosure is not limited thereto. The second insulating layer INS2 may be formed of an organic insulating layer including organic material, depending on design conditions, etc. of the display device to which the light emitting elements LD are applied. Because the second insulating layer INS2 is formed on the light emitting elements LD after the alignment of the light emitting elements LD in the pixel area PXA (or the emission area EMA) of each pixel PXL has been completed, the light emitting elements LD may be prevented from being removed from the aligned positions.

In case that a gap (or space) is present between the first insulating layer INS1 and the light emitting elements LD before the formation of the second insulating layer INS2, the gap may be filled with the second insulating layer INS2 during a process of forming the second insulating layer INS2. In this case, the second insulating layer INS2 may be formed of an organic insulating layer that is adapted for filling the gap between the first insulating layer INS1 and the light emitting elements LD with the second insulating layer INS2.

The first connection electrode CNE1 may be provided and/or formed on the first electrode EL1 and the first end EP1 of the light emitting element LD. The first connection electrode CNE1 may electrically connect the first electrode EL1 with the first end EP1 of the light emitting element LD.

For example, the first connection electrode CNE1 may be disposed to contact the first electrode EL1 in one area of the first electrode EL1 that is not covered by the first insulating layer INS1. Furthermore, the first connection electrode CNE1 may be disposed on the first end EP1 of the light emitting element LD adjacent to the first electrode EL1 so that the first connection electrode CNE1 can contact the first end EP1 of the light emitting element LD. In other words, the first connection electrode CNE1 may be disposed to cover the first end EP1 of the light emitting element LD and at least one area of the corresponding first electrode EL1.

Likewise, the second connection electrode CNE2 may be provided on the second electrode EL2 and the second end EP2 of the light emitting element LD. The second connection electrode CNE2 may electrically connect the second electrode EL2 with the second end EP2 of the light emitting element LD.

The second connection electrode CNE2 may be disposed to contact the second electrode EL2 in one area of the second electrode EL2 that is not covered by the first insulating layer INS1. Furthermore, the second connection electrode CNE2 may be disposed on the second end EP2 of the light emitting element LD adjacent to the second electrode EL2 so that the second connection electrode CNE2 can contact the second end EP2 of the light emitting element LD. In other words, the second connection electrode CNE2 may be disposed to cover the second end EP2 of the light emitting element LD and at least one area of the corresponding second electrode EL2.

The first and second connection electrodes CNE1 and CNE2 may be formed of various transparent conductive material to allow light emitted from each of the light emitting elements LD and reflected by the first and second electrodes EL1 and EL2 to travel in the image display direction (e.g., the third direction DR3) of the display device without loss (e.g., without significant loss). For example, the first and second connection electrodes CNE1 and CNE2 may include at least one of various transparent conductive materials including indium tin oxide (ITO), indium zinc oxide (IZO), zinc oxide (ZnO), indium gallium zinc oxide (IGZO), and indium tin zinc oxide (ITZO), and may be substantially transparent or translucent to satisfy a desired transmittancy (e.g., a set or predetermined transmittancy or transmittance). The material of the first and second connection electrodes CNE1 and CNE2 is not limited to the above-mentioned materials. In one or more embodiments, the first and second connection electrodes CNE1 and CNE2 may also be formed of various opaque conductive materials (or substances). The first and second connection electrodes CNE1 and CNE2 each may have a single-layer structure or a multi-layer structure.

In one or more embodiments, the first connection electrode CNE1 and the second connection electrode CNE2 may be provided on or at an identical layer. In this case, the first connection electrode CNE1 and the second connection electrode CNE2 may be formed through an identical process. However, the present disclosure is not limited thereto. In one or more embodiments, the first connection electrode CNE1 and the second connection electrode CNE2 may be formed through different processes and be provided on or at different layers. Description pertaining thereto will be made below with reference to FIG. 11.

The third insulating layer INS3 may be provided and/or formed on the first connection electrode CNE1 and the second connection electrode CNE2. The third insulating layer INS3 may be an inorganic insulating layer including inorganic material or an organic insulating layer including organic material. For example, the third insulating layer INS3 may have a structure formed by alternately stacking at least one inorganic insulating layer and at least one organic insulating layer. The third insulating layer INS3 may cover the entirety of the display element layer DPL and prevent water or moisture from being drawn into the display element layer DPL including the light emitting elements LD from the outside. Furthermore, in one or more embodiments, at least one overcoat layer (e.g., a layer for planarizing the upper surface of the display element layer DPL) may be further disposed over the third insulating layer INS3.

Figure 8:
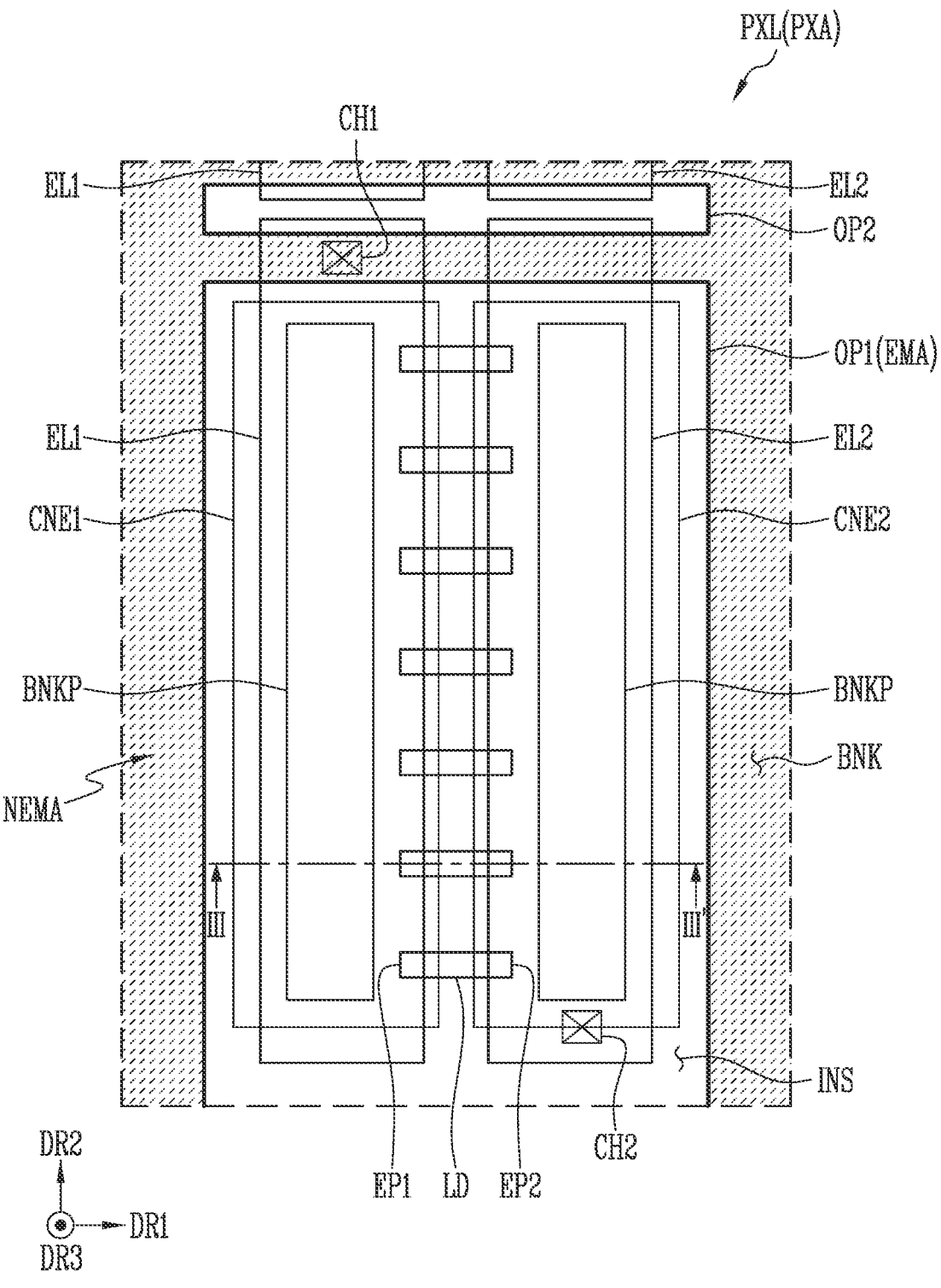
FIG. 8 is a plan view schematically illustrating a pixel in accordance with one or more embodiments of the present disclosure.
Figure 9:
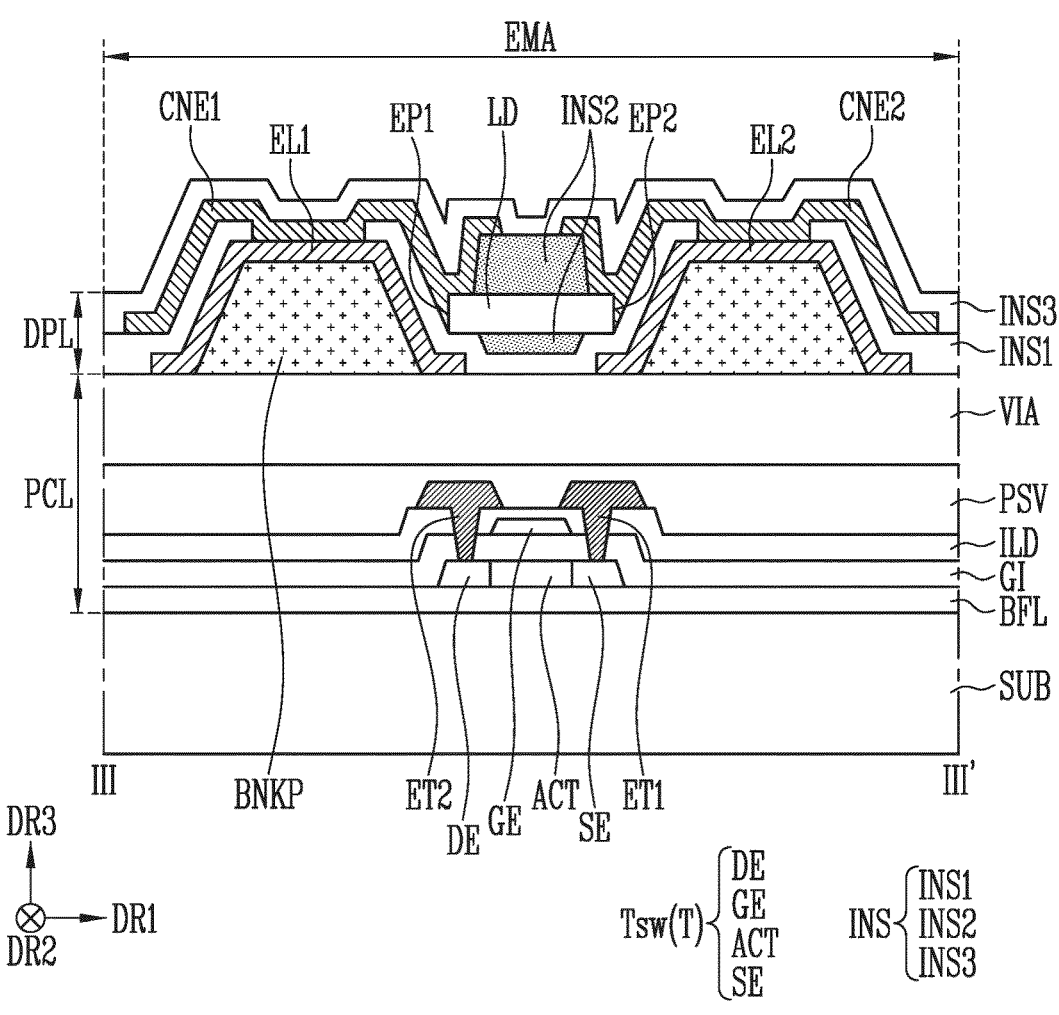
FIG. 9 is a cross-sectional view taken along the line III-III' of FIG. 8.
Figure 10A:
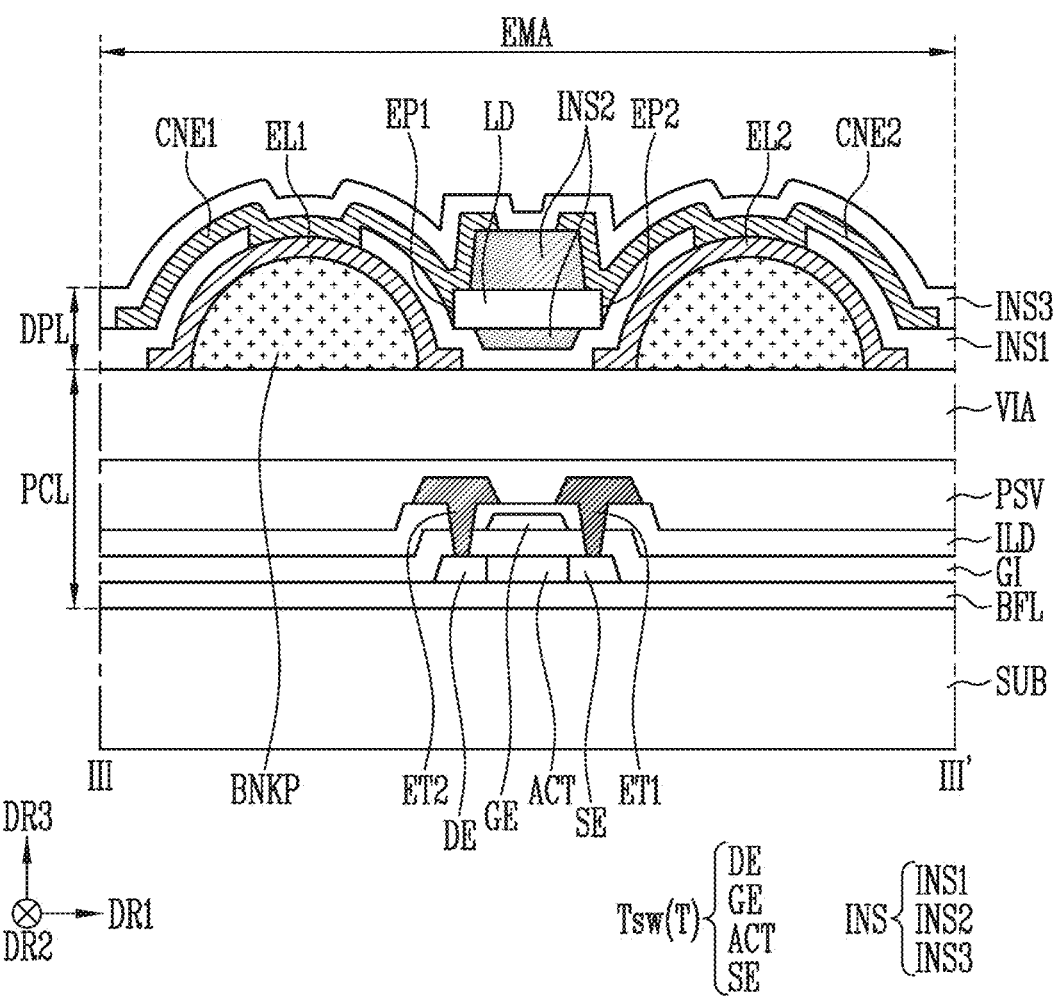
FIGS. 10A and 10B illustrate different embodiments of a bank pattern of FIG. 9, and are cross-sectional views corresponding to the line III-III' of FIG. 8.
Figure 10B:
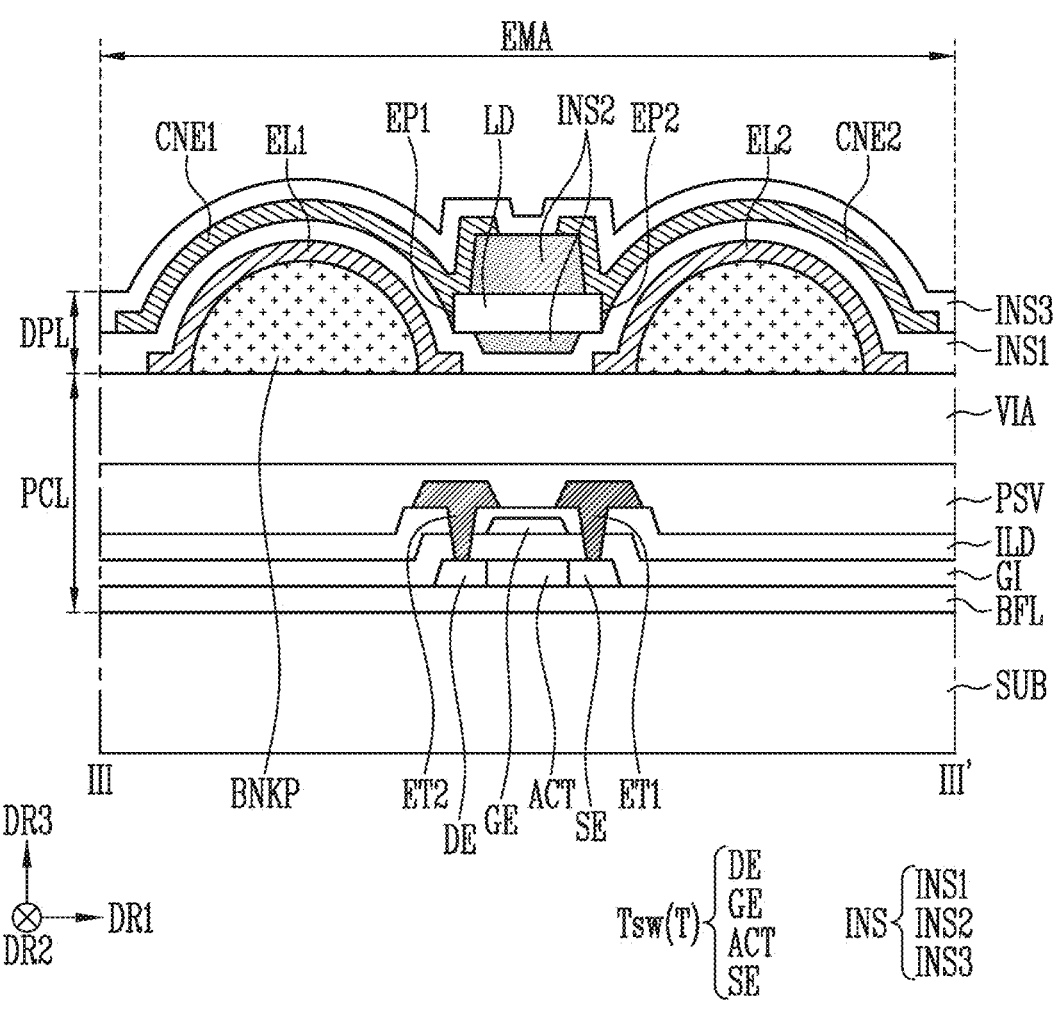
Figure 11:
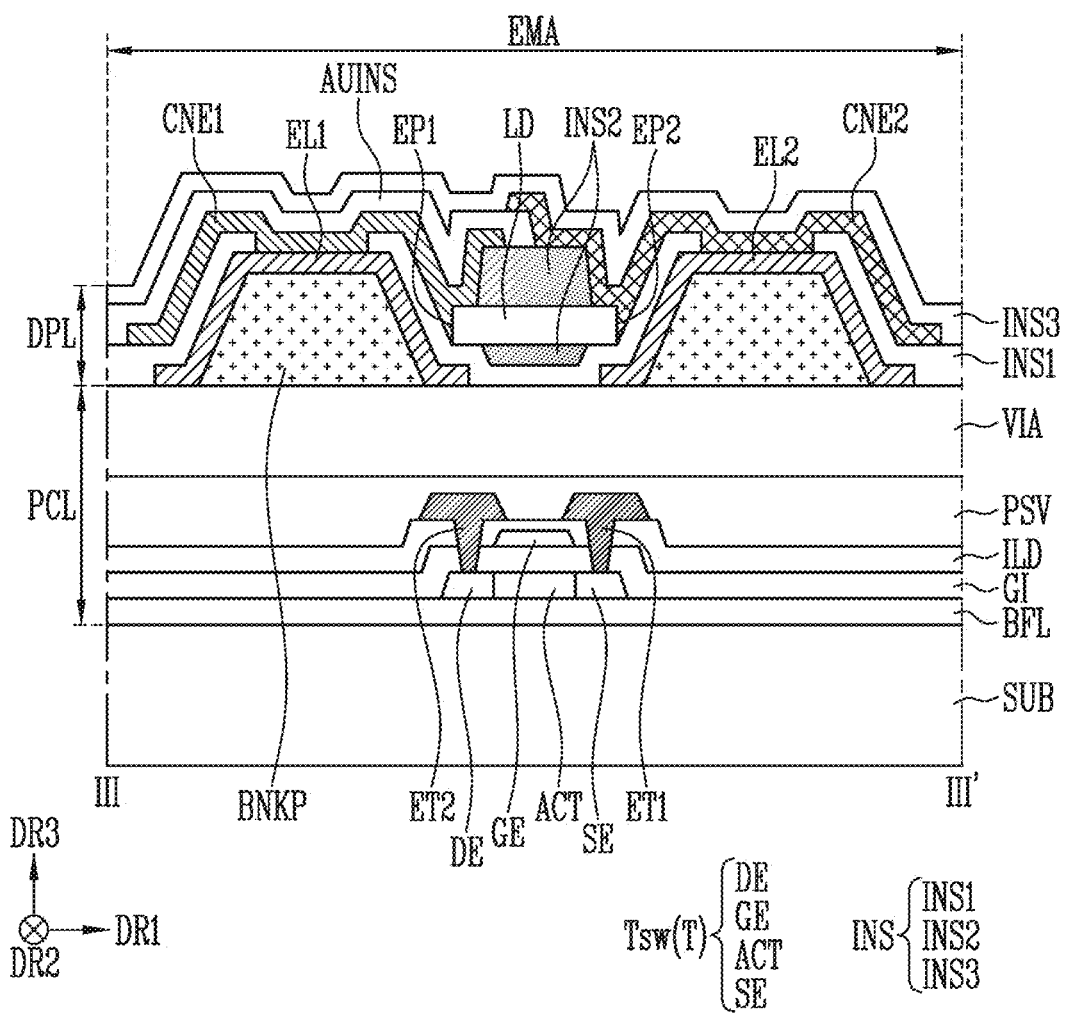
FIG. 11 illustrate different embodiments of first and second connection electrodes of FIG. 9, and are cross-sectional views corresponding to the line III-III' of FIG. 8.

FIG. 8 is a plan view schematically illustrating a pixel PXL in accordance with one or more embodiments. FIG. 9 is a cross-sectional view taken along the line III-III' of FIG. 8. FIGS. 10A and 10B illustrate different embodiments of a bank pattern BNKP of FIG. 9, and are cross-sectional views corresponding to the line III-III' of FIG. 8. FIG. 11 illustrate different embodiments of first and second connection electrodes CNE1 and CNE2 of FIG. 9, and cross—are sectional views corresponding to the line III-III' of FIG. 8.

The pixel PXL illustrated in FIGS. 8 to 11, other than the fact that a bank pattern BNKP is disposed between the via layer VIA and each of the first electrode EU and the second electrode EL2, may have a configuration substantially equal or similar to that of the pixel PXL illustrated in FIGS. 5 to 7.

Therefore, to avoid redundant explanation, the description of the pixel PXL of FIGS. 8 to 11 will be focused on differences from that of the foregoing embodiments.

Referring to FIGS. 8 to 11, a support component may be disposed between each of the first and second electrodes EL1 and EL2 and the via layer VIA. For example, as illustrated in FIGS. 8 to 11, a bank pattern BNKP may be disposed between each of the first and second electrodes EL1 and EL2 and the via layer VIA.

The bank pattern BNKP may be disposed in the emission area EMA, from which light is to be emitted, in the pixel area PXA of each pixel PXL. The bank pattern BNKP may be a support component that supports each of the first and second electrodes EU and EL2 to change a surface profile (or a surface shape) of each of the first and second electrodes EU and EL2 so that light emitted from the light emitting elements LD may be guided in the third direction DR3 (or the image display direction of the display device).

The bank pattern BNKP may be provided in the emission area EMA of the corresponding pixel PXL between the via layer VIA and the first and second electrodes EL1 and EL2.

The bank pattern BNKP may be an inorganic insulating layer including inorganic material or an organic insulating layer including organic material. In one or more embodiments, the bank pattern BNKP may include an organic insulating layer having a single-layer structure and/or an inorganic insulating layer having a single-layer structure, but the present disclosure is not limited thereto. In one or more embodiments, the bank pattern BNKP may be provided in a multi-layer structure formed by stacking at least one organic insulating layer and at least one inorganic insulating layer. However, the material of the bank pattern BNKP is not limited to the foregoing embodiment. In one or more embodiments, the bank pattern BNKP may include conductive material.

The bank pattern BNKP may have a trapezoidal (or semi-circular) cross-section that is reduced in width from one surface (e.g., an upper surface) of the via layer VIA upward in the third direction DR3, but the present disclosure is not limited thereto. In one or more embodiments, as illustrated in FIGS. 10A and 10B, the bank pattern BNKP may include a curved surface having a cross-sectional shape such as a semi-elliptical shape or a semi-circular shape (or a hemispherical shape) that is reduced in width from one surface of the via layer VIA upward in the third direction DR3. In a sectional view, the shape of the bank pattern BNKP is not limited to the foregoing examples, and may be changed in various ways within a range in which the efficiency of light emitted from each of the light emitting elements LD can be enhanced.

Each of the first and second electrodes EL1 and EL2 may be provided and/or formed on the corresponding bank pattern BNKP. In this case, in a sectional view, each of the first and second electrodes EL1 and EL2 may have a surface profile corresponding to the shape of the bank pattern BNKP disposed thereunder. Hence, light emitted from the light emitting elements LD may be reflected by each of the first and second electrodes EL1 and EL2 and more reliably travel in the third direction DR3 (or the image display direction of the display device). The bank pattern BNKP and each of the first and second electrodes EL1 and EL2 may function as a reflective component configured to guide light emitted from the light emitting elements LD in a desired direction and thus enhance the optical efficiency of the display device. Consequently, the light output efficiency of the light emitting elements LD may be further enhanced.

The first connection electrode CNE1 and the second connection electrode CNE2 are disposed at positions spaced from each other with respect to the first direction DR1, in a plan view. For example, the first connection electrode CNE1 and the second connection electrode CNE2 may be disposed on the second insulating layer INS2 on the light emitting elements LD at positions spaced from each other by suitable distance (e.g., a set or predetermined distance). The first connection electrode CNE1 and the second connection electrode CNE2 may be provided on or at an identical layer and formed through an identical process. However, the present disclosure is not limited thereto. In one or more embodiments, the first and second connection electrodes CNE1 and CNE2 may be formed on or at different layers through different processes. In this case, as illustrated in FIG. 11, an auxiliary insulating layer AUINS (or a fourth insulating layer) may be provided and/or formed between the first connection electrode CNE1 and the second connection electrode CNE2 The auxiliary insulating layer AUINS may be provided on the first connection electrode CNE1 to prevent the first connection electrode CNE1 from being exposed, so that the first connection electrode CNE1 may be prevented from being corroded. The auxiliary insulating layer AUINS may be formed of an inorganic insulating layer including inorganic material, or an organic insulating layer including organic material. For example, the auxiliary insulating layer AUINS may include at least one of silicon nitride ($SiN_x$), silicon oxide ($SiO_x$), silicon oxynitride ($SiO_xN_y$), and metal oxide such as aluminum oxide ($AlO_x$), but the present disclosure is not limited thereto. Furthermore, the auxiliary insulating layer AUINS may have a single-layer structure or a multi-layer structure.

In one or more embodiments, if electrical connection between the first connection electrode CNE1 and the first electrode EL1 and electrical connection between the second connection electrode CNE2 and the second electrode EL2 are formed in the emission area EMA (e.g., if the first connection electrode CNE1 and the first electrode EL1 are electrically connected to each other in the emission area EMA, and the second connection electrode CNE2 and the second electrode EL2 are electrically connected to each other in the emission area EMA), the first insulating layer INS1 that is disposed between the first connection electrode CNE1 and the first electrode EL1 and between the second connection electrode CNE2 and the second electrode EL2 may be partially open in the emission area EMA, as illustrated in FIG. 10A. In this case, the first connection electrode CNE1 and the first electrode EL1 are electrically connected to each other through an opening in the first insulating layer INS1 in the emission area EMA. The second connection electrode CNE2 and the second electrode EL2 may also be electrically connected to each other through an opening in the first insulating layer INS1. In one or more embodiments, if electrical connection between the first connection electrode CNE1 and the first electrode EL1 and electrical connection between the second connection electrode CNE2 and the second electrode EL2 are formed in the non-emission area NEMA (e.g., if the first connection electrode CNE1 and the first electrode EL1 are electrically connected to each other in the non-emission area NEMA, and the second connection electrode CNE2 and the second electrode EL2 are electrically connected to each other in the non-emission area NEMA), the first insulating layer INS1 that is disposed between the first connection electrode CNE1 and the first electrode EL1 and between the second connection electrode CNE2 and the second electrode EL2 may not be open in the emission area EMA, as illustrated in FIG. 10B. Hence, each of the first and second electrodes EL1 and EL2 may be covered by the first insulating layer INS1 in the emission area EMA.

The third insulating layer INS3 may be provided and/or formed on the first and second connection electrodes CNE1 and CNE2. The third insulating layer INS3 may be an inorganic insulating layer including inorganic material or an organic insulating layer including organic material. For example, the third insulating layer INS3 may have a structure formed by alternately stacking at least one inorganic insulating layer and at least one organic insulating layer. The third insulating layer INS3 may cover the entirety of the display element layer DPL and prevent water or moisture from being drawn into the display element layer DPL including the light emitting elements LD from the outside. In one or more embodiments, at least one overcoat layer (e.g., a layer for planarizing the upper surface of the display element layer DPL) may be further disposed over the third insulating layer INS3.

Hereinafter, description will be made for an embodiment where, at the step of supplying the light emitting elements LD to the pixel area PXA of each pixel PXL, a discharge surface area of ink (e.g., a mixed solution including the light emitting elements LD) to be supplied (or discharged) to each pixel PXL may be increased.

Figure 12A:
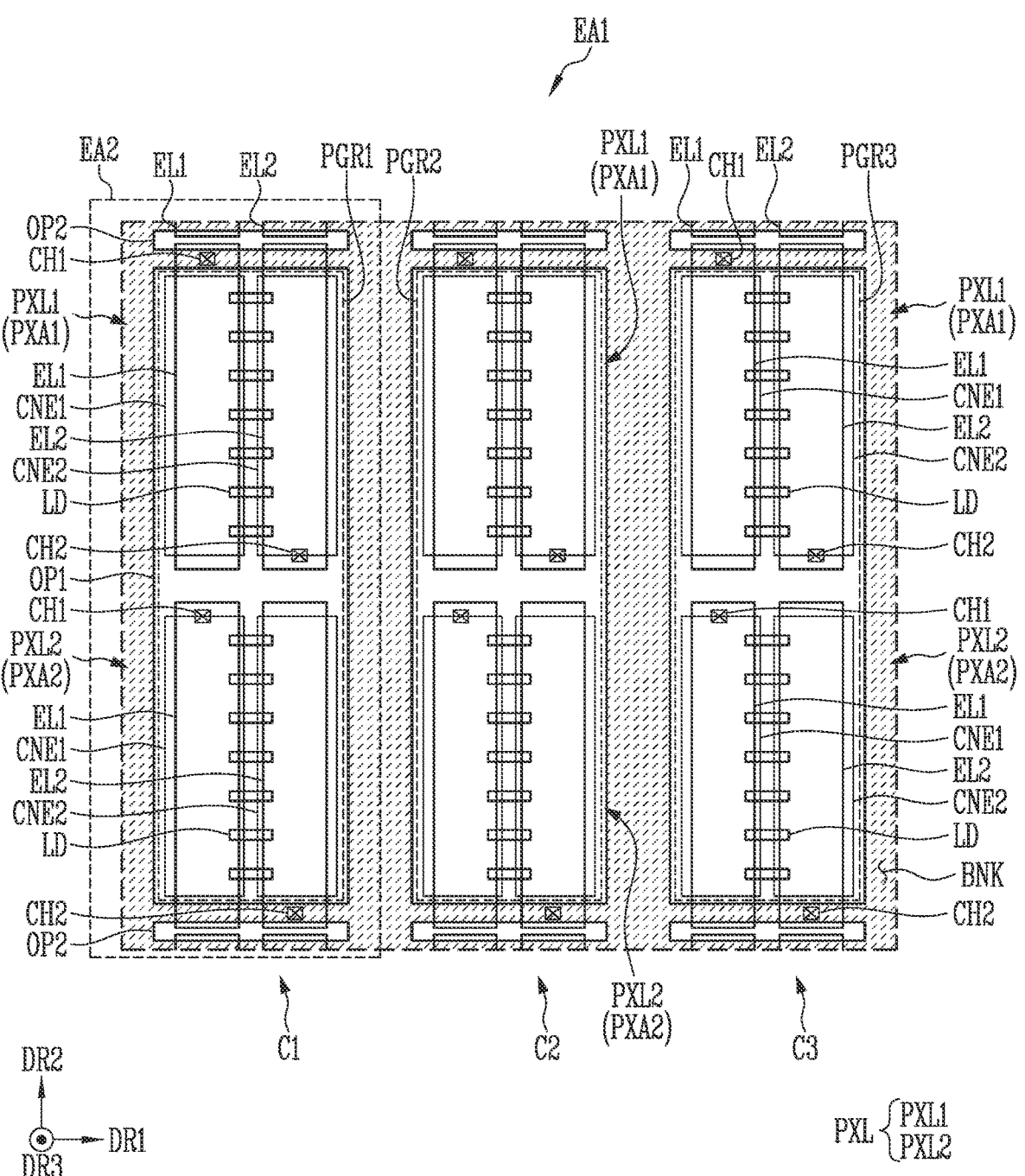
FIG. 12A is a schematic enlarged plan view of a portion EA1 of FIG. 3.
Figure 12B:
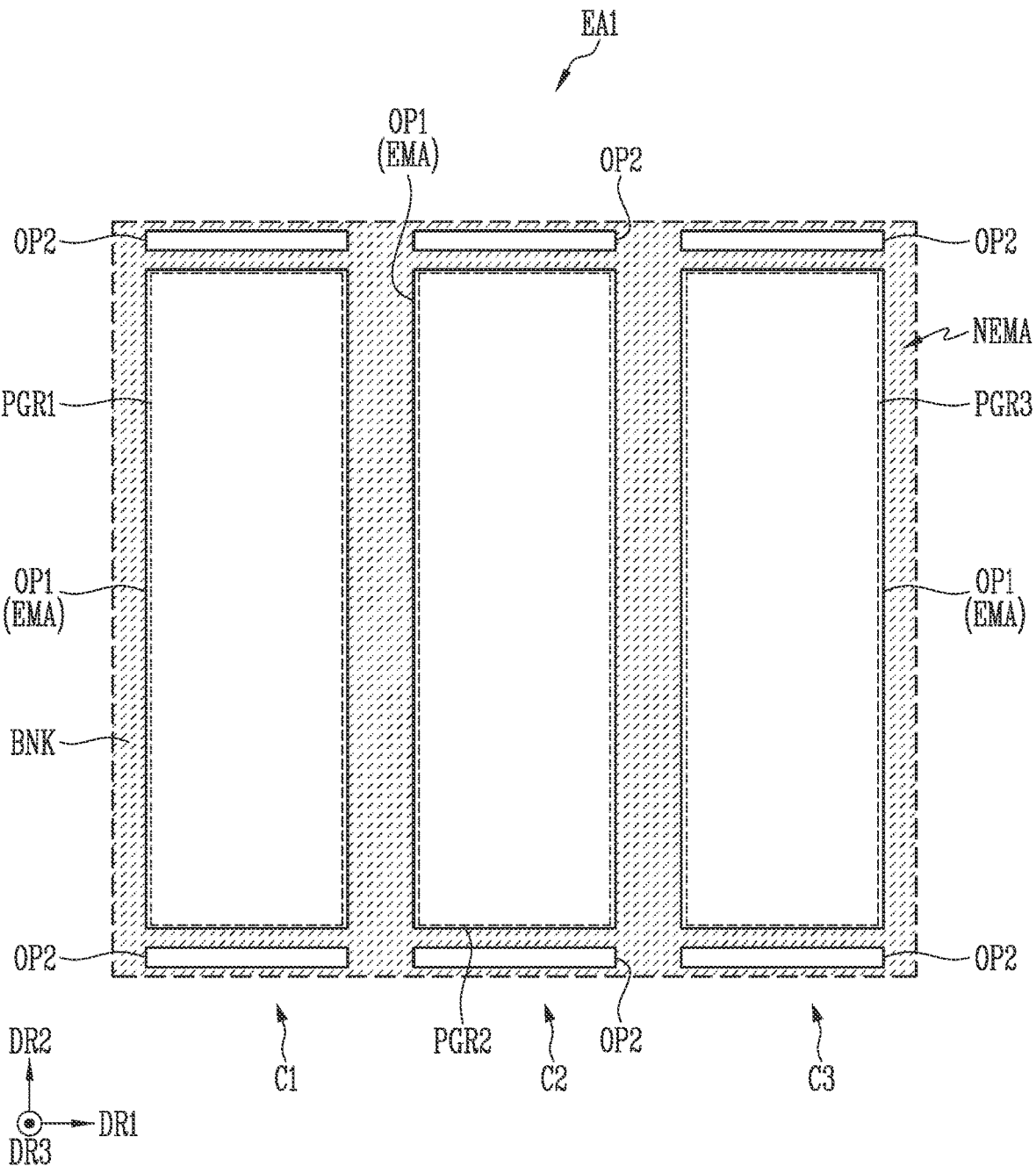
FIG. 12B is an enlarged plan view schematically illustrating only a bank in the portion EA1 of FIG. 12A.
Figure 13:
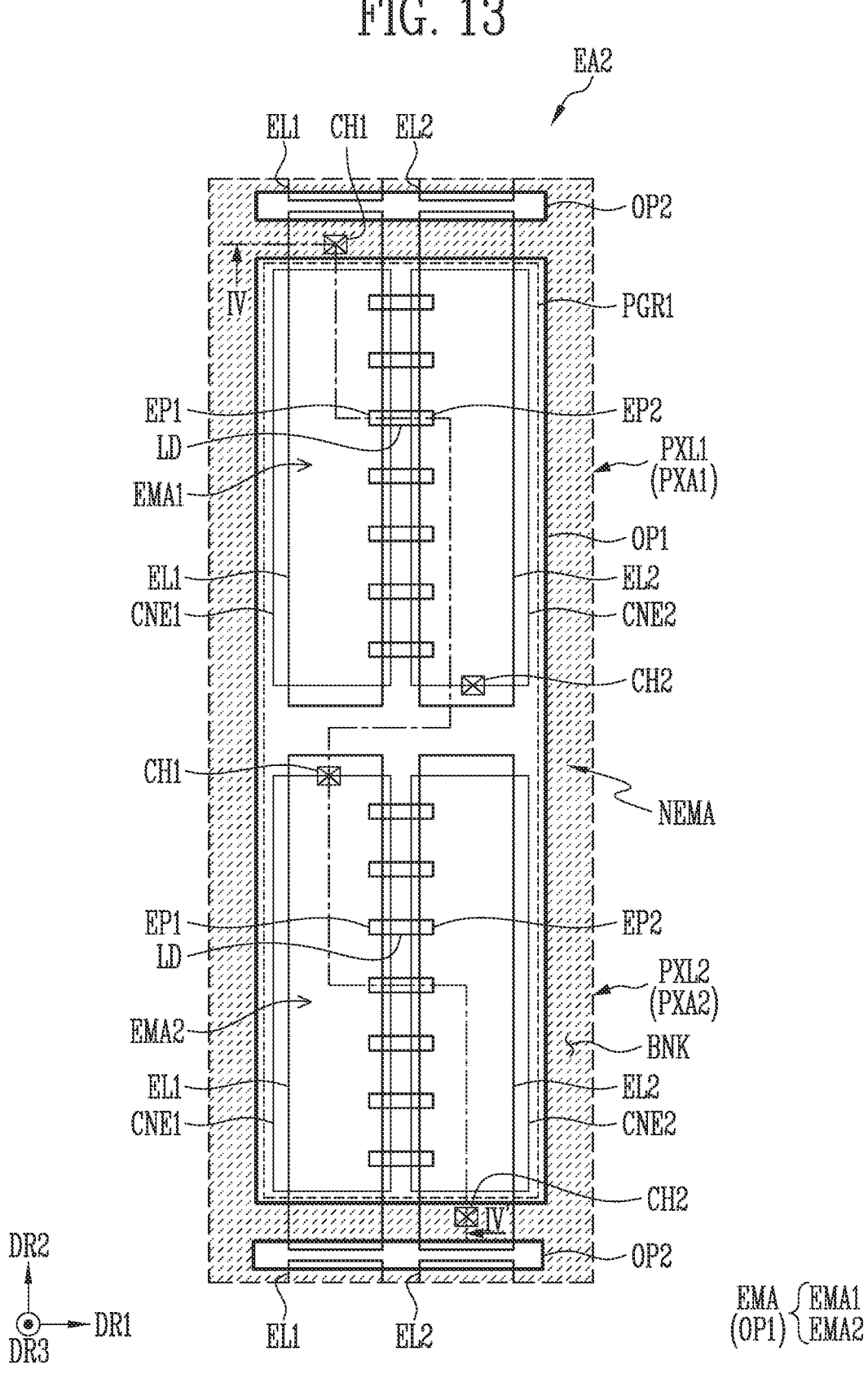
FIG. 13 is a schematic enlarged plan view of a portion EA2 of FIG. 12A.

FIG. 12A is a schematic enlarged plan view of portion EA1 of FIG. 3. FIG. 12B is an enlarged plan view schematically illustrating only a bank BNK in portion EA1 of FIG. 12A. FIG. 13 is a schematic enlarged plan view of portion EA2 of FIG. 12A.

The description with reference to FIGS. 12A to 13 will be focused on differences from the above-mentioned embodiments so as to avoid redundant description.

In FIGS. 12A to 13, a transverse direction (or a horizontal direction) in a plan view is indicated by a first direction DR1, a longitudinal direction (or a vertical direction) in a plan view is indicated by a second direction DR2, and a thickness direction of the substrate SUB in a sectional view is indicated by a third direction DR3. The first to third directions DR1, DR2, and DR3 may refer to the directions indicated by the first to third directions DR1, DR2, and DR3, respectively.

Referring to FIGS. 3, and 12A to 13, a plurality of pixel columns each including a plurality of pixels PXL may be disposed in the display area DA of the substrate SUB.

In one or more embodiments, the pixel columns may include a first pixel column C1, a second pixel column C2, and a third pixel column C3 that are arranged successively along the first direction DR1 and extend in the second direction DR2. A plurality of pixels PXL arranged along the second direction DR2 may be provided in each of the first to third pixel columns C1, C2, and C3.

In the first pixel column C1, there may be provided a first pixel group PGR1 including, as one unit, a first pixel PXL1 and a second pixel PXL2 that are arranged along an extension direction of the corresponding pixel column, e.g., in the second direction DR2. In one or more embodiments, a plurality of first pixel groups PGR1 may be provided in the first pixel column C1. The first pixel PXL1 and the second pixel PXL2 in the first pixel group PGR1 may be electrically disconnected from each other and independently (or individually) driven. The first pixel PXL1 may be provided in a first pixel area PXA1 in the first pixel group PGR1. The second pixel PXL2 may be provided in a second pixel area PXA2 in the first pixel group PGR1.

In one or more embodiments, the first pixel PXL1 and the second pixel PXL2 included in the first pixel group PGR1 may emit the same color of light. The first pixel PXL1 and the second pixel PXL2 included in the first pixel group PGR1 may emit white light and/or color light. For example, the first pixel PXL1 and the second pixel PXL2 may emit red light.

In the second pixel column C2, there may be provided a second pixel group PGR2 including, as one unit, a first pixel PXL1 and a second pixel PXL2 that are arranged along the second direction DR2 that is an extension direction of the corresponding pixel column. In one or more embodiments, a plurality of second pixel groups PGR2 may be provided in the second pixel column C2. The first pixel PXL1 and the second pixel PXL2 in the second pixel group PGR2 may be electrically disconnected from each other and independently (or individually) driven. The first pixel PXL1 may be provided in a first pixel area PXA1 in the second pixel group PGR2. The second pixel PXL2 may be provided in a second pixel area PXA2 in the second pixel group PGR2.

In one or more embodiments, the first pixel PXL1 and the second pixel PXL2 included in the second pixel group PGR2 may emit the same color of light. The first pixel PXL1 and the second pixel PXL2 included in the second pixel group PGR2 may emit white light and/or color light. The first and second pixels PXL1 and PXL2 included in the second pixel group PGR2 may emit light having a color different from that of the first and second pixels PXL1 and PXL2 included in the first pixel group PGR1. For example, the first and second pixels PXL1 and PXL2 included in the second pixel group PGR2 may emit green light or blue light. In one or more embodiments, the first and second pixels PXL1 and PXL2 included in the second pixel group PGR2 may emit green light.

In the third pixel column C3, there may be provided a third pixel group PGR3 including, as one unit, a first pixel PXL1 and a second pixel PXL2 that are arranged along the second direction DR2 that is an extension direction of the corresponding pixel column. In one or more embodiments, a plurality of third pixel groups PGR3 may be provided in the third pixel column C3. The first pixel PXL1 and the second pixel PXL2 in the third pixel group PGR3 may be electrically disconnected from each other and independently (or individually) driven. The first pixel PXL1 may be provided in a first pixel area PXA1 in the third pixel group PGR3. The second pixel PXL2 may be provided in a second pixel area PXA2 in the third pixel group PGR3.

In one or more embodiments, the first pixel PXL1 and the second pixel PXL2 included in the third pixel group PGR3 may emit the same color of light. The first pixel PXL1 and the second pixel PXL2 included in the third pixel group PGR3 may emit white light and/or color light. For example, the first pixel PXL1 and the second pixel PXL2 may emit blue light.

The first and second pixels PXL1 and PXL2 of the first pixel group PGR1, the first and second pixels PXL1 and PXL2 of the second pixel group PGR2, and the first and second pixels PXL1 and PXL2 of the third pixel group PGR3 may emit different colors of light.

In one or more embodiments, each of the first pixel group PGR1, the second pixel group PGR2, and the third pixel group PGR3 may be disposed on the same pixel row as that of a pixel group adjacent thereto in the first direction DR1. The first pixel PXL1 of the first pixel group PGR1 may be disposed on the same pixel row as that of the first pixel PXL1 of the second pixel group PGR2 adjacent thereto in the first direction DR1. The first pixel PXL1 of the second pixel group PGR2 may be disposed on the same pixel row as that of the first pixel PXL1 of the first pixel group PGR1 and the first pixel PXL1 of the third pixel group PGR3 in the first direction DR1. The first pixel PXL1 of the third pixel group PGR3 may be disposed on the same pixel row as that of the first pixel PXL1 of the second pixel group PGR2 in the first direction DR1. Furthermore, the second pixel PXL2 of the first pixel group PGR1 may be disposed on the same pixel row as that of the second pixel PXL2 of the second pixel group PGR2 adjacent thereto in the first direction DR1. The second pixel PXL2 of the second pixel group PGR2 may be disposed on the same pixel row as that of the second pixel PXL2 of the first pixel group PGR1 and the second pixel PXL2 of the third pixel group PGR3 in the first direction DR1. The second pixel PXL2 of the third pixel group PGR3 may be disposed on the same pixel row as that of the second pixel PXL2 of the second pixel group PGR2 in the first direction DR1.

Although in the foregoing embodiment there has been described that each of the first pixel group PGR1, the second pixel group PGR2, and the third pixel group PGR3 is disposed on the same pixel row as that of a pixel group adjacent thereto in the first direction DR1, the present disclosure is not limited thereto. In one or more embodiments, each of the first pixel group PGR1, the second pixel group PGR2, and the third pixel group PGR3 may be disposed on a pixel row different from that of a pixel group adjacent thereto in the first direction DR1. For example, the first pixel group PGR1 may be misaligned with the second pixel group PGR2 with respect to the first direction DR1. The second pixel group PGR2 may be misaligned with each of the first and third pixel groups PGR1 and PGR3 with respect to the first direction DR1. The third pixel group PGR3 may be misaligned with the second pixel group PGR2 with respect to the first direction DR1.

A bank BNK may be disposed around each of the first pixel group PGR1, the second pixel group PGR2, and the third pixel group PGR3. For example, the bank BNK may be disposed on the substrate SUB to enclose the emission area EMA of the first pixel group PGR1, the emission area EMA of the second pixel group PGR2, and the emission area EMA of the third pixel group PGR3.

The bank BNK may be the bank BNK described with reference to FIGS. 5 to 7. The bank BNK may be a structure, e.g., a pixel defining layer, for defining (or partitioning) the emission areas EMA of each of the first to third pixel groups PGR1, PGR2, and PGR3 and pixel groups adjacent thereto.

The bank BNK may include one or more openings that expose components disposed under the bank BNK in each of the first to third pixel groups PGR1, PGR2, and PGR3. For example, the bank BNK may include a first opening OP1 and a second opening OP2 that expose components disposed under the bank BNK in each of the first to third pixel groups PGR1, PGR2, and PGR3.

In one or more embodiments, the first opening OP1 of the bank BNK may correspond to the emission area EMA of each of the first to third pixel groups PGR1, PGR2, and PGR3.

The second opening OP2 of the bank BNK may be disposed between pixel groups adjacent to each other in the second direction DR2 in each of the first to third pixel columns C1, C2, and C3.

In the first pixel column C1, the second opening OP2 of the bank BNK may be located at each of upper and lower ends of the first pixel group PGR1 with respect to the second direction DR2. In other words, in the first pixel column C1, the second opening OP2 of the bank BNK may be located between the first pixel groups PGR1 adjacent to each other in the second direction DR2. In a plan view, in the first pixel column C1, the first pixel groups PGR1 and the second openings OP2 may be alternately disposed along the second direction DR2.

Furthermore, in the second pixel column C2, the second opening OP2 of the bank BNK may be located at each of upper and lower ends of the second pixel group PGR2 with respect to the second direction DR2. In other words, in the second pixel column C2, the second opening OP2 of the bank BNK may be located between the second pixel groups PGR2 adjacent to each other in the second direction DR2. In a plan view, in the second pixel column C2, the second pixel groups PGR2 and the second openings OP2 may be alternately disposed along the second direction DR2.

In addition, in the third pixel column C3, the second opening OP2 of the bank BNK may be located at each of upper and lower ends of the third pixel group PGR3 with respect to the second direction DR2. In other words, in the third pixel column C3, the second opening OP2 of the bank BNK may be located between the third pixel groups PGR3 adjacent to each other along the second direction DR2. In a plan view, in the third pixel column C3, the third pixel groups PGR3 and the second openings OP2 may be alternately disposed along the second direction DR2.

The first to third pixel groups PGR1, PGR2, and PGR3 may have a substantially similar or identical structure. The description of the first pixel group PGR1 with reference to FIG. 13 will substitute for description of the second and third pixel groups PGR2 and PGR3.

Each of the first and second pixels PXL1 and PXL2 included in the first pixel group PGR1 may include a first electrode EL1 and a second electrode EL2 that are disposed at positions spaced from each other. In one or more embodiments, each of the first and second pixels PXL1 and PXL2 may have a structure substantially similar or equal to that of the pixel PXL described with reference to FIG. 5.

The first and second electrodes EU and EL2 of each of the first and second pixels PXL1 and PXL2 may be separated from other electrodes in the first opening OP1 and the second opening OP2 after the light emitting elements LD are supplied to and aligned in the pixel area of the corresponding pixel PXL.

In detail, one end of the first electrode EL1 of the first pixel PXL1 may be separated, in the second opening OP2 located on the upper end of the first pixel PXL1, from the first electrode EL1 of the pixel PXL that is adjacent thereto in the second direction DR2. A remaining end of the first electrode EL1 may be separated, in the first opening OP1 (or the emission area EMA of the first pixel group PGR1), from one end of the first electrode EL1 of the second pixel PXL2 that is adjacent thereto in the second direction DR2. One end of the second electrode EL2 of the first pixel PXL1 may be separated, in the second opening OP2 located on the upper end of the first pixel PXL1, from the second electrode EL2 of the pixel PXL that is adjacent thereto in the second direction DR2. A remaining end of the second electrode EL2 may be separated, in the first opening OP1 (or the emission area EMA of the first pixel group PGR1), from one end of the second electrode EL2 of the second pixel PXL2 that is adjacent thereto in the second direction DR2.

One end of the first electrode EL1 of the second pixel PXL2 may be separated, in the first opening OP1 (or the emission area EMA of the first pixel group PGR1), from the remaining end of the first electrode EL1 of the pixel PXL that is adjacent thereto in the second direction DR2. A remaining end of the first electrode EL1 may be separated, in the second opening OP2 located on the lower end of the second pixel PXL2, from the first electrode EL1 of the pixel PXL that is adjacent thereto in the second direction DR2. One end of the second electrode EL2 of the second pixel PXL2 may be separated, in the first opening OP1 (or the emission area EMA of the first pixel group PGR1), from the remaining end of the second electrode EL2 of the first pixel PXL1 that is adjacent thereto in the second direction DR2. A remaining end of the second electrode EL2 may be separated, in the second opening OP2 located on the lower end of the second pixel PXL2, from the second electrode EL2 of the pixel PXL that is adjacent thereto in the second direction DR2.

The first electrode EL1 of each of the first and second pixels PXL1 and PXL2 may be electrically connected with the first transistor T1 described with reference to FIG. 4 through the first contact hole CH1. The second electrode EL2 of each of the first and second pixels PXL1 and PXL2 may be electrically connected with the second driving power supply VSS (or the second power line PL2) described with reference to FIG. 4 through the second contact hole CH2. The first electrode EL1 of each of the first and second pixels PXL1 and PXL2 may be an anode of the emission unit (refer to "EMU" of FIG. 4) of the corresponding pixel PXL. The second electrode EL2 of each of the first and second pixels PXL1 and PXL2 may be a cathode of the emission unit EMU.

The first electrode EL1 and the second electrode EL2 of the first pixel PXL1 may be disposed in the first pixel area PXA1 (or a first emission area EMA1). The first electrode EL1 and the second electrode EL2 of the second pixel PXL2 may be disposed in the second pixel area PXA2 (or a second emission area EMA2).

The first and second electrodes EU and EL2 of each of the first and second pixels PXL1 and PXL2 may be used as alignment electrodes (or alignment lines) for aligning the light emitting elements LD in the emission area EMA of the first pixel group PGR1 by suitable alignment signals (e.g., set or predetermined alignment signals) transmitted thereto before the light emitting elements LD are aligned. Before the light emitting elements LD are aligned in the first pixel group PGR1, each of the first electrode EL1 and the second electrode EL2 of the first and second pixels PXL1 and PXL2 may form an alignment electrode (or an alignment line) that extends in the second direction DR2 in the display area DA rather than being divided into parts by each pixel PXL. For example, the first electrode EL1 of the first pixel PXL1 and the first electrode EL1 of the second pixel PXL2 may be integrally provided and form one first alignment electrode (or one first alignment line). The second electrode EL2 of the first pixel PXL1 and the second electrode EL2 of the second pixel PXL2 may be integrally provided and form one second alignment electrode (or one second alignment line).

Each of the first and second pixels PXL1 and PXL2 may include a plurality of light emitting elements LD.

The light emitting elements LD may be disposed between the first electrode EL1 and the second electrode EL2 in each of the first and second pixels PXL1 and PXL2. Each of the light emitting elements LD may include a first end EP1 and a second end EP2 that are respectively disposed on opposite ends thereof with respect to the longitudinal direction. A p-type semiconductor layer may be disposed on the first end EP1. An n-type semiconductor layer may be disposed on the second end EP2. Each of the light emitting elements LD may be the light emitting element LD described with reference to FIG. 1A.

In one or more embodiments, each of the first and second pixels PXL1 and PXL2 may include a first connection electrode CNE1 and a second connection electrode CNE2.

The first connection electrode CNE1 may be provided and/or formed on the respective first ends EP1 of the light emitting elements LD and one area of the first electrode EL1 corresponding to the first ends EP1, so that the respective first ends EP1 of the light emitting elements LD may be physically and/or electrically connected to the first electrode EL1. The first connection electrode CNE1 may be provided and/or formed on the first electrode EL1 and overlap the first electrode EU.

The second connection electrode CNE2 may be provided and/or formed on the respective second ends EP2 of the light emitting elements LD and one area of the second electrode EL2 corresponding to the second ends EP2, so that the respective second ends EP2 of the light emitting elements LD may be physically and/or electrically connected to the second electrode EL2. The second connection electrode CNE2 may be provided and/or formed on the second electrode EL2 and overlap the second electrode EL2.

The light emitting elements LD may be dispersed in a solvent and supplied (or discharged) to the emission area EMA of the first pixel group PGR1 (or the first opening OP1 of the bank BNK) by a nozzle of an inkjet printing device or the like. For example, ink including a solvent and a plurality of light emitting elements LD dispersed in the solvent may flow along an internal tube in the inkjet printing device and discharged to a target area through the nozzle. Here, the nozzle of the inkjet printing device may be disposed to correspond to the first opening OP1 of the bank BNK so that ink may be supplied (or discharged) to the emission area EMA of the first pixel group PGR1.

As described above, in the first pixel column C1, the second openings OP2 of the bank BNK and the first pixel groups PGR1 are alternately disposed along the second direction DR2, so that the second opening OP2 may not be disposed between the first pixel PXL1 and the second pixel PXL2. In other words, in the first pixel group PGR1, the bank BNK including the second opening OP2 may not be disposed between the first pixel PXL1 and the second pixel PXL2 that are adjacent to each other in the second direction DR2.

Because the bank BNK including the second opening OP2 is not disposed between the first pixel PXL1 and the second pixel PXL2, ink including a plurality of light emitting elements LD may be supplied (or discharged) to the entirety of the emission area EMA of the first pixel group PGR1 through the nozzle of the inkjet printing device at the step of aligning the light emitting elements LD. In other word, in the first pixel group PGR1, ink including a plurality of light emitting elements LD may be entirely supplied (or discharged) to the first pixel area PXA1, the second pixel area PXA2, and even an area between the first pixel area PXA1 and the second pixel area PXA2 Because the bank BNK including the second opening OP2 is not disposed between the first pixel PXL1 and the second pixel PXL2, an ink supply surface area (or an ink discharge surface area) of each of the first pixel PXL1 and the second pixel PXL2 may be further increased. Consequently, the amount of ink that is supplied (or discharged) to each of the first pixel PXL1 and the second pixel PXL2 is increased, so that the number of light emitting elements LD aligned in each of the first and second pixels PXL1 and PXL2 may be increased, whereby the number of valid light sources of each pixel PXL may be further increased. Therefore, the light output efficiency of each pixel PXL may be enhanced.

Hereinafter, a stacked structure of the first and second pixels PXL1 and PXL2 of the first pixel group PGR1 will be mainly described with reference to FIGS. 14A to 14C.

Figure 14A:
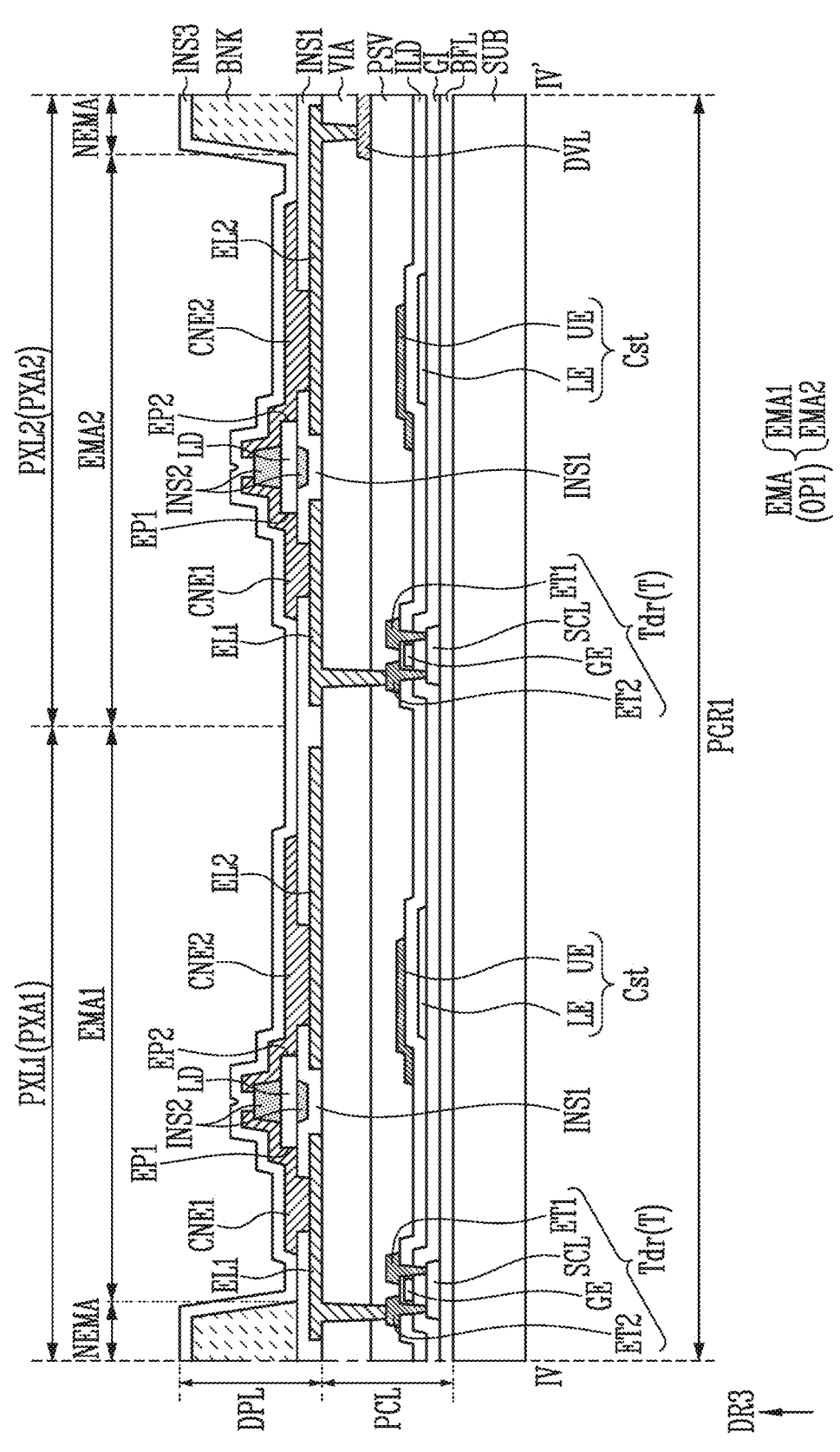
FIGS. 14A to 14C are cross-sectional views taken along the line IV-IV' of FIG. 13.
Figure 14B:
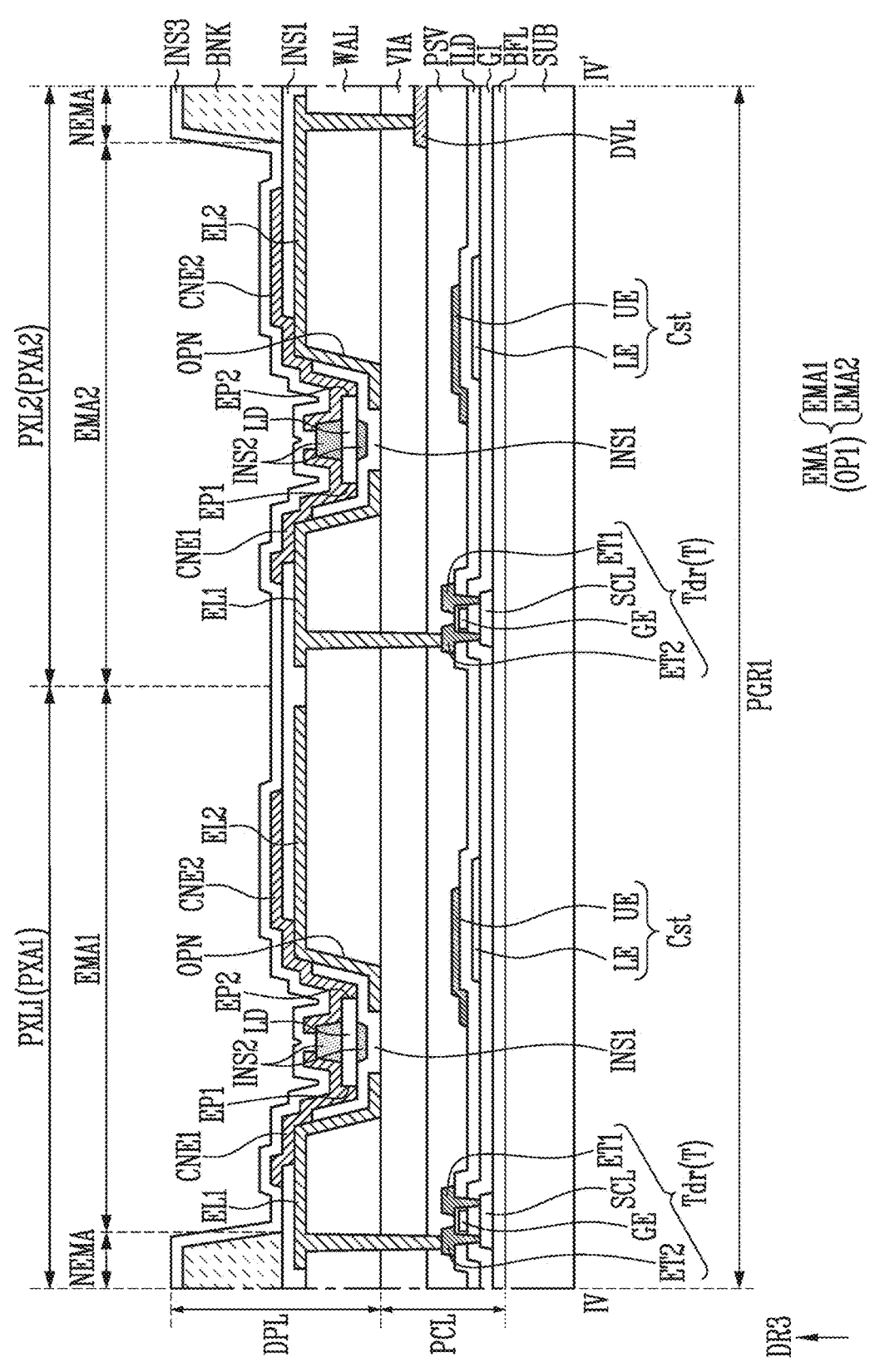
Figure 14C:
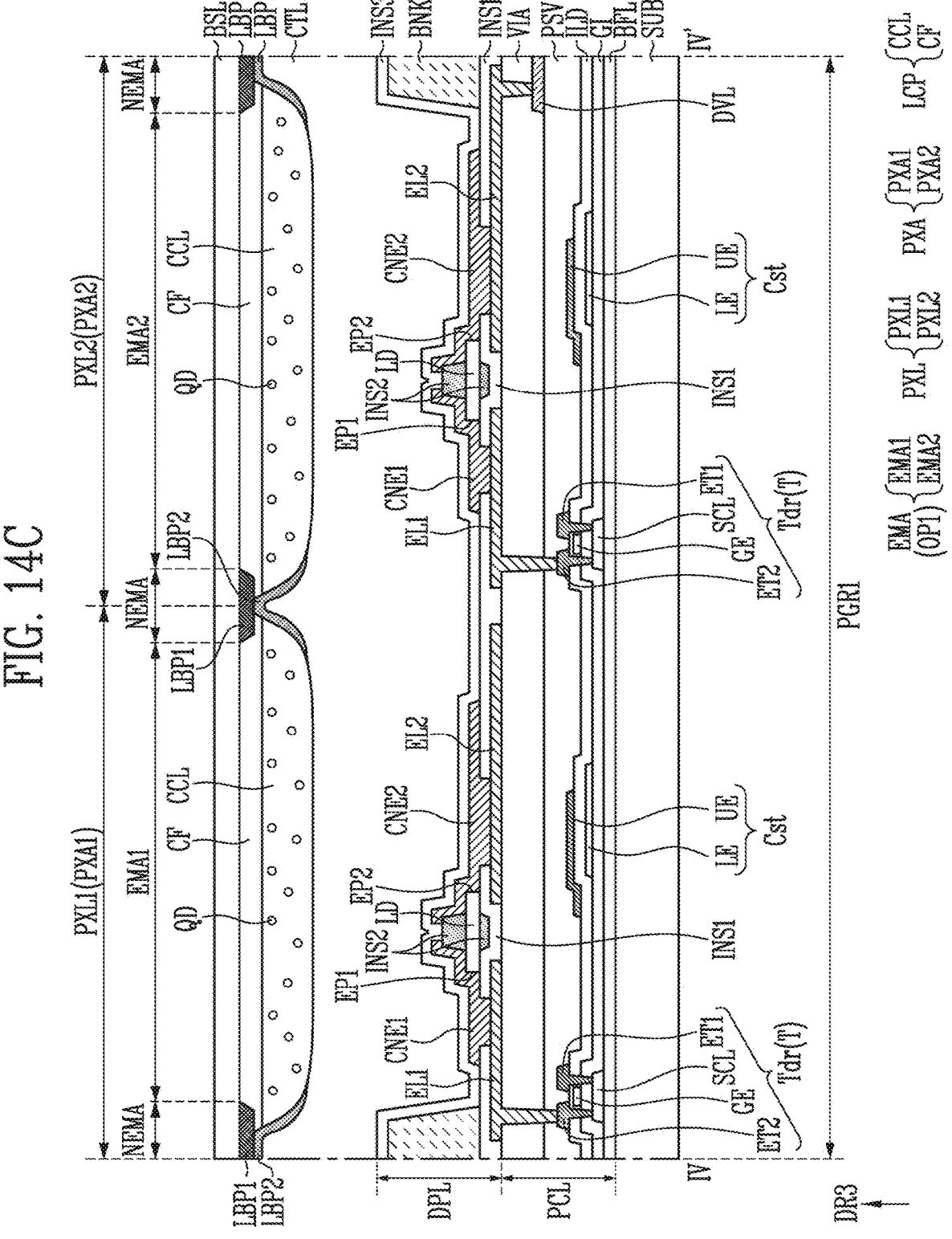

FIGS. 14A to 14C are cross-sectional views taken along the line IV-IV' of FIG. 13.

The description with reference to FIGS. 14A to 14C will be focused on differences from the above-mentioned embodiments so as to avoid redundant description.

Referring to FIGS. 12A to 14C, each of the first and second pixels PXL1 and PXL2 included in one first pixel group PGR1 of the first pixel column C1 may include a substrate SUB, a pixel circuit layer PCL, and a display element layer DPL.

The pixel circuit layer PCL of each of the first and second pixels PXL1 and PXL2 may include a buffer layer BFL, at least one transistor T, at least one storage capacity Cst, and a via layer VIA. The pixel circuit layer PCL may be the pixel circuit layer PCL described with reference to FIGS. 6 and 7. Here, the at least one transistor T may include a gate electrode GE and a semiconductor pattern SCL that partially overlap the gate electrode in the third direction DR3. The semiconductor pattern SCL may include a source area, an active area, and a drain area.

The display element layer DPL of each of the first and second pixels PXL1 and PXL2 may be disposed on the pixel circuit layer PCL of the corresponding pixel PXL. For example, the display element layer DPL of the first pixel PXL1 may be disposed on the pixel circuit layer PCL of the first pixel PXL1. The display element layer DPL of the second pixel PXL2 may be disposed on the pixel circuit layer PCL of the second pixel PXL2.

The display element layer DPL of each of the first and second pixels PXL1 and PXL2 may include a bank BNK, first and second electrodes EL1 and EL2, light emitting elements LD, first and second connection electrodes CNE1 and CNE2, and first and third insulating layers INS1 to INS3. The display element layer DPL may be the display element layer DPL described with reference to FIGS. 6 and 7.

In one or more embodiments, the display element layer DPL of each of the first and second pixels PXL1 and PXL2 may include a wall WAL (or a partition wall), as illustrated in FIG. 14B. The wall WAL may be disposed on each of the pixel circuit layer PCL of the corresponding pixel PXL and the pixel circuit layer PXL between the first pixel PXL1 and the second pixel PXL2. For example, the wall WAL may be disposed on the via layer VIA of the corresponding pixel PXL. The wall WAL may include an inorganic insulating layer formed of inorganic material or an organic insulating layer formed of organic material. In one or more embodiments, the wall WAL may include an organic insulating layer having a single-layer structure and/or an inorganic insulating layer having a single-layer structure, but the present disclosure is not limited thereto. In one or more embodiments, the wall WAL may be provided in a multi-layer structure formed by stacking at least one organic insulating layer and at least one inorganic insulating layer. However, the material of the wall WAL is not limited to the above-mentioned embodiments. In one or more embodiments, the wall WAL may include conductive material for reflecting light emitted from the light emitting elements LD in the image display direction (e.g., the third direction DR3) of the display device.

The wall WAL may include an opening OPN that exposes a portion of the via layer VIA. The opening OPN may be formed by removing a portion of the wall WAL that does not overlap a component, e.g., the transistor T, included in the pixel circuit layer PCL of the corresponding pixel PXL, but the present disclosure is not limited thereto. As described above, in case that the display element layer DPL of each of the first and second pixels PXL1 and PXL2 includes the wall WAL, the light emitting elements LD may be provided in space formed by patterning the wall WAL. In other words, the light emitting elements LD in the corresponding pixel PXL may be provided on the via layer VIA corresponding to the opening OPN of the wall WAL. The wall WAL may be a support component that supports each of the first and second electrodes EL1 and EL2 so as to change a surface profile of each of the first and second electrodes EL1 and EL2 so that light emitted from the light emitting elements LD may be more reliably travel in the image display direction of the display device. In a sectional view, opposite sidewalls of the wall WAL with the opening OPN interposed therebetween may have a diagonal shape having a suitable inclination (e.g., a set or predetermined inclination), but the present disclosure is not limited thereto. In one or more embodiments, the opposite sidewalls of the wall WAL with the opening OPN interposed therebetween may have a curved shape having a suitable curvature (e.g., a set or predetermined curvature). In a sectional view, the shape of the opposite sidewalls of the wall WAL with the opening OPN interposed therebetween is not limited to the foregoing embodiments, and may be changed in various ways within a range in which the efficiency of light emitted from each of the light emitting elements LD may be enhanced.

As illustrated in FIG. 14C, an upper substrate may be further disposed on the display element layer DPL of each of the first and second pixels PXL1 and PXL2.

The upper substrate may be provided on the display element layer DPL to cover the display area (refer to "DA" of FIG. 3) in which the first and second pixels PXL1 and PXL2 are disposed. The upper substrate may be formed of an encapsulation substrate (or a thin-film encapsulation layer) and/or a window component of the display device. An intermediate layer CTL may be provided between the upper substrate and the display element layer DPL.

The intermediate layer CTL may be a transparent adhesive layer (or a transparent bonding layer), e.g., an optically clear adhesive layer, for enhancing the adhesive force between the display element layer DPL and the upper substrate, but the present disclosure is not limited thereto. In one or more embodiments, the intermediate layer CTL may be a refractive index conversion layer configured to change the refractive index of light emitted from the light emitting elements LD toward the upper substrate and enhance the emission luminance of each pixel PXL.

The upper substrate may include a base layer BSL and a light conversion pattern layer LCP.

The base layer BSL may be a rigid or flexible substrate, and the material or properties thereof are not particularly limited. The base layer BSL may be formed of the same material as that of the substrate SUB, or may be formed of material different from that of the substrate SUB.

The light conversion pattern layer LCP may be disposed on one surface of the base layer BSL to face (or oppose) the pixels PXL of the substrate SUB. The light conversion pattern layer LCP may include a color conversion layer CCL and a color filter CF.

The color conversion layer CCL may include color conversion particles QD corresponding to a specific color. The color filter CF may allow light having the specific color to selectively pass therethrough.

The color conversion layer CCL of each of the first and second pixels PXL1 and PXL2 may be disposed on one surface of the base layer BSL to face (or oppose) the corresponding pixel PXL, and include color conversion particles QD that convert a first color of light emitted from the light emitting elements LD disposed in the corresponding pixel PXL to a second color of light. For example, in case that each of the first and second pixels PXL1 and PXL2 is a red pixel (or a red sub-pixel), the color conversion layer CCL may include color conversion particles QD formed of red quantum dots that convert a first color of light emitted from the light emitting elements LD to a second color of light, e.g., red light. For instance, in case that each of the first and second pixels PXL1 and PXL2 is a green pixel (or a green sub-pixel), the color conversion layer CCL of the corresponding pixel PXL may include color conversion particles QD formed of green quantum dots that convert a first color of light emitted from the light emitting elements LD to a second color of light, e.g., green light. For example, in case that each of the first and second pixels PXL1 and PXL2 is a blue pixel (or a blue sub-pixel), the color conversion layer CCL of the corresponding pixel PXL may include color conversion particles QD formed of blue quantum dots that convert a first color of light emitted from the light emitting elements LD to a second color of light, e.g., blue light. In one or more embodiments, in case that each of the first and second pixels PXL1 and PXL2 is a blue pixel (or a blue sub-pixel), there may be provided a light scattering layer having light scattering particles, in place of the color conversion layer CCL having the color conversion particles QD. For example, in case that the light emitting elements LD emit blue-based light, each of the first and second pixels PXL1 and PXL2 may include a light scattering layer including light scattering particles. The light scattering layer may be omitted depending on embodiments. In one or more embodiments, in case that each of the first and second pixels PXL1 and PXL2 is a blue pixel (or a blue sub-pixel), a transparent polymer may be provided in place of the color conversion layer CCL.

In case that each of the first and second pixels PXL1 and PXL2 of the first pixel column C1 is a red pixel (or a red sub-pixel), each of the first and second pixels PXL1 and PXL2 of the second pixel column C2 that is disposed adjacent to the first and second pixels PXL1 and PXL2 of the first pixel column C1 with respect to the first direction DR1 may be a green pixel (or a green sub-pixel), and each of the first and second pixels PXL1 and PXL2 of the third pixel column C3 that is disposed adjacent to the first and second pixels PXL1 and PXL2 of the second pixel column C2 with respect to the first direction DR1 may be a blue pixel (or a blue sub-pixel). In this case, the color conversion layer CCL including color conversion particles QD formed of red quantum dots for emitting red light may be disposed on one surface of the base layer BSL to face (or oppose) the first and second pixels PXL1 and PXL2 included in the first pixel column C1. The color conversion layer CCL including color conversion particles QD formed of green quantum dots for emitting green light may be disposed on one surface of the base layer BSL to face (or oppose) the first and second pixels PXL1 and PXL2 included in the second pixel column C2. The light scattering layer including light scattering particles for diffusing and/or scattering blue light, or the color conversion layer CCL including color conversion particles QD formed of blue quantum dots for emitting blue light may be disposed on one surface of the base layer BSL to face (or oppose) the first and second pixels PXL1 and PXL2 included in the third pixel column C3.

The color filter CF may allow a specific color of light to selectively pass therethrough. The color filter CF along with the color conversion layer CCL may form the light conversion pattern layer LCP, and include color filter material that allows a specific color of light converted by the color conversion layer CCL to selectively pass therethrough. The color filter CF may include a red color filter, a green color filter, and a blue color filter. The color filter CF may be provided in the pixel area PXA of the corresponding pixel PXL to correspond to the color conversion layer CCL.

The light conversion pattern layer LCP including the color conversion layer CCL and the color filter CF may correspond to the emission area of the pixel PXL. For example, the light conversion pattern layer LCP disposed on one surface of the base layer BSL to face (or oppose) the first pixel PXL1 may correspond to the first emission area EMA1 of the first pixel PXL1. The light conversion pattern layer LCP disposed on one surface of the base layer BSL to face (or oppose) the second pixel PXL2 may correspond to the second emission area EMA2 of the second pixel PXL2.

A first light block pattern LBP1 may be disposed between the color filter CF corresponding to the first pixel PXL1 and the color filter CF corresponding to the second pixel PXL2. In other words, the first light block pattern LBP1 may be disposed between the color filter CF corresponding to one pixel PXL and the color filter CF corresponding to a pixel PXL adjacent to the one pixel PXL. The first light block pattern LBP1 may be provided on one surface of the base layer BSL to overlap the bank BNK provided in the pixel area PXA of the corresponding pixel PXL. Furthermore, the first light block pattern LBP1 may be provided on one surface of the base layer BSL to correspond to an area between the first emission area EMA1 of the first pixel PXL1 and the second emission area EMA2 of the second pixel PXL2 in the emission area EMA of the first pixel group PGR1 (or the first opening OP1 of the bank BNK).

In one or more embodiments, the first light block pattern LBP1 may be provided in the form of a multi-layer structure formed by overlapping at least two color filters allowing different colors of light to selectively pass therethrough, among a red color filter, a green color filter, and a blue color filter. For example, the first light block pattern LBP1 may be provided in the form of a structure including a red color filter, a green color filter disposed on the red color filter and overlapping the red color filter, and a blue color filter disposed on the green color filter and overlapping the green color filter. In other words, the first light block pattern LBP1 may be provided in the form of a structure formed by successively stacking the red color filter, the green color filter, and the blue color filter. In this case, in the non-emission area NEMA of the pixel area PXA of the corresponding pixel PXL, the red color filter, the green color filter, and the blue color filter may be used as the first light block pattern LBP1 for blocking transmission of light.

In one or more embodiments, a second light block pattern LBP2 may be disposed on the first light block pattern LBP1. The first light block pattern LBP1 and the second light block pattern LBP2 may include the same material. The first light block pattern LBP1 and the second light block pattern LBP2 each may be formed of a black matrix.

Although in the foregoing embodiment there has been described that the upper substrate including the base layer BSL and the light conversion pattern layer LCP is provided over each of the first and second pixels PXL1 and PXL2, the present disclosure is not limited thereto. In one or more embodiments, the light conversion pattern layer LCP may be formed on one surface of the substrate SUB on which the first and second pixels PXL1 and PXL2 are provided. Furthermore, in one or more embodiments, some components (or remaining components) of the light conversion pattern layer LCP may be formed on one surface of the substrate SUB on which the first and second pixels PXL1 and PXL2 are provided. Other components (or remaining components) of the light conversion pattern layer LCP may be provided to face (or oppose) the some components with the intermediate layer CTL interposed therebetween. Detailed descriptions pertaining thereto will be made with reference to FIGS. 14D and 14E.

Figure 14D:
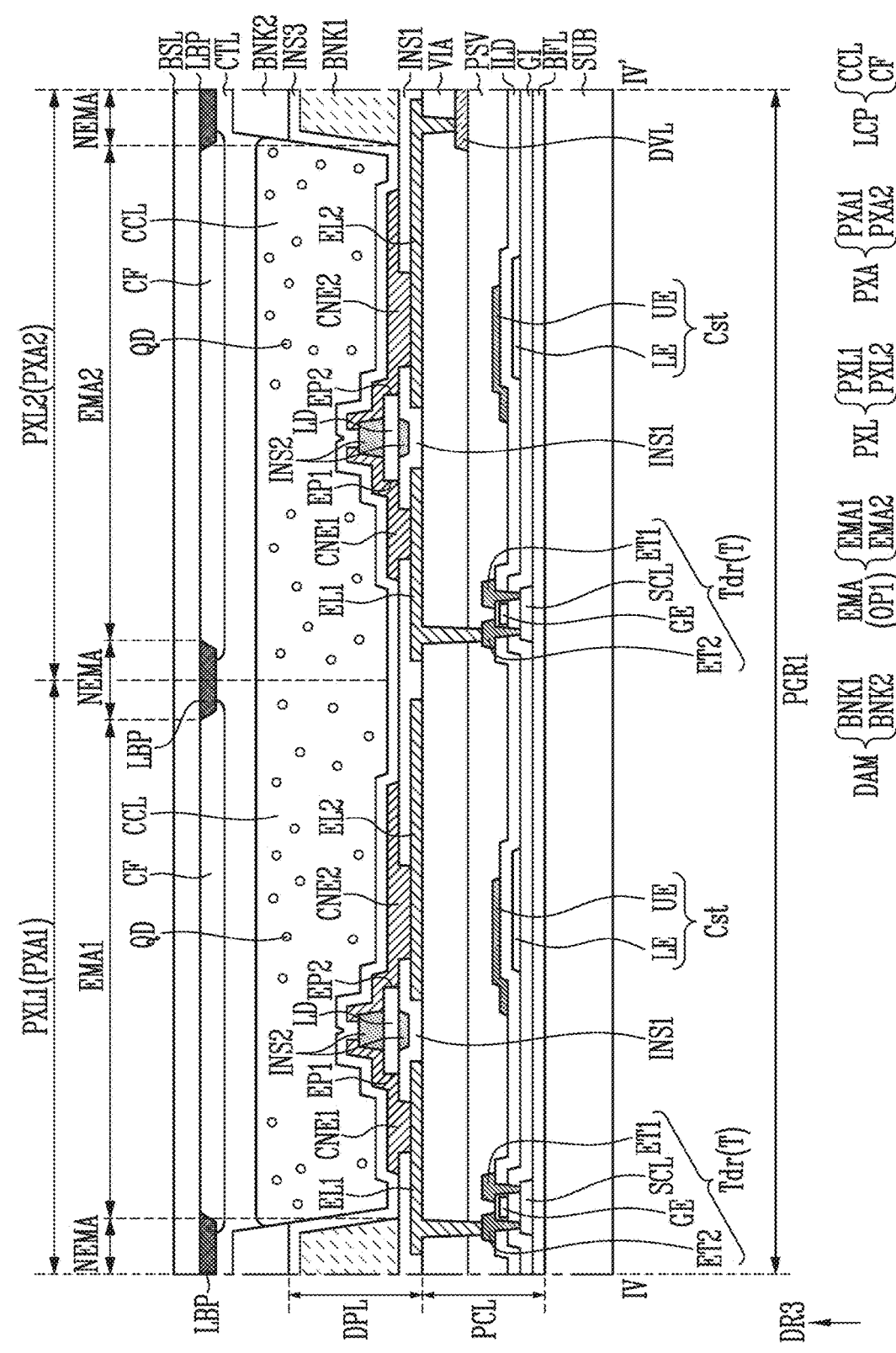
FIGS. 14D and 14E are cross-sectional views schematically illustrating a first pixel group, and are cross-sectional views corresponding to the line IV-IV' of FIG. 13.
Figure 14E:
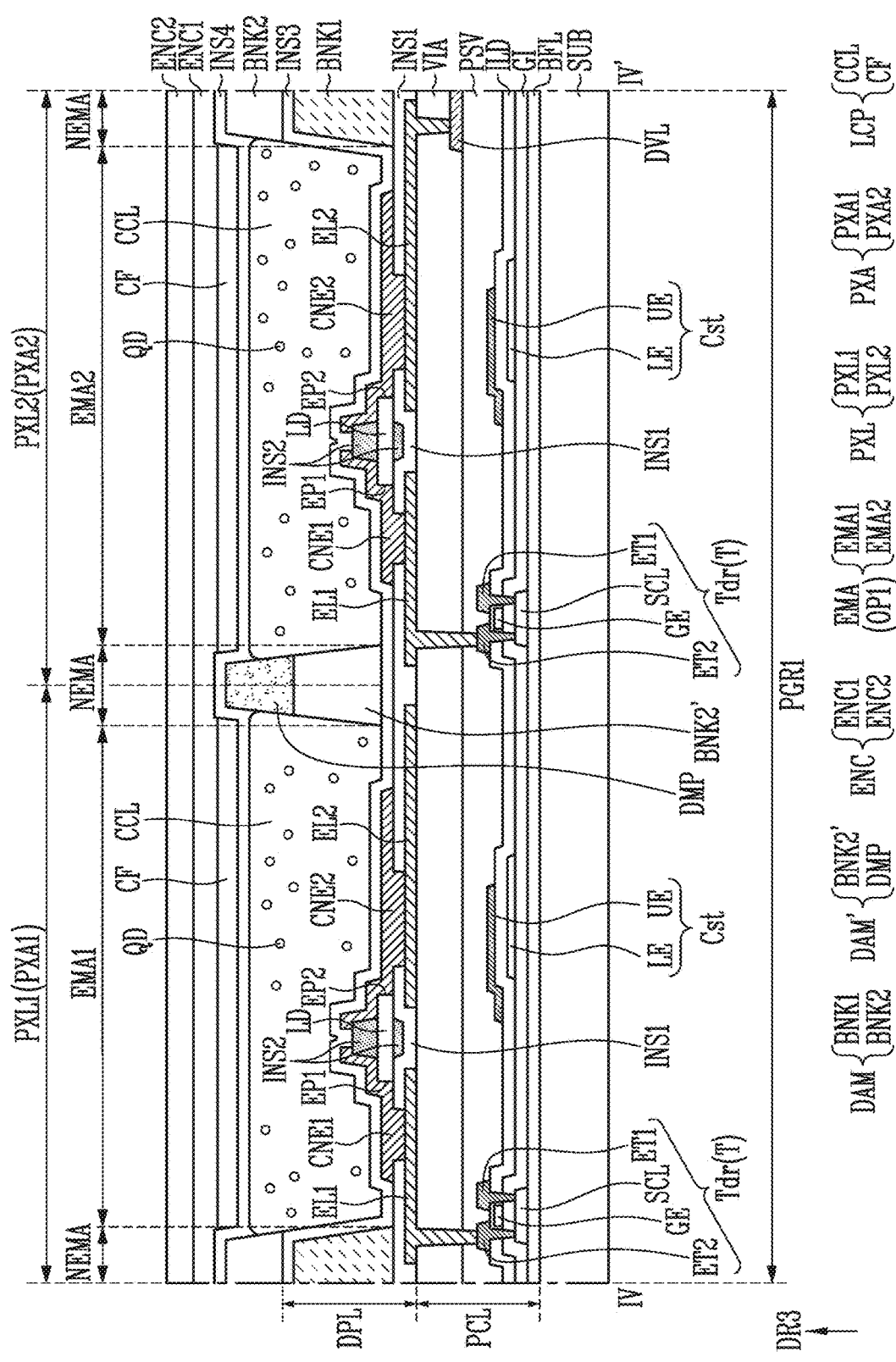

FIGS. 14D and 14E are cross-sectional views schematically illustrating the first pixel group PGR1, and are sectional views corresponding to the line IV-IV' of FIG. 13.

The first pixel group PGR1 illustrated in FIG. 14D, other than the fact that the color conversion layer CCL is disposed on one surface of the substrate SUB and the color filter CF is disposed on one surface of the base layer BSL, may have configuration and structure substantially similar to those of the first pixel group PGR1 illustrated in FIG. 14C.

The first pixel group PGR1 illustrated in FIG. 14E, other than the fact that the light conversion pattern layer LCP is disposed on one surface of the substrate SUB, may have configuration and structure substantially similar to those of the first pixel group PGR1 illustrated in FIG. 14D.

Therefore, to avoid redundant explanation, the description of FIGS. 14D and 14E will be focused on differences from that of the foregoing embodiments.

Referring to FIGS. 13 and 14D, a second bank BNK2 may be disposed on a first bank BNK1 of each of the first and second pixels PXL1 and PXL2. Here, the first bank BNK1 may have the same configuration as that of the bank BNK described with reference to FIGS. 6 and 7; therefore, detailed explanation thereof will be omitted.

The second bank BNK2 may be disposed on the first bank BNK1 of the corresponding pixel PXL and embody, along with the first bank BNK1, a dam DAM. An area enclosed by the dam DAM may correspond to the emission area EMA in which light is emitted from the first pixel group PGR1. The dam DAM may be a structure that ultimately defines the emission area EMA of the first pixel group PGR1. In one or more embodiments, during a process of supplying a color conversion layer CCL including color conversion particles QD to the first pixel group PGR1, the dam DAM may be a structure that ultimately defines the emission area EMA to which the color conversion layer CCL is to be supplied. For example, because the emission area EMA of the first pixel group PGR1 is ultimately defined by the dam DAM, the color conversion layer CCL including a target amount and/or type of light conversion particles QD may be supplied (or input) to the emission area EMA.

The second bank BNK2 may include light block material for preventing a light leakage defect in which light (or rays) leak between the first pixel group PGR1 and a pixel group adjacent thereto. For example, the second bank BNK2 may be a black matrix. In one or more embodiments, the second bank BNK2 may include at least one light block material and/or reflective material, and allow light emitted from the light emitting elements LD provided in the first pixel group PGR1 to more reliably travel in the image display direction (or the third direction DR3) of the display device, thus enhancing the light output efficiency of the light emitting elements LD.

The color conversion layer CCL may be provided and/or formed on the substrate SUB on which the corresponding pixel PXL is provided, so as to cover the light emitting elements LD disposed on each of the first and second pixels PXL1 and PXL2 included in the first pixel group PGR1. The color conversion layer CCL may be supplied to the emission area EMA of the first pixel group PGR1 defined by the dam DAM and convert light emitted from the light emitting elements LD to a desired color light (e.g., a predetermined color light). The foregoing color conversion layer CCL may be the color conversion layer CCL described with reference to FIG. 14C. The color conversion layer CCL may be provided on the overall surface of the emission area EMA of the first pixel group PGR1, but the present disclosure is not limited thereto. In one or more embodiments, the color conversion layer CCL may not be provided in an area between the first pixel PXL1 and the second pixel PXL2 in the first pixel group PGR1. Detailed description pertaining thereto will be made with reference to FIG. 14E.

An intermediate layer CTL may be disposed on the color conversion layer CCL and the second bank BNK2. The intermediate layer CTL may be at least one insulating layer, but the present disclosure is not limited thereto. In one or more embodiments, the intermediate layer CTL may be the intermediate layer CTL described with reference to FIG. 14C.

A base layer BSL including a color filter CF and a light block pattern LBP may be provided and/or formed on the intermediate layer CTL.

The color filter CF and the light block pattern LBP may be disposed on one surface of the base layer BSL and face (or oppose) the color conversion layer CCL and the second bank BNK2 with the intermediate layer CTL interposed therebetween. The color filter CF may correspond to the color conversion layer CCL. The light block pattern LBP may correspond to the second bank BNK2. The foregoing color filter CF may be the color filter CF described with reference to FIG. 14C. The foregoing light block pattern LBP may be the first light block pattern LBP1 described with reference to FIG. 14C.

The color filter CF disposed over the first pixel PXL1 may face (or oppose) the color conversion layer CCL disposed on the third insulating layer INS3 of the first pixel PXL1, with the intermediate layer CTL interposed therebetween. The color filter CF disposed over the second pixel PXL2 may face (or oppose) the color conversion layer CCL disposed on the third insulating layer INS3 of the second pixel PXL2, with the intermediate layer CTL interposed therebetween.

The color conversion layer CCL and the color filter CF that form the light conversion pattern layer LCP may be disposed on different substrates (or boards). In one or more embodiments, the color conversion layer CCL may be disposed on the substrate SUB (for example, a lower substrate) on which the first and second pixels PXL1 and PXL2 are disposed. The color filter CF may be disposed on the base layer BSL (e.g., an upper substrate).

Referring to FIGS. 13 and 14E, the second bank BNK2 may be disposed on the first bank BNK1 of each of the first and second pixels PXL1 and PXL2. Furthermore, an intermediate second-bank BNK2' may be disposed on the third insulating layer INS3 between the first pixel PXL1 and the second pixel PXL2. The second bank BNK2 and the intermediate second-bank BNK2' (hereinafter, referred to as "intermediate bank") may have the same configuration as that of the second bank BNK2 described with reference to FIG. 14D; therefore, detailed explanation thereof will be omitted.

A dummy pattern DMP may be provided and/or formed on the intermediate bank BNK2'. The dummy pattern DMP may include insulating material, but the present disclosure is not limited thereto. In one or more embodiments, the dummy pattern DMP may include light block material. The dummy pattern DMP may be disposed on the intermediate bank BNK2' and embody, along with the intermediate bank BNK2', a dam DAM'. Due to the dam DAM' disposed between the first pixel PXL1 and the second pixel PXL2 in the first pixel group PGR1, the first emission area EMA1 of the first pixel PXL1 and the second emission area EMA2 of the second pixel PXL2 may be ultimately defined. For example, the first emission area EMA1 of the first pixel PXL1 and the second emission area EMA2 of the second pixel PXL2 are ultimately defined by the dam DAM' (hereinafter, referred to as 'intermediate dam') disposed between the first pixel PXL1 and the second pixel PXL2 and the dam DAM (embodied by the first bank BNK1 and the second bank BNK2) disposed in a peripheral area (or a non-emission area NEMA) of each of the first and second pixels PXL1 and PXL2, so that the color conversion layer CCL including a target amount and/or type of color conversion particles QD may be supplied (or input) to each of the first and second emission areas EMA1 and EMA2.

The color conversion layer CCL may be disposed on the third insulating layer INS3 of each of the first and second pixels PXL1 and PXL2. For example, the color conversion layer CCL may be provided on the third insulating layer INS3 of the first pixel PXL1 in such a way that the color conversion layer CCL is charged into space enclosed by the dam DAM disposed in the non-emission area NEMA of the first pixel PXL1 and the intermediate dam DAM' disposed in the area between the first pixel PXL1 and the second pixel PXL2. Furthermore, the color conversion layer CCL may be provided on the third insulating layer INS3 of the second pixel PXL2 in such a way that the color conversion layer CCL is charged into space enclosed by the dam DAM disposed in the non-emission area NEMA of the second pixel PXL2 and the intermediate dam DAM' disposed in the area between the first pixel PXL1 and the second pixel PXL2. The foregoing color conversion layers CCL may include color conversion particles QD configured to convert light emitted from the light emitting elements LD provided in the corresponding pixel PXL to the same color of light. In other words, the color conversion layer CCL disposed on the third insulating layer INS3 of the first pixel PXL1 and the color conversion layer CCL disposed on the third insulating layer INS3 of the second pixel PXL2 may ultimately emit the same color of light in the image display direction (e.g., the third direction DR3) of the display device.

A fourth insulating layer INS4 may be provided and/or formed on the overall surfaces of the color conversion layers CCL, the dam DAM, the intermediate dam DAM'.

The fourth insulating layer INS4 may be a protective layer formed to cover components, e.g., the color conversion layers CCL, the dam DAM, and the intermediate dam DAM', disposed thereunder. The fourth insulating layer INS4 may be an inorganic insulating layer including inorganic material or an organic insulating layer including organic material, but the material of the fourth insulating layer INS4 is not limited to the foregoing examples. In one or more embodiments, the fourth insulating layer INS4 may be omitted.

A color filter CF may be disposed over each of the color conversion layer CCL of the first pixel PXL1 and the color conversion layer CCL of the second pixel PXL2. For example, the color filter CF may be disposed on the fourth insulating layer INS4 on the color conversion layer CCL of the first pixel PXL1. The color filter CF may be disposed on the fourth insulating layer INS4 on the color conversion layer CCL of the second pixel PXL2. The color filter CF of the first pixel PXL1 and the color filter CF of the second pixel PXL2 may include color filter material that allows a specific color of light converted by the color conversion layer CCL of the corresponding pixel PXL to selectively pass therethrough. For example, the color filter CF of the first pixel PXL1 and the color filter CF of the second pixel PXL2 each may be a red color filter configured to allow red light to selectively pass therethrough. The foregoing color filters CF may be provided in the emission area EMA of the corresponding pixel PXL to correspond to the color conversion layer CCL in the corresponding pixel PXL. For example, the color filter CF in the first pixel PXL1 may be provided in the first emission area EMA1 to correspond to the color conversion layer CCL of the first pixel PXL1. The color filter CF in the second pixel PXL2 may be provided in the second emission area EMA2 to correspond to the color conversion layer CCL of the second pixel PXL2.

An encapsulation layer ENC may be provided and/or formed on the overall surfaces of the color filters CF. The encapsulation layer ENC may have a single-layer structure or a multi-layer structure including double layers. In detail, the encapsulation layer ENC may have, to cover the color filters CF, a single layer structure including at least one organic layer or a at least one inorganic layer, or a double-layer structure formed by stacking at least one organic layer and at least one inorganic layer.

In one or more embodiments, the encapsulation layer ENC may include a first encapsulation layer ENC1 and a second encapsulation layer ENC2.

The first encapsulation layer ENC1 may be formed on the overall surfaces of the color filters CF and the fourth insulating layer INS4. The first encapsulation layer ENC1 may be a planarization layer for mitigating a stepped difference formed by the components disposed thereunder. In one or more embodiments, the first encapsulation layer ENC1 may be formed of an organic layer including organic material.

The second encapsulation layer ENC2 may be formed on the overall surface of the first encapsulation layer ENC1. The second encapsulation layer ENC2 may cover the first encapsulation layer ENC1 to cover components, e.g., the light conversion pattern layer LCP, disposed thereunder, so that the light conversion pattern layer LCP can be protected from external oxygen, moisture, etc. In one or more embodiments, the second encapsulation layer ENC2 may be formed of an inorganic layer including inorganic material.

The color conversion layer CCL and the color filter CF that form the light conversion pattern layer LCP may be disposed on an identical substrate. In one or more embodiments, the light conversion pattern layer LCP may be disposed on the substrate SUB on which the first and second pixels PXL1 and PXL2 are disposed. In other words, the light conversion pattern layer LCP may be disposed on the same substrate SUB as that of the first and second pixels PXL1 and PXL2.

Figure 15A:
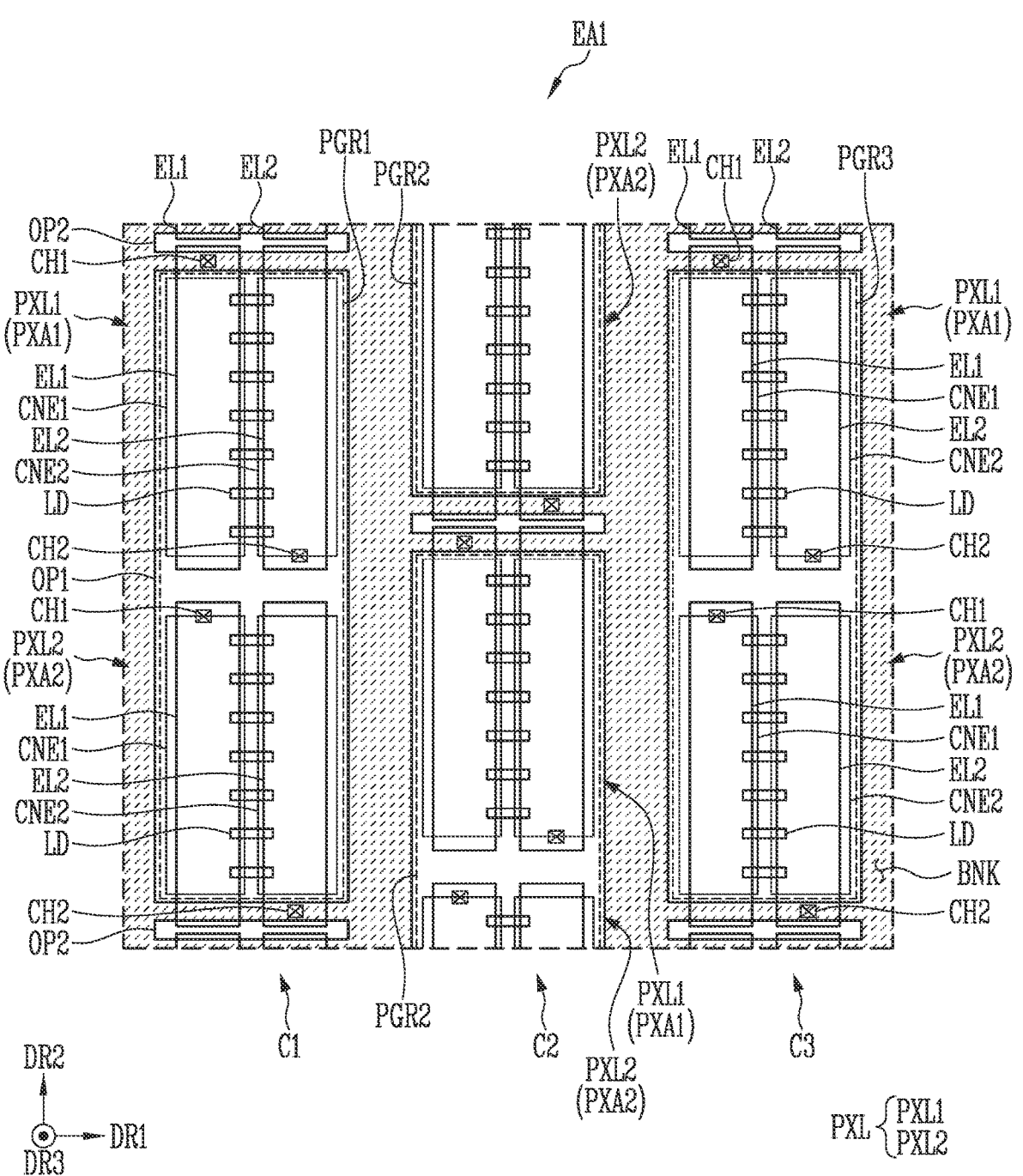
FIG. 15A illustrates one or more embodiments of the first to third pixel groups of FIG. 12A, and a schematic enlarged plan view corresponding to the portion EA1 of FIG. 3.
Figure 15B:
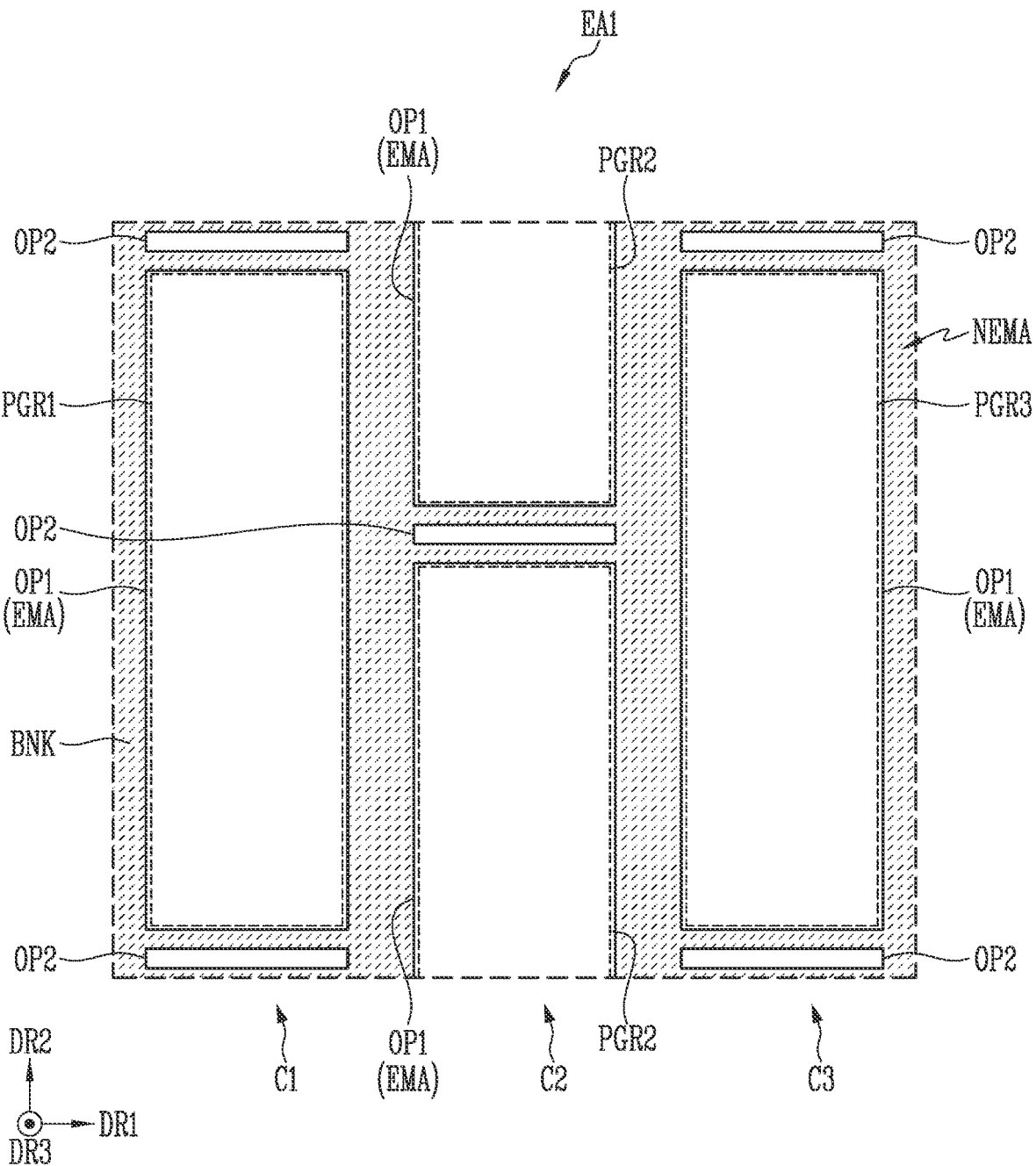
FIG. 15B is an enlarged plan view schematically illustrating only a bank in the portion EA1 illustrated in FIG. 15A.

FIG. 15A illustrates one or more embodiments of the first to third pixel groups PGR1, PGR2, and PGR3 of FIG. 12A, and a schematic enlarged plan view corresponding to portion EA1 of FIG. 3. FIG. 15B is an enlarged plan view schematically illustrating only the bank BNK in portion EA1 illustrated in FIG. 15A.

The description with reference to FIGS. 15A and 15B will be focused on differences from the above-mentioned embodiments so as to avoid redundant description.

In FIGS. 15A and 15B, the first to third directions DR1, DR2, and DR3 may refer to the directions indicated by the first to third directions DR1, DR2, and DR3, respectively.

Referring to FIGS. 3, 15A, and 15B, in the display area DA of the substrate SUB, a first pixel column C1, a second pixel column C2, and a third pixel column C3 each including a plurality of pixels PXL may be arranged along the first direction DR1. First pixel columns C1, second pixel columns C2, and third pixel columns C3 may be alternately arranged along the first direction DR1. For example, the first pixel columns C1, the second pixel columns C2, and the third pixel columns C3 may be arranged in the display area DA in a sequence of the first pixel column C1, the second pixel column C2, the third pixel column C3, the first pixel column C1, the second pixel column C2, the third pixel column C3, . . . .

At least one first pixel group PGR1 including first and second pixels PXL1 and PXL2 is provided in the first pixel column C1. At least one second pixel group PGR2 including first and second pixels PXL1 and PXL2 is provided in the second pixel column C2. At least one third pixel group PGR3 including first and second pixels PXL1 and PXL2 is provided in the third pixel column C3.

The first pixel group PGR1 may be disposed on a pixel row different from that of the pixel group of the pixel column adjacent thereto in the first direction DR1. For example, the first pixel group PGR1 may be disposed on a pixel row different from that of the second pixel group PGR2 of the second pixel column C2 adjacent thereto in the first direction DR1. In other words, the first pixel PXL1 of the first pixel group PGR1 and the first pixel PXL1 of the second pixel group PGR2 may be disposed on different pixel rows. The second pixel PXL2 of the first pixel group PGR1 and the second pixel PXL2 of the second pixel group PGR2 may be disposed on different pixel rows. In this case, the second opening OP2 of the bank BNK in the first pixel column C1 and the second opening OP2 of the bank BNK in the second pixel column C2 may differ from each other in location.

Furthermore, the second pixel group PGR2 may be disposed on a pixel row different from that of the pixel group of the pixel column adjacent thereto in the first direction DR1. For example, the second pixel group PGR2 may be disposed on a pixel row different from that of the third pixel group PGR3 of the third pixel column C3 adjacent thereto in the first direction DR1. In other words, the first pixel PXL1 of the second pixel group PGR2 and the first pixel PXL1 of the third pixel group PGR3 may be disposed on different pixel rows. The second pixel PXL2 of the second pixel group PGR2 and the second pixel PXL2 of the third pixel group PGR3 may be disposed on different pixel rows. In this case, the second opening OP2 of the bank BNK in the second pixel column C2 and the second opening OP2 of the bank BNK in the third pixel column C3 may differ from each other in location.

In a plan view, the first pixel group PGR1 may be misaligned with the second pixel group PGR2 with respect to the first direction DR1. The second pixel group PGR2 may be misaligned with each of the first and third pixel groups PGR1 and PGR3 with respect to the first direction DR1. The third pixel group PGR3 may be misaligned with the second pixel group PGR2 with respect to the first direction DR1. Furthermore, the first pixel group PGR1 may be misaligned with a third pixel group that is adjacent thereto in the first direction DR1. The third pixel group PGR3 may be misaligned with a first pixel group that is adjacent thereto in the first direction DR1.

The bank BNK including the second opening OP2 may not be disposed between the first pixel PXL1 and the second pixel PXL2 that are included in each of the first to third pixel groups PGR1, PGR2, and PGR3. Hence, at the step of supplying (or inputting) the light emitting elements LD, ink including a plurality of light emitting elements LD may be supplied (or discharged) to the entirety of the emission area EMA of each of the first to third pixel groups PGR1, PGR2, and PGR3 (or to the first opening OP1 of the bank BNK). In other words, in each pixel group, the ink may be entirely supplied (or discharged) to the first pixel area PXA1 to which the first pixel PXL1 is to be provided, the second pixel area PXA2 to which the second pixel PXL2 is to be provided, and even the area between the first pixel area PXA1 and the second pixel area PXA2. Hence, the ink supply surface area (or the ink discharge surface area) of each of the first and second pixels PXL1 and PXL2 in the corresponding pixel group may be further increased.

In addition, because the first pixel group PGR1, the second pixel group PGR2, and the third pixel group PGR3 are misaligned with each other such that each of the first pixel group PGR1, the second pixel group PGR2, and the third pixel group PGR3 is disposed on a pixel row different from that of a pixel group adjacent thereto in the first direction DR1, the position of the nozzle of the inkjet printing device can be more easily controlled at the step of aligning the light emitting elements LD.

Figure 16:
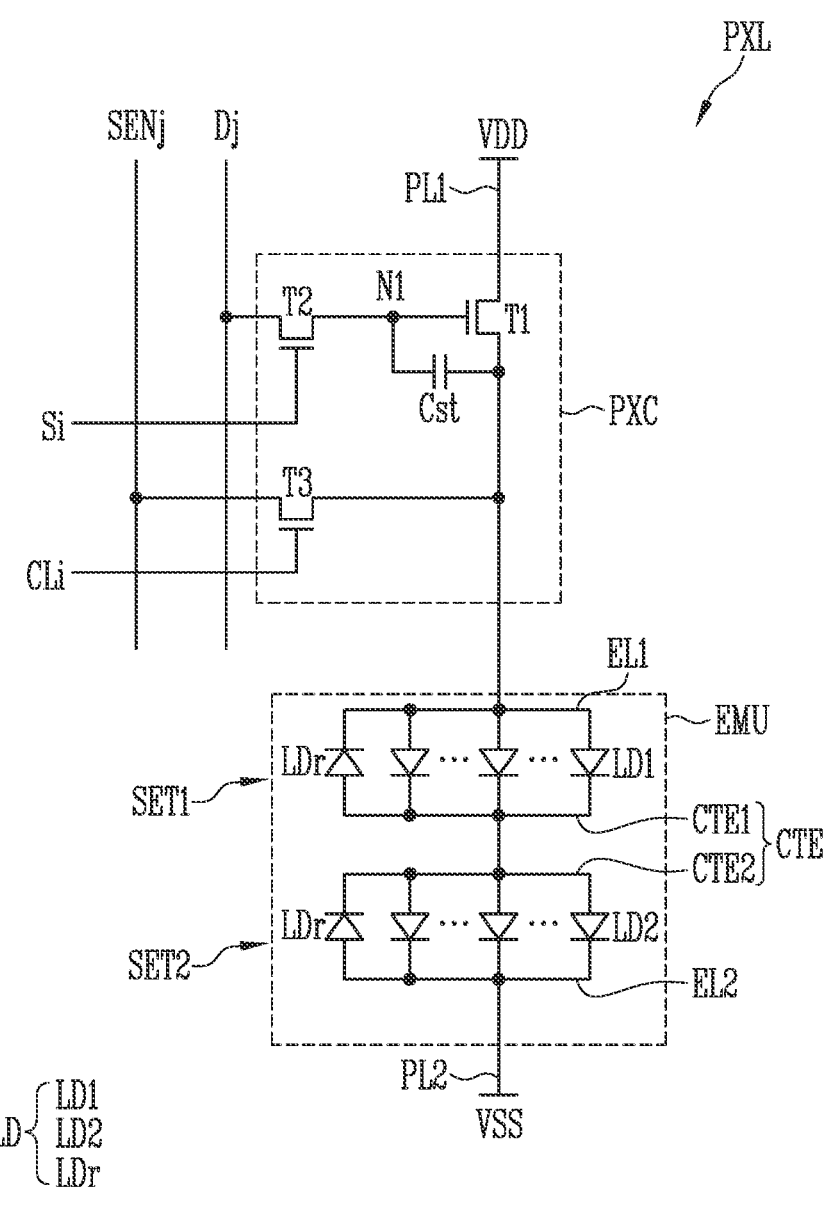
FIG. 16 is a circuit diagram illustrating one or more embodiments of electrical connection relationship of components included in each pixel illustrated in FIG. 3.

FIG. 16 is a circuit diagram illustrating an embodiment of electrical connection relationship of components included in each pixel PXL illustrated in FIG. 3.

Referring to FIGS. 3 and 16, each pixel PXL may include an emission unit EMU and a pixel circuit PXC. The pixel circuit PXC is substantially identical with the pixel circuit PXC described with reference to FIG. 4; therefore, repetitive explanation thereof will be omitted.

The emission unit EMU may include a plurality of light emitting elements LD electrically connected in parallel between a first power line PL1 which is electrically connected to a first driving power supply VDD and to which a voltage of the first driving power supply VDD is applied, and a second power line PL2 which is electrically connected to a second driving power supply VSS and to which a voltage of the second driving power supply VSS is applied.

The emission unit EMU may include at least one serial set including a plurality of light emitting elements LD electrically connected in parallel to each other.

In other words, as illustrated in FIG. 16, the emission unit EMU may have a serial/parallel combination structure.

The emission unit EMU may include first and second serial sets (or stages) SET1 and SET2 that are successively connected between the first and second driving power supplies VDD and VSS. Each of the first and second serial sets SET1 and SET2 may include two electrodes. For example, the first serial set SET1 may include the electrodes EL1 and CTE1, and the second serial state may include the electrodes CTE2 and EL2 that form an electrode pair of the corresponding serial set, and a plurality of light emitting elements LD electrically connected in parallel to each other in the same direction between the two electrodes EL1 and CTE1, CTE2 and EL2.

The first serial set SET1 may include a first electrode EL1, a first intermediate electrode CTE1, and at least one first light emitting element LD1 electrically connected between the first electrode EL1 and the first intermediate electrode CTE1. Furthermore, the first serial set SET1 may include a reverse light emitting element LDr electrically connected between the first electrode EL1 and the first intermediate electrode CTE1 in a direction opposite to that of the first light emitting element LD1.

The second serial set SET2 may include a second intermediate electrode CTE2, a second electrode EL2, and at least one second light emitting element LD2 electrically connected between the second intermediate electrode CTE2 and the second electrode EL2. Furthermore, the second serial set SET2 may include a reverse light emitting element LDr electrically connected between the second intermediate electrode CTE2 and the second electrode EL2 in a direction opposite to that of the second light emitting element LD2.

The first intermediate electrode CTE1 of the first serial set SET1 and the second intermediate electrode CTE2 of the second serial set SET2 may be integrally provided and electrically connected to each other. In other words, the first intermediate electrode CTE1 and the second intermediate electrode CTE2 may form an intermediate electrode CTE that electrically connects the first serial set SET1 and the second serial set SET2 that are successively provided. In the case where the first intermediate electrode CTE1 and the second intermediate electrode CTE2 are integrally provided, the first intermediate electrode CTE1 and the second intermediate electrode CTE2 may be respective different areas of the intermediate electrode CTE.

In the foregoing embodiment, the first electrode EL1 of the first serial set SET1 may be an anode of the emission unit EMU of each pixel PXL. The second electrode EL2 of the second serial set SET2 may be a cathode of the emission unit EMU.

As described above, the emission unit EMU of the pixel PXL including the serial sets SET1 and SET2 (or the light emitting elements LD) electrically connected to each other in the serial/parallel combination structure may easily adjust driving current/voltage conditions in response to specifications of a product to which the emission unit EMU is to be applied.

For example, the emission unit EMU of the pixel PXL including the serial sets SET1 and SET2 (or the light emitting elements LD) electrically connected to each other in the serial/parallel combination structure may reduce driving current, compared to that of the emission unit EMU having a structure such that the light emitting elements LD are electrically connected only in parallel to each other. Furthermore, the emission unit EMU of the pixel PXL including the serial sets SET1 and SET2 electrically connected to each other in the serial/parallel combination structure may reduce driving current to be applied to the opposite ends of the emission unit EMU, compared to that of the emission unit having a structure such that all of the light emitting elements LD, the number of which is the same as that of the emission unit EMU, are electrically connected in series to each other. In addition, the emission unit EMU of the pixel PXL including the serial sets SET1 and SET2 (or the light emitting elements LD) electrically connected to each other in the serial/parallel combination structure may increase the number of light emitting elements LD included between the electrodes EL1 and CTE1, and CTE2 and EL2, compared to that of the emission unit having a structure such that all of the serial sets (or stages) are coupled in series to each other. In this case, the light output efficiency of the light emitting elements LD may be enhanced. Even if a defect is caused in a specific serial set (or stage), the ratio of light emitting elements LD that cannot emit light due to the defect may be reduced, so that a reduction in the light output efficiency of the light emitting elements LD can be mitigated.

Figure 17:
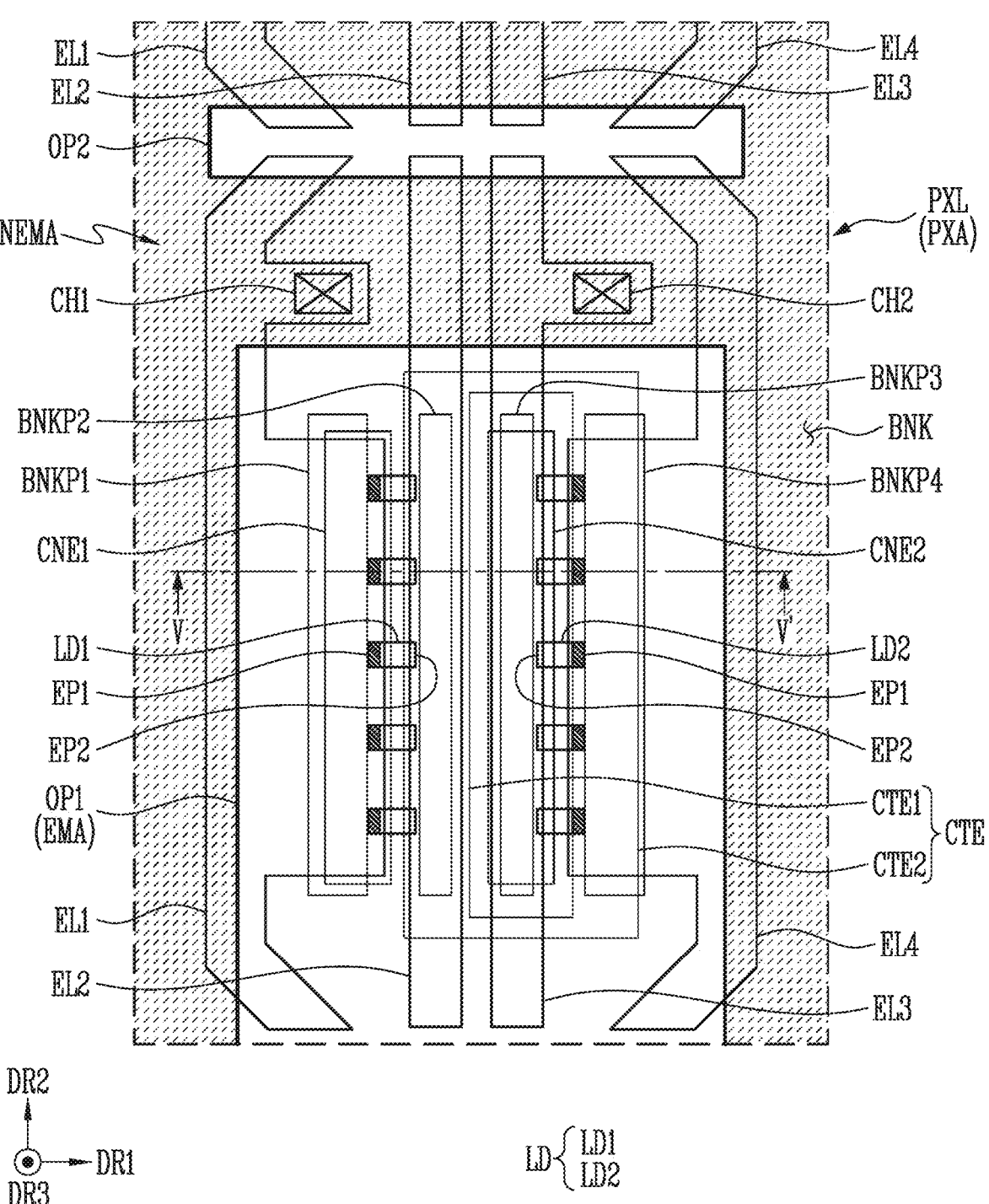
FIG. 17 is a plan view schematically illustrating the pixel of FIG. 16.

FIG. 17 is a plan view schematically illustrating the pixel PXL of FIG. 16.

In FIG. 17, for the sake of explanation, illustration of the transistors T electrically connected to the light emitting elements LD and the signal lines electrically connected to the transistors T are omitted.

In FIG. 17, the first to third directions DR1, DR2, and DR3 may refer to the directions indicated by the first to third directions DR1, DR2, and DR3, respectively.

Referring to FIGS. 16 to 17, each pixel PXL may be provided and/or formed in a pixel area PXA provided on the substrate SUB. The pixel area PXA may include an emission area EMA and a non-emission area NEMA.

In one or more embodiments, each pixel PXL may include a bank BNK disposed in the non-emission area NEMA.

The bank BNK may be a structure for defining (or partitioning) the respective pixel areas PXA or the respective emission area EMA of the corresponding pixel PXL and pixels PXL adjacent thereto and, for example, may be a pixel defining layer.

In one or more embodiments, the bank BNK may be a pixel defining layer or a dam structure for defining each emission area EMA to which the light emitting elements LD are to be supplied, during a process of supplying (or inputting) the light emitting elements LD to each pixel PXL. For example, because the emission area EMA of each pixel PXL is defined by the bank BNK, a mixed solution (e.g., ink) including a target amount and/or type of light emitting elements LD may be supplied (or input) to the emission area EMA. The above-mentioned bank BNK may be a component corresponding to the bank BNK described with reference to FIGS. 5 to 7. Hence, repetitive explanation of the bank BNK will be omitted.

The bank BNK may include at least one opening that exposes components disposed under the bank BNK in the pixel area PXA of the corresponding pixel PXL. For example, the bank BNK may include first and second openings OP1 and OP2 that expose components disposed under the bank BNK in the pixel area PXA of the corresponding pixel PXL. In one or more embodiments, the emission area EMA of each pixel PXL and the first opening OP1 of the bank BNK may correspond to each other.

In the pixel area PXA, the second opening OP2 of the bank BNK may be disposed at a position spaced from the first opening OP1 in the second direction, and disposed adjacent to one side (e.g., an upper side or a lower side) of the pixel area PXA.

Each pixel PXL may include a first electrode EL1, a second electrode EL2, a third electrode EL3, and a fourth electrode EL4 that are spaced from each other in the first direction DR1.

The first to fourth electrodes EL1, EL2, EL3, and EL4 may be separated from other electrodes (e.g., the first to fourth electrodes EL1 to EL4 provided in pixels PXL adjacent thereto in the second direction DR2) in the first opening OP1 and the second opening OP2 after the light emitting elements LD are supplied to and aligned in the pixel area PXA of the corresponding pixel PXL during a process of fabricating the display device. In detail, one end of the first electrode EL1 may be separated, in the second opening OP2, from the first electrode EL1 of the pixel PXL disposed on an upper side of the corresponding pixel PXL in the second direction DR2. A remaining end of the first electrode EL1 may be separated, in the first opening OP1 (or the emission area EMA), from a first electrode of a pixel disposed on a lower side of the corresponding pixel PXL in the second direction DR2. One end of the second electrode EL2 may be separated, in the second opening OP2, from the second electrode EL2 of the pixel PXL disposed on the upper side of the corresponding pixel PXL in the second direction DR2. A remaining end of the second electrode EL2 may be separated, in the first opening OP1 (or the emission area EMA), from a second electrode of the pixel disposed on the lower side of the corresponding pixel PXL in the second direction DR2. One end of the third electrode EL3 may be separated, in the second opening OP2, from the third electrode EL3 of the pixel PXL disposed on the upper side of the corresponding pixel PXL in the second direction DR2. A remaining end of the third electrode EL3 may be separated, in the first opening OP1 (or the emission area EMA), from a third electrode of the pixel disposed on the lower side of the corresponding pixel PXL in the second direction DR2. One end of the fourth electrode EL4 may be separated, in the second opening OP2, from the fourth electrode EL4 of the pixel PXL disposed on the upper side of the corresponding pixel PXL in the second direction DR2. A remaining end of the fourth electrode EL4 may be separated, in the first opening OP1 (or the emission area EMA), from a fourth electrode of the pixel disposed on the lower side of the corresponding pixel PXL in the second direction DR2.

In one or more embodiments, the second opening OP2 of the bank BNK may be provided for a separation process for the first to fourth electrodes EL1 to EL4.

The first electrode EL1 may include a protrusion that protrudes in the first direction DR1 toward the second electrode EL2 in the pixel area PXA of each pixel PXL. The protrusion of the first electrode EL1 may be provided to maintain a constant distance between the first electrode EL1 and the second electrode EL2 in the pixel area PXA of the corresponding pixel PXL. Likewise, the fourth electrode EL4 may include a protrusion that protrudes in the first direction DR1 toward the third electrode EL3 in the pixel area PXA. The protrusion of the fourth electrode EL4 may be provided to maintain a constant distance between the third electrode EL3 and the fourth electrode EL4 in the pixel area PXA.

However, the shape of each of the first electrode EL1, the second electrode EL2, the third electrode EL3, and the fourth electrode EL4 is not limited thereto. In one or more embodiments, the shape and/or mutual arrangement relationship of the first electrode EL1, the second electrode EL2, the third electrode EL3, and the fourth electrode EL4 may be changed in various ways. For example, each of the first electrode EL1 and the fourth electrode EL4 may have a curved shape without including the protrusion. For instance, the third electrode EL3 may extend to pixels PXL adjacent thereto in the second direction DR2.

The first electrode EL1 may be electrically connected with the first transistor T1 described with reference to FIG. 16 through a first contact hole CH1. The third electrode EL3 may be electrically connected with the second driving power supply VSS (or the second power line PL2) described with reference to FIG. 16 through a second contact hole CH2. In one or more embodiments, the first electrode EL1 may be the first electrode EL1 described with reference to FIG. 16. The third electrode EL3 may be the second electrode EL2 described with reference to FIG. 16. In other words, the first electrode EL1 may be an anode of the emission unit (refer to "EMU" of FIG. 16) of each pixel PXL. The third electrode EL3 may be a cathode of the emission unit EMU.

In a pixel area PXA of each pixel PXL, each of the first to fourth electrodes EL1 to EL4 may be disposed at a position spaced from an electrode adjacent thereto in the first direction DR1. For example, the first electrode EL1 may be disposed at a position spaced from the second electrode EL2. The second electrode EL2 may be disposed at a position spaced from the third electrode EL3. The third electrode EL3 may be disposed at a position spaced from the fourth electrode EL4. Although the distance between the first electrode EL1 and the second electrode EL2, the distance between the second electrode EL2 and the third electrode EL3, and the distance between the third electrode EL3 and the fourth electrode EL4 may be the same as each other, the present disclosure is not limited thereto. In one or more embodiments, the distance between the first electrode EL1 and the second electrode EL2, the distance between the second electrode EL2 and the third electrode EL3, and the distance between the third electrode EL3 and the fourth electrode EL4 may be different from each other.

Each of the first to fourth electrodes EL1, EL2, EL3, and EL4 may have a multi-layer structure including a reflective electrode and a conductive capping layer. Furthermore, the reflective electrode may have a single- or multi-layer structure. For example, the reflective electrode may include at least one opaque metal layer, and selectively further include at least one transparent conductive layer disposed over and/or under the opaque metal layer.

Each of the first to fourth electrodes EL1 to EL4 may function as an alignment electrode (or an alignment line) configured to receive, before the light emitting elements LD are aligned in the emission area EMA of each pixel PXL, an alignment signal (e.g., a set or predetermined alignment signal) or an alignment voltage from an alignment pad disposed in the non-display area (refer to "NDA" of FIG. 3), and then to align the light emitting elements LD.

For example, the first electrode EL1 may be used as a first alignment electrode (or a first alignment line) to receive a first alignment signal (or a first alignment voltage) from the first alignment pad. For example, the second electrode EL2 may be used as a second alignment electrode (or a second alignment line) to receive a second alignment signal (or a second alignment voltage) from the second alignment pad. For example, the third electrode EL3 may be used as a third alignment electrode (or a third alignment line) to receive a third alignment signal (or a third alignment voltage) from the third alignment pad. For example, the fourth electrode EL4 may be used as a fourth alignment electrode (or a fourth alignment line) to receive a fourth alignment signal (or a fourth alignment voltage) from the fourth alignment pad. Here, the same alignment signal may be applied to the second electrode EL2 and the third electrode EL3.

The above-mentioned first to fourth alignment signals may be signals having a voltage difference and/or a phase difference enabling the light emitting elements LD to be aligned between the first to fourth electrodes EU to EL4. At least one alignment signal of the first to fourth alignment signals may be an AC signal (or voltage), but the present disclosure is not limited thereto.

In one or more embodiments, each pixel PXL may include a support component that supports each of the first to fourth electrodes EL1 to EL4 to change a surface profile (or a surface shape) of each of the first to fourth electrodes EL1 to EL4 so that light emitted from the light emitting elements LD is guided in the image display direction (or the frontal direction) of the display device. The support component may include a first bank pattern BNKP1 that overlaps one area of the first electrode EL1, a second bank pattern BNKP2 that overlaps one area of the second electrode EL2, a third bank pattern BNKP3 that overlaps one area of the third electrode EL3, and a fourth bank pattern BNKP4 that overlaps one area of the fourth electrode EL4.

The first bank pattern BNKP1, the second bank pattern BNKP2, the third bank pattern BNKP3, and the fourth bank pattern BNKP4 may be disposed at positions spaced from each other in the first direction DR1 in the pixel area PXA (or the emission area EMA) of each pixel PXL, and protrude one area of each of the first electrode EL1, the second electrode EL2, the third electrode EL3, and the fourth electrode EL4 upward. For example, the first electrode EL1 (or the protrusion of the first electrode EL1) may be disposed on the first bank pattern BNKP1 and protrude in the third direction (i.e., the thickness-wise direction of the substrate SUB) by the first bank pattern BNKP1. The second electrode EL2 may be disposed on the second bank pattern BNKP2 and protrude in the third direction DR3 by the second bank pattern BNKP2. The third electrode EL3 may be disposed on the third bank pattern BNKP3 and protrude in the third direction DR3 by the third bank pattern BNKP3. The fourth electrode EL4 (or the protrusion of the fourth electrode EL4) may be disposed on the fourth bank pattern BNKP4 and protrude in the third direction DR3 by the fourth bank pattern BNKP4.

Each pixel PXL may include a plurality of light emitting elements LD. The light emitting elements LD may include a first light emitting element LD1 and a second light emitting element LD2. In one or more embodiments, each pixel PXL may further include a reverse light emitting element LDr described with reference to FIG. 16.

Although at least two to several tens of light emitting elements LD may be aligned and/or provided in the pixel area PXA of each pixel PXL, the number of light emitting elements LD is not limited thereto. In one or more embodiments, the number of light emitting elements LD aligned and/or provided in the pixel area PXA may be changed in various ways.

The light emitting elements LD may be disposed between two adjacent electrodes of the first to fourth electrodes EL1 to EL4. The light emitting elements LD may include a first light emitting element LD1 and a second light emitting element LD2. In the following embodiment, the first light emitting element LD1 and the second light emitting element LD2 may be embraced in the term "light emitting element LD" or "light emitting elements LD".

The first light emitting element LD1 may be disposed and/or aligned between the first electrode EL1 and the second electrode EL2. A first end EP1 (or one end) of the first light emitting element LD1 may face the first electrode EL1. A second end EP2 (or a remaining end) of the first light emitting element LD1 may face the second electrode EL2. In case that a plurality of first light emitting elements LD1 are provided, the plurality of first light emitting elements LD1 may be electrically connected in parallel between the first electrode EL1 and the second electrode EL2, and form, along with the first and second electrodes EL1 and EL2, the first serial set SET1 described with reference to FIG. 16.

The second light emitting element LD2 may be disposed and/or aligned between the third electrode EL3 and the fourth electrode EL4. A first end EP1 (or one end) of the second light emitting element LD2 may face the fourth electrode EL4. A second end EP2 (or a remaining end) of the second light emitting element LD2 may face the third electrode EL3. In case that a plurality of second light emitting elements LD2 are provided, the plurality of second light emitting elements LD2 may be electrically connected in parallel between the third electrode EL3 and the fourth electrode EL4, and form, along with the third and fourth electrodes EL3 and EL4, the second serial set SET2 described with reference to FIG. 16.

In one or more embodiments, the first end EP1 of the first light emitting element LD1 and the first end EP1 of the second light emitting element LD2 may include the same type of semiconductor layer (e.g., the second semiconductor layer 13 described with reference to FIG. 1A). The second end EP2 of the first light emitting element LD1 and the second end EP2 of the second light emitting element LD2 may include the same type of semiconductor layer (e.g., the first semiconductor layer 11 described with reference to FIG. 1A).

Although there the light emitting elements LD have been illustrated as being aligned in the first direction DR1 between the first electrode EL1, the second electrode EL2, the third electrode EL3, and the fourth electrode EL4, the alignment direction of the light emitting elements LD is not limited thereto. In one or more embodiments, at least one of the light emitting elements LD may be aligned in a diagonal direction inclined with respect to the first direction DR1 or the second direction DR2 between two adjacent electrodes of the first to fourth electrodes EL1, EL2, EL3, and EL4.

In one or more embodiments, the first end EP1 of the first light emitting element LD1 may be electrically and/or physically connected with the first electrode EL1 by at least one connection electrode, e.g., the first connection electrode CNE1, rather than being directly disposed on the first electrode EL1. Likewise, the second end EP2 of the second light emitting element LD2 may be electrically and/or physically connected with the third electrode EL3 by at least one connection electrode, e.g., the second connection electrode CNE2, rather than being directly disposed on the third electrode EL3.

Each of the light emitting elements LD may be formed of a light emitting diode that is made of material having an inorganic crystal structure and has a subminiature size, e.g., ranging from the nanometer scale to the micrometer scale. For example, each of the light emitting elements LD may be the light emitting element LD described with reference to FIG. 1A. Each of the light emitting elements LD may emit any one light of color light and/or white light.

The light emitting elements LD may be diffused in a solution (or ink), and the solution including the light emitting elements LD may be input (or supplied) to the emission area EMA of each pixel PXL. The light emitting elements LD may be input (or supplied) to the emission area EMA of each pixel PXL by an inkjet printing scheme, a slit coating scheme, or other various schemes. For example, the light emitting elements LD may be mixed with a volatile solvent and then input (or supplied) to the emission area EMA by an inkjet printing scheme or a slit coating scheme. If corresponding alignment signals are respectively applied to the first to fourth electrodes EL1 to EL4, an electric field may be formed between two adjacent electrodes among the first to fourth electrodes EL1 to EL4. Hence, light emitting elements LD may be aligned between two adjacent electrodes of the first to fourth electrodes EL1 to EL4. As described above, because the same alignment signal is applied to each of the second and third electrodes EL2 and EL3, the light emitting elements LD may not be aligned between the second electrode LE2 and the third electrode EL3. The present disclosure is not limited thereto. In one or more embodiments, when an alignment signal is applied to each of the second and third electrodes EL2 and EL3, a potential difference may occur between alignment signals applied to the second electrode EL2 and the third electrode EL3 due to line resistance of the two electrodes, an effect resulting from an electric field induced between adjacent electrodes, etc. In this case, light emitting elements LD may also be aligned between the second and third electrodes EL2 and EL3. After the light emitting elements LD are aligned, the solvent may be removed by a volatilization scheme or other schemes. In this way, the light emitting elements LD may be reliably aligned between the first to fourth electrodes EL1 to EL4.

In one or more embodiments, each pixel PXL may include a first connection electrode CNE1, a second connection electrode CNE2, and an intermediate electrode CTE.

The first connection electrode CNE1, the second connection electrode CNE2, and the intermediate electrode CTE may be components configured to more reliably electrically connect the first to fourth electrodes EL1 to EL4 and the light emitting elements LD.

The first connection electrode CNE1 may be formed on the first end EP1 of the first light emitting element LD1 and at least one area of the first electrode EU corresponding to the first end EP1, so that the first end EP1 of the first light emitting element LD1 may be physically and/or electrically connected to the first electrode EL1.

The second connection electrode CNE2 may be formed on the second end EP2 of the second light emitting element LD2 and at least one area of the third electrode EL3 corresponding to the second end EP2, so that the second end EP2 of the second light emitting element LD2 may be physically and/or electrically connected to the third electrode EL3.

The intermediate electrode CTE may include a first intermediate electrode CTE1 and a second intermediate electrode CTE2 that extend in the second direction DR2.

The first intermediate electrode CTE1 may be provided and/or formed on the second end EP2 of the first light emitting element LD1 and at least one area of the second electrode EL2 corresponding to the second end EP2. The first intermediate electrode CTE1 may physically and/or electrically connect the second end EP2 of the first light emitting element LD1 to the second electrode EL2. In one or more embodiments, in a plan view, the first intermediate electrode CTE1 may be provided in a shape extending in the second direction DR2 between the first connection electrode CNE1 and the second connection electrode CNE2.

The second intermediate electrode CTE2 may be provided and/or formed on the first end EP1 of the second light emitting element LD2 and at least one area of the fourth electrode EL4 corresponding to the first end EP1. The second intermediate electrode CTE2 may physically and/or electrically connect the first end EP1 of the second light emitting element LD2 to the fourth electrode EL4. In one or more embodiments, in a plan view, the second intermediate electrode CTE2 may be provided in a shape extending in the second direction DR2 between the second connection electrode CNE2 and the bank BNK disposed in a peripheral area PPA.

The first intermediate electrode CTE1 and the second intermediate electrode CTE2 may be integrally provided and electrically connected with each other. The first intermediate electrode CTE1 and the second intermediate electrode CTE2 may be respectively different areas of the intermediate electrode CTE. The first intermediate electrode CTE1 may have the same configuration as that of the first intermediate electrode CTE1 described with reference to FIG. 16. The second intermediate electrode CTE2 may have the same configuration as that of the second intermediate electrode CTE2 described with reference to FIG. 16. The intermediate electrode CTE may be a bridge electrode (or a connection electrode) configured to electrically connect the second end EP2 of the first light emitting element LD1 with the first end EP1 of the second light emitting element LD2. In other words, the intermediate electrode CTE may be a bridge electrode configured to connect the first serial set SET1 with the second serial set SET2.

In a plan view, the intermediate electrode CTE including the first intermediate electrode CTE1 and the second intermediate electrode CTE2 may be spaced from the second connection electrode CNE2, and have a closed loop shape enclosing the periphery (or the perimeter) of the second connection electrode CNE2, but the present disclosure is not limited thereto. In one or more embodiments, the center electrode CTE may be changed in various shapes, so long as it can reliably connect the first serial set SET1 and the second serial set SET2 that are successively provided. For example, the intermediate electrode CTE may have a shape enclosing a portion of the second connection electrode CNE2 other than at least one area of the second connection electrode CNE2 and, e.g., have a partially open shape rather than having a completely closed loop shape.

The first connection electrode CNE1, the second connection electrode CNE2, and the intermediate electrode CTE may be spaced from each other in a plan view.

The first connection electrode CNE1 may face (or oppose) one area of the intermediate electrode CTE, e.g., the first intermediate electrode CTE1. The first connection electrode CNE1 and the first intermediate electrode CTE1 may extend in the same direction, e.g., in the second direction DR2, and may be spaced from each other in the first direction DR1.

The second connection electrode CNE2 may face (or oppose) another area of the intermediate electrode CTE, e.g., the second intermediate electrode CTE2. The second connection electrode CNE2 and the second intermediate electrode CTE2 may extend in the second direction DR2, and may be spaced from each other in the first direction DR1.

Hereinafter, the stacked structure of the pixel PXL in accordance with the foregoing embodiment will be mainly described with reference to FIGS. 18A to 18B.

Figure 18A:
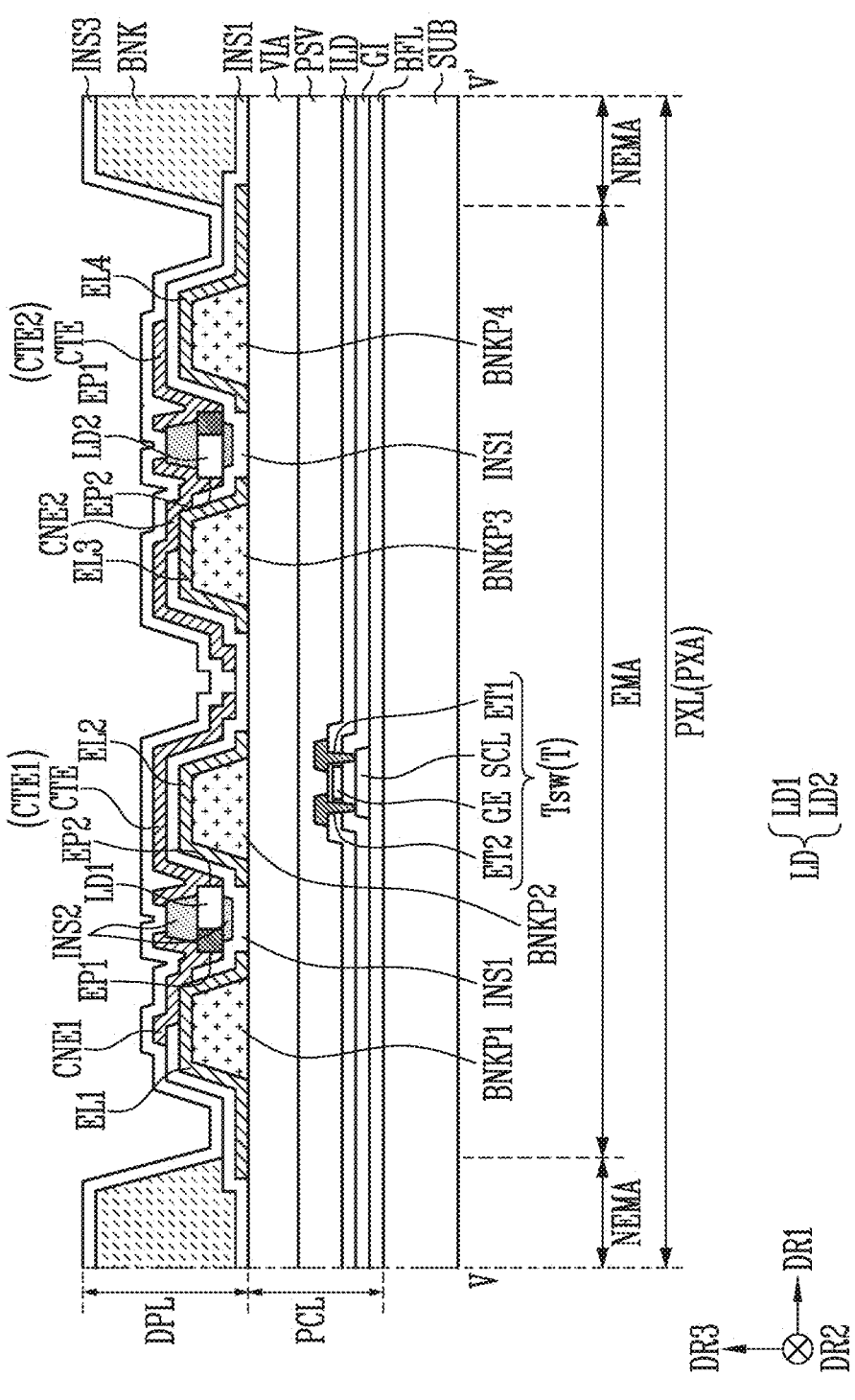
FIGS. 18A and 18B are cross-sectional views taken along the line V-V' of FIG. 17.
Figure 18B:
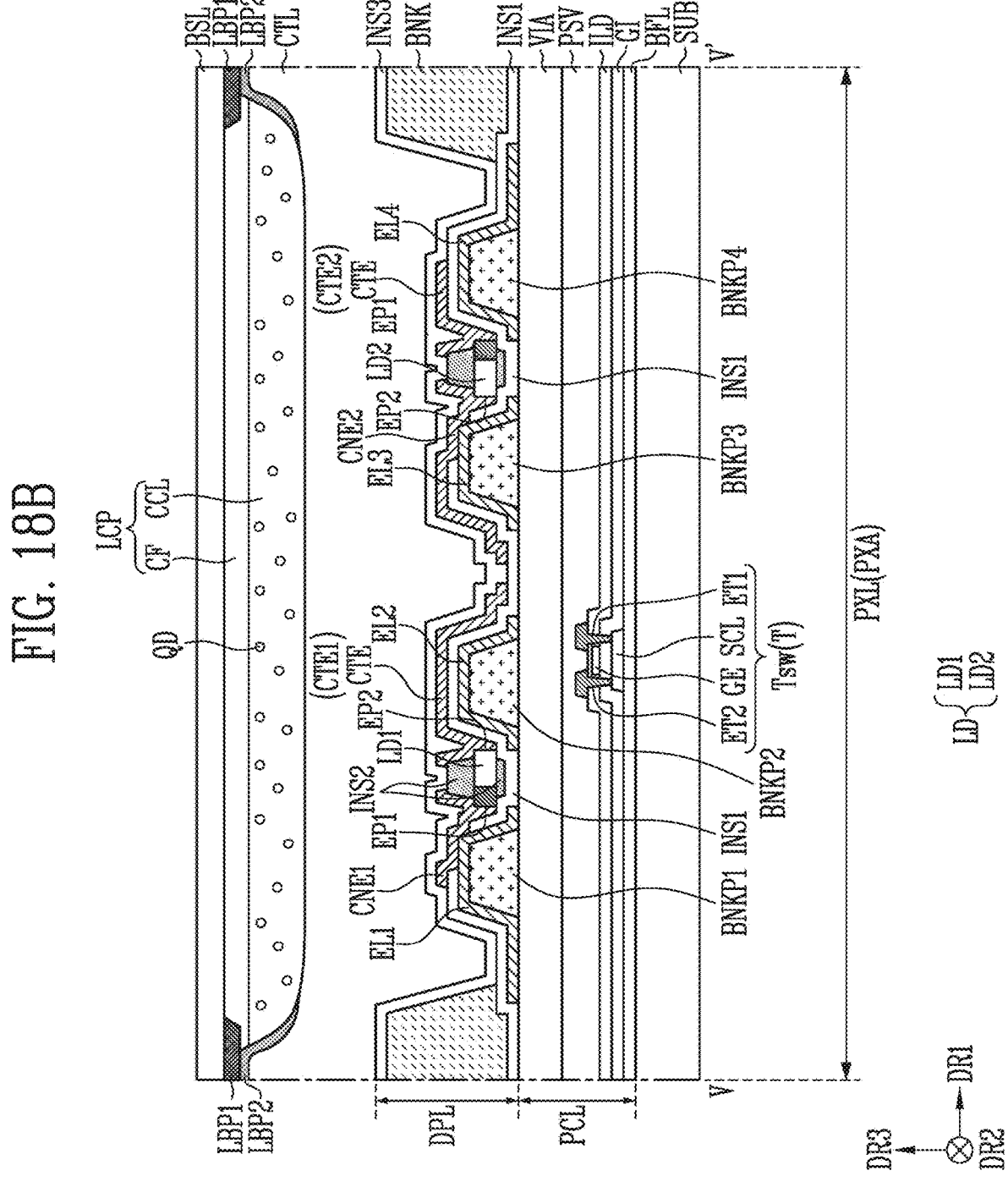

FIGS. 18A and 18B are cross-sectional views taken along the line V-V' of FIG. 17.

The description with reference to FIGS. 18A and 18B will be focused on differences from the above-mentioned embodiments so as to avoid redundant description.

Referring to FIGS. 17 to 18B, each pixel PXL may include a substrate SUB, a pixel circuit layer PCL, and a display element layer DPL.

The pixel circuit layer PCL may include a buffer layer BFL, at least one transistor T, at least one storage capacity Cst, and a via layer VIA. The pixel circuit layer PCL may be the pixel circuit layer PCL described with reference to FIGS. 6 and 7.

The display element layer DPL may be disposed on the pixel circuit layer PCL. The display element layer DPL may include a bank BNK, first to fourth bank patterns BNKP1, BNKP2, BNKP3, and BNKP4, first to fourth electrodes EL1, EL2, EL3, and EL4, light emitting elements LD, first and second connection electrodes CNE1 and CNE2, an intermediate electrode CTE, and first to third insulating layers INS1 to INS3. The display element layer DPL may be the display element layer DPL described with reference to FIGS. 6 to 11.

The first, second, third, and fourth bank patterns BNKP1, BNKP2, BNKP3, and BNKP4 may be disposed at positions spaced from each other in the pixel area PXA (or the emission area EMA) of each pixel PXL. The first to fourth bank patterns BNKP1 to BNKP4 may protrude in the third direction DR3 on the pixel circuit layer PCL. The first to fourth bank patterns BNKP1 to BNKP4 may have substantially the same height, but the present disclosure is not limited thereto. In one or more embodiments, the first to fourth bank patterns BNKP1 to BNKP4 may have different heights.

The first bank pattern BNKP1 may be provided and/or formed between the via layer VIA and the first electrode EL1. The second bank pattern BNKP2 may be provided and/or formed between the via layer VIA and the second electrode EL2. The third bank pattern BNKP3 may be provided and/or formed between the via layer VIA and the third electrode EL3. The fourth bank pattern BNKP4 may be provided and/or formed between the via layer VIA and the fourth electrode EL4.

The first to fourth bank patterns BNKP1 to BNKP4 may be an inorganic insulating layer including inorganic material or an organic insulating layer including organic material. In one or more embodiments, the first to fourth bank patterns BNKP1 to BNKP4 each may include an organic insulating layer having a single-layer structure and/or an inorganic insulating layer having a single-layer structure, but the present disclosure is not limited thereto. In one or more embodiments, the first to fourth bank patterns BNKP1 to BNKP4 each may be provided in the form of a multi-layer structure formed by stacking at least one organic insulating layer and at least one inorganic insulating layer. Here, the material of the first to fourth bank patterns BNKP1 to BNKP4 is not limited to that of the foregoing embodiment. In one or more embodiments, the first to fourth bank patterns BNKP1 to BNKP4 each may include conductive material (or substance).

Each of the first to fourth bank patterns BNKP1 to BNKP4 may have a trapezoidal cross-section that is reduced in width from one surface (e.g., an upper surface) of the via layer VIA upward in the third direction DR3, but the present disclosure is not limited thereto. In one or more embodiments, each of the first to fourth bank patterns BNKP1 to BNKP4 may include a curved surface having a cross-sectional shape such as a semi-elliptical shape or a semicircular shape (or a hemispherical shape) that is reduced in width from one surface of the via layer VIA upward in the third direction DR3. In a cross-sectional view, the shape of the first to fourth bank patterns BNKP1 to BNKP4 is not limited to the foregoing examples, and may be changed in various ways within a range in which the efficiency of light emitted from each of the light emitting elements LD may be enhanced. In one or more embodiments, at least one of the first to fourth bank patterns BNKP1 to BNKP4 may be omitted or changed in position.

In one or more embodiments, the first to fourth bank patterns BNKP1 to BNKP4 each may function as a reflector.

For example, the first to fourth bank patterns BNKP1 to BNKP4, along with the first, second, third, and fourth electrodes EL1, EL2, EL3, and EL4 provided thereover, may function as reflectors that guide light emitted from each light emitting element LD in a desired direction, thus enhancing the light output efficiency of each pixel PXL.

The first to fourth electrodes EU to EL4 may be respectively disposed over the first to fourth bank patterns BNKP1 to BNKP4. The first, second, third, and fourth electrodes EL1, EL2, EL3, and EL4 may be disposed at positions spaced from each other in the pixel area PXA (or the emission area EMA) of each pixel PXL.

In one or more embodiments, the first to fourth electrodes EL1 to EL4, etc. that are respectively disposed over the first to fourth bank patterns BNKP1 to BNKP4 may have shapes corresponding to respective shapes of the first to fourth bank patterns BNKP1 to BNKP4. For example, the first, second, third, and fourth electrodes EL1, EL2, EL3, and EL4 may have inclined surfaces or curved surfaces corresponding to the first, second, third, and fourth bank patterns BNKP1, BNKP2, BNKP3, and BNKP4 and protrude in the third direction DR3.

Each of the first to fourth electrodes EU to EL4 may be formed of material having a constant (or regular) reflectivity to enable light emitted from each of the light emitting elements LD to travel in an image display direction (e.g., in the frontal direction) of the display device.

The first electrode EL1 may be electrically connected with the first transistor (refer to "T1" of FIG. 16) of the pixel circuit (refer to "PXC" of FIG. 16) through the first contact hole CH1. The third electrode EL3 may be electrically connected with the second power line (refer to "PL2" of FIG. 16) of the pixel circuit PXC through the second contact hole CH2. The first to fourth electrodes EL1 to EL4 may be used as alignment electrodes (or alignment lines) for aligning the light emitting elements LD. Furthermore, the first and third electrodes EL1 and EL3 of the first to fourth electrodes EL1 to EL4 may be used as driving electrodes configured to drive the light emitting elements LD.

The first insulating layer INS1 may be provided and/or formed on the first to fourth electrodes EU to EL4. For example, the first insulating layer INS1 may be formed to cover one area of each of the first to fourth electrodes EL1 to EL4, and include an opening to expose another area of each of the first to fourth electrodes EL1 to EL4. In one or more embodiments, the first insulating layer INS1 may be partially open to expose one area of each of the first and third electrodes EL1 and EL3 of the first to fourth electrodes EL1 to EL4. In one or more embodiments, the first insulating layer INS1 may be partially open to expose one area of each of the second and fourth electrodes EL2 and EL4. In this case, the second electrode EL2 may contact the first intermediate electrode CTE1 disposed thereover. The fourth electrode EL4 may contact the second intermediate electrode CTE2 disposed thereover. The first intermediate electrode CTE1 may contact the second electrode EL2 to form a double-layer structure for reducing line resistance and reducing or minimizing distortion attributable to a signal delay. The second intermediate electrode CTE2 may contact the fourth electrode EL4 to form a double-layer structure for reducing line resistance and reducing or minimizing distortion attributable to a signal delay.

The bank BNK may be provided and/or formed on the first insulating layer INS1.

The bank BNK may be formed in the non-emission area NEMA of each pixel PXL to enclose the emission area EMA of the corresponding pixel PXL. The bank BNK may be provided on the first insulating layer INS1 and embody a dam structure. At the step of supplying (or inputting) the light emitting elements LD to the emission area EMA of the corresponding pixel PXL, the dam structure may be a structure configured to prevent ink including the light emitting elements LD from being drawn into the emission area EMA of an adjacent pixel PXL or control the amount of ink such that a constant amount of ink is supplied to each emission area EMA. The bank BNK may include first and second openings OP1 and OP2. The first opening OP1 may correspond to the emission area EMA of each pixel PXL. The second opening OP2 may correspond to one side of each pixel PXL.

The light emitting elements LD may be supplied (or input) to and aligned in the pixel area PXA (or the emission area EMA) of each pixel PXL in which the bank BNK is formed. For example, in case that the light emitting elements LD are supplied (or input) to the pixel area PXA by an inkjet printing scheme or the like, the light emitting elements LD may be aligned between the first to fourth electrodes EU to EL4 by an alignment signal (e.g., a set or predetermined alignment signal) applied to the each of the first to fourth electrodes EL1 to EL4. For instance, at least one first light emitting element LD1 may be aligned between the first electrode EL1 and the second electrode EL2. At least one second light emitting element LD2 may be aligned between the third electrode EL3 and the fourth electrode EL4.

A second insulating layer INS2 may be provided and/or formed on the light emitting elements LD. The second insulating layer INS2 may be provided and/or formed on the light emitting elements LD to partially cover the surface (e.g., the outer peripheral or circumferential surface) of each of the light emitting elements LD such that the first end EP1 and the second end EP2 of each of the light emitting element LD are exposed to the outside.

The first connection electrode CNE1 may be disposed to contact the first electrode EL1 in one area of the first electrode EL1 that is not covered by the first insulating layer INS1. Furthermore, the first connection electrode CNE1 may be disposed on the first end EP1 of the first light emitting element LD1 adjacent to the first electrode EL1 so that the first connection electrode CNE1 can contact the first end EP1 of the first light emitting element LD1. In other words, the first connection electrode CNE1 may be disposed to cover the first end EP1 of the first light emitting element LD1 and at least one area of the corresponding first electrode EU.

Likewise, the second connection electrode CNE2 may be disposed to contact the third electrode EL3 in one area of the third electrode EL3 that is not covered by the first insulating layer INS1. Furthermore, the second connection electrode CNE2 may be disposed on the second end EP2 of the second light emitting element LD2 adjacent to the third electrode EL3 so that the second connection electrode CNE2 can contact the second end EP2 of the second light emitting element LD2. In other words, the second connection electrode CNE2 may be disposed to cover the second end EP2 of the second light emitting element LD2 and at least one area of the corresponding third electrode EL3.

The first and second connection electrodes CNE1 and CNE2 may be formed of various transparent conductive material to allow light emitted from each of the light emitting elements LD and reflected by the first and third electrodes EU and EL3 to travel in the image display direction of the display device without loss (e.g., without significant loss).

In one or more embodiments, the first connection electrode CNE1 and the second connection electrode CNE2 may be provided on or at an identical layer. In this case, the first connection electrode CNE1 and the second connection electrode CNE2 may be formed through an identical process. However, the present disclosure is not limited thereto. In one or more embodiments, the first connection electrode CNE1 and the second connection electrode CNE2 may be formed through different processes and may be provided on different layers.

The intermediate electrode CTE may include the first intermediate electrode CTE1 and the second intermediate electrode CTE2.

The first intermediate electrode CTE1 may be provided and/or formed on the second electrode EL2 and the second end EP2 of the first light emitting element LD1. The first intermediate electrode CTE1 may be electrically insulated (or separated) from the second electrode EL2 that is completely covered with the first insulating layer INS1. However, the present disclosure is not limited thereto. In one or more embodiments, in case that one area of the second electrode EL2 is partially exposed from the first insulating layer INS1, the first intermediate electrode CTE1 may be electrically connected with the second electrode EL2. Hence, the first intermediate electrode CTE1 may have a double-layer structure. The second intermediate electrode CTE2 may be electrically insulated (or separated) from the fourth electrode EL4 that is completely covered with the first insulating layer INS1. However, the present disclosure is not limited thereto. In one or more embodiments, in case that one area of the fourth electrode EL4 is partially exposed from the first insulating layer INS1, the second intermediate electrode CTE2 may be electrically connected with the fourth electrode EL4. Hence, the second intermediate electrode CTE2 may have a double-layer structure.

The intermediate electrode CTE may be formed of various transparent conductive materials to allow light emitted from each of the light emitting elements LD and reflected by the first, second, third, and fourth electrodes EL1, EL2, EL3, and EL4 to travel in the image display direction of the display device without loss (e.g., without significant loss). For example, the intermediate electrode CTE may include material identical with that of the first and second connection electrodes CNE1 and CNE2.

The intermediate electrode CTE may be provided on or at the same layer as that of the first and second connection electrodes CNE1 and CNE2 and may be formed through the same process as that of the first and second connection electrodes CNE1 and CNE2. For example, the intermediate electrode CTE and the first and second connection electrodes CNE1 and CNE2 may be provided and/or formed on the second insulating layer INS2. However, the present disclosure is not limited thereto. In one or more embodiments, the intermediate electrode CTE may be provided on a layer different from that of the first and second connection electrodes CNE1 and CNE2 and may be formed through a process different therefrom.

The third insulating layer INS3 may be provided and/or formed on the first connection electrode CNE1, the second connection electrode CNE2, and the center electrode CTE. The third insulating layer INS3 may be an inorganic insulating layer including inorganic material or an organic insulating layer including organic material. For example, the third insulating layer INS3 may have a structure formed by alternately stacking at least one inorganic insulating layer and at least one organic insulating layer. The third insulating layer INS3 may cover the entirety of the display element layer DPL and prevent water or moisture from being drawn into the display element layer DPL including the light emitting elements LD from the outside. Furthermore, in one or more embodiments, at least one overcoat layer (e.g., a layer for planarizing the upper surface of the display element layer DPL) may be further disposed over the third insulating layer INS3.

In one or more embodiments, as illustrated in FIG. 18B, an upper substrate may be further disposed on the third insulating layer INS3. The upper substrate may include a base layer BSL and a light conversion pattern layer LCP. The light conversion pattern layer LCP may be disposed on one surface of the base layer BSL to face (or oppose) the pixels PXL of the substrate SUB. The light conversion pattern layer LCP may include a color conversion layer CCL including color conversion particles QD that convert a first color of light emitted from the light emitting elements LD to a second color of light, and a color filter CF provided on the color conversion layer CCL.

The upper substrate including the base layer BSL and the light conversion pattern layer LCP is the same as the upper substrate described with reference to FIG. 14C; therefore repetitive explanation thereof will be omitted.

When driving current flows from the first power line PL1 to the second power line PL2 by the first transistor T1 of the pixel circuit PXC included in each pixel PXL, the driving current may be drawn into the emission unit (refer to "EMU" of FIG. 16) of the corresponding pixel PXL through the first contact hole CH1.

For example, driving current may be supplied to the first electrode EL1 through the first contact hole CH1. The driving current may flow to the intermediate electrode CTE via the first light emitting element LD1 through the first connection electrode CNE1 that is brought into direction contact with (or connected with) the first electrode EL1. Hence, in the first serial set SET1, the first light emitting element LD1 may emit light at a luminance corresponding to input current.

Driving current flowing to the intermediate electrode CTE may flow to the second connection electrode CNE2 via the intermediate electrode CTE and the second light emitting element LD2. Hence, in the second serial set SET2, the second light emitting element LD2 may emit light at a luminance corresponding to input current.

As described above, driving current of each pixel PXL may flow successively via the first light emitting element LD1 of the first serial set SET1 and the second light emitting element LD2 of the second serial set SET2. Hence, each pixel PXL may emit light at a luminance corresponding to a data signal supplied during each frame period.

According to the foregoing embodiment, at the step of forming the first connection electrode CNE1 and the second connection electrode CNE2, the intermediate electrode CTE may be formed concurrently (or simultaneously) with the first and second connection electrodes CNE1 and CNE2. Therefore, the process of fabricating each pixel PXL and the display device including the pixel PXL may be simplified, so that a product yield can be enhanced.

In addition, in the foregoing embodiment, the emission unit EMU has a serial/parallel combination structure. Consequently, each pixel PXL can be reliably driven, so that driving current flowing to the display panel of the display device can be reduced, whereby the power consumption efficiency may be improved.

Figure 19:
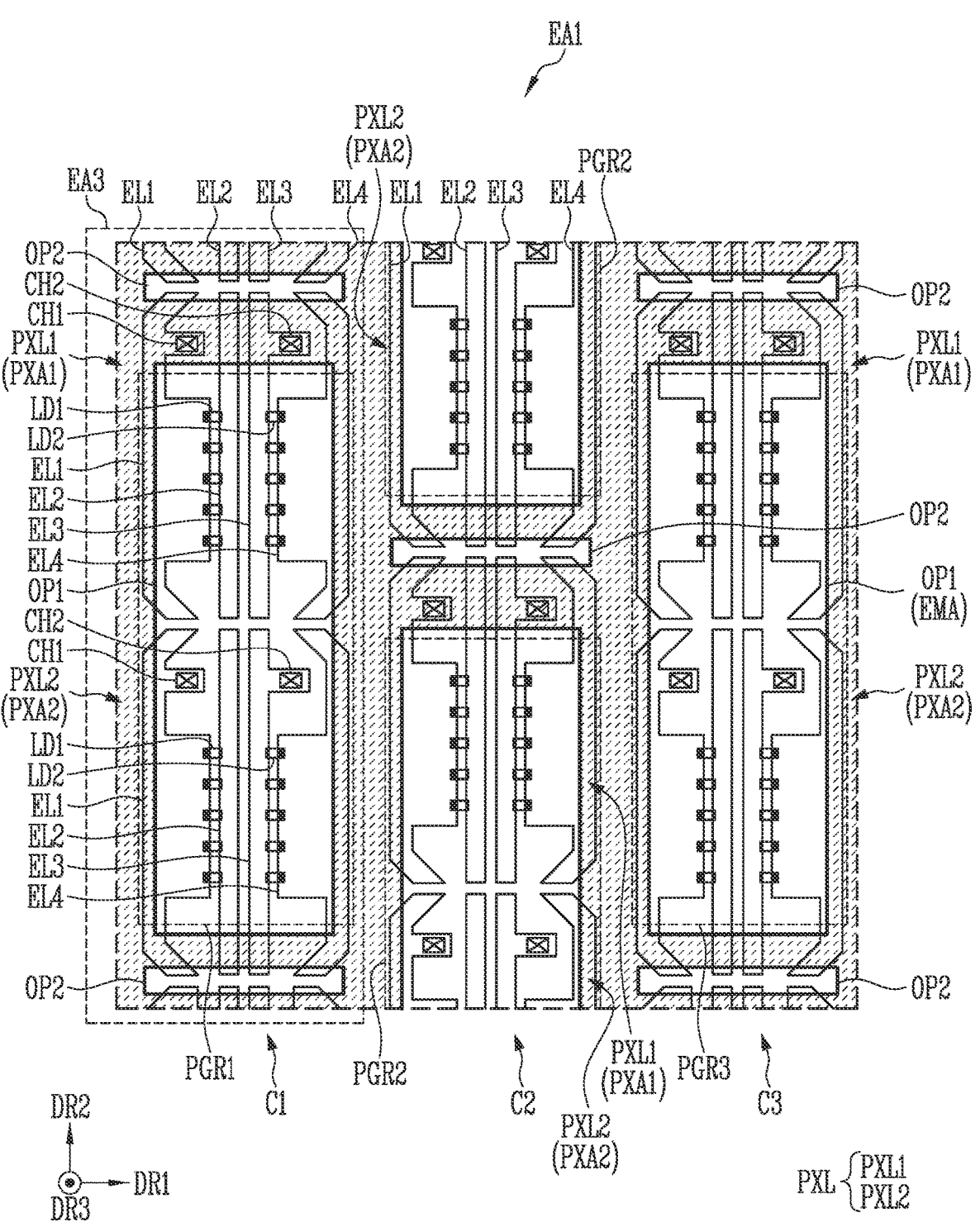
FIG. 19 is an enlarged plan view schematically illustrating only some components included in the portion EA1 of FIG. 3.
Figure 20:
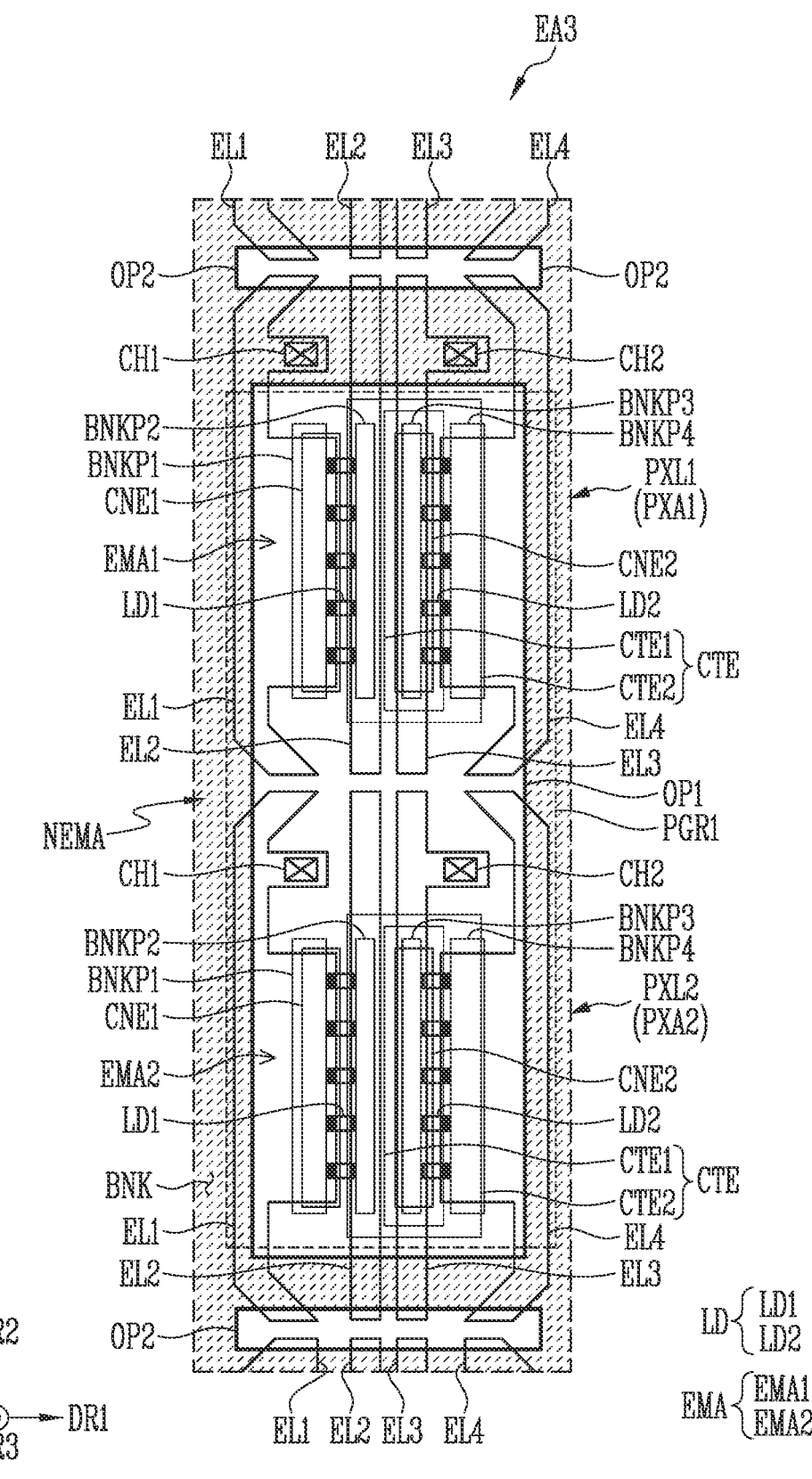
FIG. 20 is an enlarged plan view illustrating in detail components included the portion EA3 of FIG. 19.

FIG. 19 is an enlarged plan view schematically illustrating only some components included in portion EA1 of FIG. 3. FIG. 20 is an enlarged plan view illustrating in detail components included portion EA3 of FIG. 19. Particularly, for the sake of explanation, FIG. 19 schematically illustrates only some components of each of the first and second pixels PXL1 and PXL2 included in each of the first to third pixel groups PGR1 to PGR3.

The description with reference to FIGS. 19 and 20 will be focused on differences from the above-mentioned embodiments so as to avoid redundant description.

In FIGS. 19 and 20, the first to third directions DR1, DR2, and DR3 may refer to the directions indicated by the first to third directions DR1, DR2, and DR3, respectively.

Referring to FIGS. 3, 19, and 20, a plurality of pixel columns each including a plurality of pixels PXL may be disposed in the display area DA of the substrate SUB.

In one or more embodiments, the pixel columns may include a first pixel column C1, a second pixel column C2, and a third pixel column C3 that are arranged successively along the first direction DR1 and extend in the second direction DR2. A plurality of pixels PXL arranged in the second direction DR2 may be provided in each of the first to third pixel columns C1, C2, and C3.

In the first pixel column C1, there may be provided a first pixel group PGR1 including, as one unit, a first pixel PXL1 and a second pixel PXL2 that are arranged along the second direction DR2. In one or more embodiments, a plurality of first pixel groups PGR1 may be provided in the first pixel column C1. The first pixel PXL1 and the second pixel PXL2 in the first pixel group PGR1 may be electrically disconnected from each other and independently (or individually) driven. The first pixel PXL1 may be provided in a first pixel area PXA1 in the first pixel group PGR1. The second pixel PXL2 may be provided in a second pixel area PXA2 in the first pixel group PGR1. The pixels PXL included in the first pixel column C1 may emit the same color of light. For example, each of the first and second pixels PXL1 and PXL2 included in the first pixel column C1 may emit red light.

In the second pixel column C2, there may be provided a second pixel group PGR2 including, as one unit, a first pixel PXL1 and a second pixel PXL2 that are arranged along the second direction DR2. In one or more embodiments, a plurality of second pixel groups PGR2 may be provided in the second pixel column C2. The first pixel PXL1 and the second pixel PXL2 in the second pixel group PGR2 may be electrically disconnected from each other and independently (or individually) driven. The first pixel PXL1 may be provided in a first pixel area PXA1 in the second pixel group PGR2. The second pixel PXL2 may be provided in a second pixel area PXA2 in the second pixel group PGR2. The pixels PXL included in the second pixel column C2 may emit the same color of light. For example, each of the first and second pixels PXL1 and PXL2 included in the second pixel column C2 may emit green light. In one or more embodiments, the pixels PXL included in the second pixel column C2 may emit light having a color different from that of the pixels PXL included in the first pixel column C1.

In the third pixel column C3, there may be provided a third pixel group PGR3 including, as one unit, a first pixel PXL1 and a second pixel PXL2 that are arranged along the second direction DR2. In one or more embodiments, a plurality of third pixel groups PGR3 may be provided in the third pixel column C3. The first pixel PXL1 and the second pixel PXL2 in the third pixel group PGR3 may be electrically disconnected from each other and independently (or individually) driven. The first pixel PXL1 may be provided in a first pixel area PXA1 in the third pixel group PGR3. The second pixel PXL2 may be provided in a second pixel area PXA2 in the third pixel group PGR3. The pixels PXL included in the third pixel column C3 may emit the same color of light. For example, each of the first and second pixels PXL1 and PXL2 included in the third pixel column C3 may emit blue light. In one or more embodiments, the pixels PXL included in the third pixel column C3 may emit light having a color different from that of the pixels PXL included in the first pixel column C1 or the pixels PXL included in the second pixel column C2.

In one or more embodiments, each of the first pixel group PGR1, the second pixel group PGR2, and the third pixel group PGR3 may be disposed on a pixel row different from that of a pixel group adjacent thereto in the first direction DR1. For example, the first pixel group PGR1 may be disposed on a pixel row different from that of the second pixel group PGR2 adjacent thereto in the first direction DR1. The second pixel group PGR2 may be disposed on a pixel row different from that of each of the first and third pixel groups PGR1 and PGR3 adjacent thereto in the first direction DR1. The third pixel group PGR3 may be disposed on a pixel row different from that of the second pixel group PGR2 adjacent thereto in the first direction DR1. In a plan view, the first pixel group PGR1 may be misaligned with the second pixel group PGR2 with respect to the first direction DR1. The second pixel group PGR2 may be misaligned with each of the first and third pixel groups PGR1 and PGR3 with respect to the first direction DR1. The third pixel group PGR3 may be misaligned with the second pixel group PGR2 with respect to the first direction DR1.

A bank BNK may be disposed around each of the first pixel group PGR1, the second pixel group PGR2, and the third pixel group PGR3. For example, the bank BNK may be disposed on the substrate SUB to enclose the emission area EMA of the first pixel group PGR1, the emission area EMA of the second pixel group PGR2, and the emission area EMA of the third pixel group PGR3.

The bank BNK may be a structure, e.g., a pixel defining layer, for defining (or partitioning) the emission areas EMA of each of the first to third pixel groups PGR1, PGR2, and PGR3 and pixel groups adjacent thereto. The bank BNK may be disposed in the non-emission area NEMA that encloses the emission area EMA of each of the first to third pixel groups PGR1, PGR2, and PGR3.

The bank BNK may include at least one opening that exposes components disposed under the bank BNK in the corresponding pixel group. For example, the bank BNK may include a first opening OP1 and a second opening OP2 that exposes components disposed under the bank BNK in the corresponding pixel group. For example, the bank BNK may include a first opening OP1 and a second opening OP2 which expose components disposed under the bank BNK in each of the first to third pixel groups PGR1, PGR2, and PGR3.

In one or more embodiments, the first opening OP1 of the bank BNK may correspond to the emission area EMA of each of the first to third pixel groups PGR1, PGR2, and PGR3.

The second opening OP2 of the bank BNK may be disposed between pixel groups adjacent to each other in the second direction DR2 in each of the first to third pixel columns C1, C2, and C3.

In the first pixel column C1, the second opening OP2 of the bank BNK may be located at each of upper and lower ends of the first pixel group PGR1 with respect to the second direction DR2. In other words, in the first pixel column C1, the second opening OP2 of the bank BNK may be located between the first pixel groups PGR1 adjacent to each other in the second direction DR2. In a plan view, in the first pixel column C1, the first pixel groups PGR1 and the second openings OP2 may be alternately disposed along the second direction DR2.

In the second pixel column C2, the second opening OP2 of the bank BNK may be located between two second pixel groups PGR2 adjacent to each other in the second direction DR2. For example, because the second pixel group PGR2 is misaligned with the first pixel group PGR1, the second opening OP2 of the bank BNK in the second pixel column C2 may correspond to at least a portion of the emission area EMA of the first pixel column C1 (or the first opening OP1 of the bank BNK). In a plan view, in the second pixel column C2, the second pixel groups PGR2 and the second openings OP2 may be alternately disposed along the second direction DR2.

In the third pixel column C3, the second opening OP2 of the bank BNK may be located at each of upper and lower ends of the third pixel group PGR3 with respect to the second direction DR2. In other words, in the third pixel column C3, the second opening OP2 of the bank BNK may be located between the third pixel groups PGR3 adjacent to each other in the second direction DR2. For example, because the third pixel group PGR3 is misaligned with the second pixel group PGR2, the second opening OP2 of the bank BNK in the third pixel column C3 and the second opening OP2 of the bank BNK in the second pixel column C2 may be provided at different positions. For example, in the third pixel column C3, the second opening OP2 of the bank BNK disposed on an upper end of the third pixel group PGR3 may correspond to at least a portion of the second pixel area PXA2 of a preceding second pixel group PGR2 of two second pixel groups PGR2 of the second pixel column C2. In the third pixel column C3, the second opening OP2 of the bank BNK disposed on a lower end of the third pixel group PGR3 may correspond to at least a portion of the second pixel area PXA2 of a subsequent second pixel group PGR2 of the two second pixel groups PGR2. In a plan view, in the third pixel column C3, the third pixel groups PGR3 and the second openings OP2 may be alternately disposed along the second direction DR2.

The first to third pixel groups PGR1, PGR2, and PGR3 may have a substantially similar or identical structure. The description of the first pixel group PGR1 with reference to FIG. 20 will substitute for description of the second and third pixel groups PGR2 and PGR3.

Each of the first and second pixels PXL1 and PXL2 included in the first pixel group PGR1 may include first to fourth electrodes EL1, EL2, EL3, and EL4. In one or more embodiments, each of the first and second pixels PXL1 and PXL2 may have a structure substantially similar or equal to that of the pixel PXL described with reference to FIG. 17. For example, the first pixel PXL1 may have the same structure as that of the pixel PXL described with reference to FIG. 17.

The first to fourth electrodes EL1, EL2, EL3, and EL4 of each of the first and second pixels PXL1 and PXL2 may be separated from other electrodes in the first opening OP1 and the second opening OP2 after the light emitting elements LD are supplied to and/or aligned in the pixel area of the corresponding pixel PXL.

One end of the first electrode EL1 of the first pixel PXL1 may be separated, in the second opening OP2 located on the upper end of the first pixel PXL1, from the first electrode EL1 of the pixel PXL that is adjacent thereto in the second direction DR2. A remaining end of the first electrode EL1 may be separated, in the first opening OP1 (or the emission area EMA of the first pixel group PGR1), from one end of the first electrode EL1 of the second pixel PXL2 that is adjacent thereto in the second direction DR2.

One end of the second electrode EL2 of the first pixel PXL1 may be separated, in the second opening OP2 located on the upper end of the first pixel PXL1, from the second electrode EL2 of the pixel PXL that is adjacent thereto in the second direction DR2. A remaining end of the second electrode EL2 may be separated, in the first opening OP1 (or the emission area EMA of the first pixel group PGR1), from one end of the second electrode EL2 of the second pixel PXL2 that is adjacent thereto in the second direction DR2.

One end of the third electrode EL3 of the first pixel PXL1 may be separated, in the second opening OP2 located on the upper end of the first pixel PXL1, from the third electrode EL3 of the pixel PXL that is adjacent thereto in the second direction DR2. A remaining end of the third electrode EL3 may be separated, in the first opening OP1 (or the emission area EMA of the first pixel group PGR1), from one end of the third electrode EL3 of the second pixel PXL2 that is adjacent thereto in the second direction DR2.

One end of the fourth electrode EL4 of the first pixel PXL1 may be separated, in the second opening OP2 located on the upper end of the first pixel PXL1, from the fourth electrode EL4 of the pixel PXL that is adjacent thereto in the second direction DR2. A remaining end of the fourth electrode EL4 may be separated, in the first opening OP1 (or the emission area EMA of the first pixel group PGR1), from one end of the fourth electrode EL4 of the second pixel PXL2 that is adjacent thereto in the second direction DR2.

Furthermore, one end of the first electrode EL1 of the second pixel PXL2 may be separated, in the first opening OP1 (or the emission area EMA of the first pixel group PGR1), from the remaining end of the first electrode EL1 of the first pixel PXL1 that is adjacent thereto in the second direction DR2. A remaining end of the first electrode EL1 may be separated, in the second opening OP2 located on the lower end of the second pixel PXL2, from the first electrode EL1 of the pixel PXL that is adjacent thereto in the second direction DR2.

One end of the second electrode EL2 of the second pixel PXL2 may be separated, in the first opening OP1 (or the emission area EMA of the first pixel group PGR1), from the remaining end of the second electrode EL2 of the first pixel PXL1 that is adjacent thereto in the second direction DR2. A remaining end of the second electrode EL2 may be separated, in the second opening OP2 located on the lower end of the second pixel PXL2, from the second electrode EL2 of the pixel PXL that is adjacent thereto in the second direction DR2.

One end of the third electrode EL3 of the second pixel PXL2 may be separated, in the first opening OP1 (or the emission area EMA of the first pixel group PGR1), from the remaining end of the third electrode EL3 of the first pixel PXL1 that is adjacent thereto in the second direction DR2. A remaining end of the third electrode EL3 may be separated, in the second opening OP2 located on the lower end of the second pixel PXL2, from the third electrode EL3 of the pixel PXL that is adjacent thereto in the second direction DR2.

One end of the fourth electrode EL4 of the second pixel PXL2 may be separated, in the first opening OP1 (or the emission area EMA of the first pixel group PGR1), from the remaining end of the fourth electrode EL4 of the first pixel PXL1 that is adjacent thereto in the second direction DR2. A remaining end of the fourth electrode EL4 may be separated, in the second opening OP2 located on the lower end of the second pixel PXL2, from the fourth electrode EL4 of the pixel PXL that is adjacent thereto in the second direction DR2.

The first electrode EL1 of each of the first and second pixels PXL1 and PXL2 may be electrically connected with the first transistor T1 described with reference to FIG. 16 through the first contact hole CH1. The third electrode EL3 of each of the first and second pixels PXL1 and PXL2 may be electrically connected with the second driving power supply VSS (or the second power line PL2) described with reference to FIG. 16 through the second contact hole CH2. The first electrode EL1 of each of the first and second pixels PXL1 and PXL2 may be an anode of the emission unit (refer to "EMU" of FIG. 16) of the corresponding pixel PXL. The third electrode EL3 of each of the first and second pixels PXL1 and PXL2 may be a cathode of the emission unit EMU.

The first to fourth electrodes EL1, EL2, EL3, and EL4 of the first pixel PXL1 may be disposed in the first pixel area PXA1 (or the first emission area EMA1). The first to fourth electrodes EL1, EL2, EL3, and EL4 of the second pixel PXL2 may be disposed in the second pixel area PXA2 (or the second emission area EMA2).

Each of the first to fourth electrodes EL1, EL2, EL3, and EL4 of each of the first and second pixels PXL1 and PXL2 may be used as an alignment electrode (or an alignment line) for aligning the light emitting elements LD in the emission area EMA of the first pixel group PGR1 by an alignment signal (e.g., a set or predetermined alignment signal) transmitted thereto before the light emitting elements LD are aligned. Before the light emitting elements LD are aligned in the first pixel group PGR1, each of the first to fourth electrodes EL1, EL2, EL3, and EL4 of each of the first and second pixels PXL1 and PXL2 may form an alignment electrode (or an alignment line) that extends in the second direction DR2 in the display area DA rather than being divided into parts by each pixel PXL. For example, the first electrode EL1 of the first pixel PXL1 and the first electrode EL1 of the second pixel PXL2 may be integrally provided to form one first alignment electrode (or one first alignment line). The second electrode EL2 of the first pixel PXL1 and the second electrode EL2 of the second pixel PXL2 may be integrally provided to form one second alignment electrode (or one second alignment line). The third electrode EL3 of the first pixel PXL1 and the third electrode EL3 of the second pixel PXL2 may be integrally provided to form one third alignment electrode (or one third alignment line). The fourth electrode EL4 of the first pixel PXL1 and the fourth electrode EL4 of the second pixel PXL2 may be integrally provided to form one fourth alignment electrode (or one fourth alignment line).

Each of the first and second pixels PXL1 and PXL2 may include a plurality of light emitting elements LD. The light emitting elements LD may be disposed between two adjacent electrodes in each of the first and second pixels PXL1 and PXL2. The light emitting elements LD may include first light emitting elements LD1 disposed between the first electrode EL1 and the second electrode EL2 in each of the first and second pixels PXL1 and PXL2, and second light emitting elements LD2 disposed between the third electrode EL3 and the fourth electrode EL4 in each of the first and second pixels PXL1 and PXL2.

In one or more embodiments, each of the first and second pixels PXL1 and PXL2 may include a first connection electrode CNE1, a second connection electrode CNE2, and an intermediate electrode CTE.

According to the foregoing embodiment, in the first pixel column C1, the second openings OP2 of the bank BNK and the first pixel groups PGR1 are alternately disposed along the second direction DR2, so that the bank BNK including the second opening OP2 may not be disposed between the first pixel PXL1 and the second pixel PXL2. Because the bank BNK including the second opening OP2 is not disposed between the first pixel PXL1 and the second pixel PXL2, ink including a plurality of light emitting elements LD may be supplied (or discharged) to the entirety of the emission area EMA of the first pixel group PGR1 through the nozzle of the inkjet printing device at the step of aligning the light emitting elements LD. In other word, in the first pixel group PGR1, ink including a plurality of light emitting elements LD may be entirely supplied (or discharged) to the first pixel area PXA1, the second pixel area PXA2, and even an area between the first pixel area PXA1 and the second pixel area PXA2 Because the bank BNK including the second opening OP2 is not disposed between the first pixel PXL1 and the second pixel PXL2, an ink supply surface area (or an ink discharge surface area) of each of the first pixel PXL1 and the second pixel PXL2 may be further increased. Consequently, the amount of ink that is supplied (or discharged) to each of the first pixel PXL1 and the second pixel PXL2 is increased, so that the number of light emitting elements LD aligned in each of the first and second pixels PXL1 and PXL2 may be increased, whereby the number of valid light sources of each pixel PXL may be further increased. Therefore, the light output efficiency of each pixel PXL may be enhanced.

In a display device in accordance with one or more embodiments of the present disclosure, a first pixel and a second pixel that are adjacent to each other in one direction may be bound to form one pixel group, and ink including a plurality of light emitting elements may be supplied (or discharged) to the one pixel group, so that a discharge surface area of the ink may be fully secured.

Furthermore, in one or more embodiments of the present disclosure, a sufficient number of valid light sources of each pixel may be secured, so that light output efficiency of the corresponding pixel may be enhanced.

The effects, aspects, and features of embodiments of the present disclosure are not limited by the foregoing, and other various effects, aspects, and features of embodiments are anticipated herein.

While various embodiments have been described above, those skilled in the art will appreciate that various modifications, additions, and substitutions are possible, without departing from the scope of the present disclosure.

Therefore, the embodiments disclosed in this specification are only for illustrative purposes rather than limiting the technical scope of the present disclosure. The scope of the present disclosure must be defined by the accompanying claims.

What is claimed is:

1. A display device comprising:
a substrate;
a plurality of pixel columns on the substrate, each of the plurality of pixel columns comprising a plurality of pixel groups, each of the plurality of pixel groups comprising a first pixel and a second pixel arranged along a second direction; and
a bank enclosing a perimeter of each of the plurality of pixel groups, the bank including a first opening corresponding to each of plurality of the pixel groups, and a second opening located between two pixel groups adjacent to each other in the second direction among the plurality of pixel groups,
wherein the second opening extends in a first direction crossing the second direction and is spaced from the first opening in the second direction,
wherein each of the first and the second pixels comprises a first electrode and a second electrode extending in the second direction and spaced apart from each other in the first direction, and
wherein, in each of the pixel columns, the first and the second electrodes of one pixel group among the pixel groups are spaced from the first and the second electrodes of other pixel group adjacent to the one pixel group in the second direction among the pixel groups in the second opening.

2. The display device according to claim 1, wherein each of the plurality of pixel groups comprises an emission area corresponding to the first opening.

3. The display device according to claim 2, wherein, in each of the plurality of pixel columns, one pixel group of the plurality of pixel groups of the corresponding pixel column and the second opening are alternately located along the second direction.

4. The display device according to claim 3, wherein each of the first and the second pixels comprises:
a plurality of light emitting elements located between the first electrode and the second electrode.

5. The display device according to claim 4,
wherein the first electrode of the first pixel and the first electrode of the second pixel are electrically disconnected from each other in the first opening, and
wherein the second electrode of the first pixel and the second electrode of the second pixel are electrically disconnected from each other in the first opening.

6. The display device according to claim 5, wherein the emission area comprises a first emission area in which light is emitted from the first pixel, and a second emission area in which light is emitted from the second pixel.

7. The display device according to claim 6, wherein each of the first and the second pixels further comprises:
a color conversion layer located over the light emitting elements, and converting a first color of light emitted from the light emitting elements to second colors of light.

8. The display device according to claim 7, further comprising a light block pattern disposed between the color conversion layer of the first pixel and the color conversion layer of the second pixel, and
wherein the light block pattern corresponds to an area between the first emission area and the second emission area.

9. The display device according to claim 7, wherein the plurality of pixel columns comprises a first pixel column, a second pixel column, and a third pixel column that are successively arranged along the first direction.

10. The display device according to claim 9, wherein the plurality of pixel groups of the first pixel column, the plurality of pixel groups of the second pixel column, and the plurality of pixel groups of the third pixel column emit the second colors of light different from each other.

11. The display device according to claim 10,
wherein the light to be emitted from each of the plurality of pixel groups of the first pixel column is red light,
wherein the light to be emitted from each of the plurality of pixel groups of the second pixel column is green light, and wherein the light to be emitted from each of the plurality of pixel groups of the third pixel column is blue light.

12. The display device according to claim 9, wherein the plurality of pixel groups of the first pixel column, the plurality of pixel groups of the second pixel column, and the plurality of pixel groups of the third pixel column are in a same pixel row along the first direction.

13. The display device according to claim 9, wherein at least one of the plurality of pixel groups of the first pixel column, at least one of the plurality of pixel groups of the second pixel column, and at least one of the plurality of pixel groups of the third pixel column each is located on a pixel row different from at least one pixel group of a pixel column adjacent thereto in the first direction.

14. The display device according to claim 7, wherein each of the first and the second pixels comprises a pixel circuit layer on the substrate and including at least one transistor electrically connected with the light emitting elements.

15. The display device according to claim 14, wherein each of the first and the second pixels further comprises a bank pattern located each between the pixel circuit layer and the first electrode and between the pixel circuit layer and the second electrode.

16. The display device according to claim 2, wherein each of the first and the second pixels comprises:
the first electrode, the second electrode, a third electrode, and a fourth electrode extending in the second direction, and spaced from each other; and
a plurality of light emitting elements located between two adjacent electrodes of the first to the fourth electrodes, and
wherein the light emitting elements comprise at least one first light emitting element located between the first electrode and the second electrode, and at least one second light emitting element located between the third electrode and the fourth electrode.

17. The display device according to claim 16,
wherein the first electrode of the first pixel and the first electrode of the second pixel are electrically disconnected from each other in the first opening,
wherein the second electrode of the first pixel and the second electrode of the second pixel are electrically disconnected from each other in the first opening,
wherein the third electrode of the first pixel and the third electrode of the second pixel are electrically disconnected from each other in the first opening, and
wherein the fourth electrode of the first pixel and the fourth electrode of the second pixel are electrically disconnected from each other in the first opening.

18. The display device according to claim 17, wherein each of the first and the second pixels comprises:
a first connection electrode on the first electrode, and electrically connecting one end of the first light emitting element with the first electrode;
an intermediate electrode on each of the second and the fourth electrodes and electrically connecting a remaining end of the first light emitting element with one end of the second light emitting element; and
a second connection electrode on the third electrode, and electrically connecting a remaining end of the second light emitting element with the third electrode.

19. A display device comprising:
a substrate including a display area and a non-display area;
a first pixel column in the display area, the first pixel column comprising a plurality of first pixel groups each comprising two pixels arranged along a second direction;
a second pixel column in the display area at a position adjacent to the first pixel column in a first direction intersecting the second direction, the second pixel column comprising a plurality of second pixel groups each comprising two pixels arranged along the second direction;
a third pixel column in the display area at a position adjacent to the second pixel column in the first direction, the third pixel column comprising a plurality of third pixel groups each including two pixels arranged along the second direction; and
a bank enclosing a perimeter of each of the plurality of first pixel groups, the plurality of second pixel groups, and the plurality of third pixel groups, the bank including a first opening corresponding to each of the plurality of first pixel groups, the plurality of second pixel groups, and the plurality of third pixel groups, and a second opening located between two pixel groups adjacent to each other in the second direction among the pixel groups included in each of the first to the third pixel columns,
wherein each of the plurality of first pixel groups, the plurality of second pixel groups, and the plurality of third pixel groups includes an emission area corresponding to the first opening,
wherein the second opening extends in the first direction and is spaced from the first opening in the second direction,
wherein each of the two pixels of the first pixel groups comprises a first electrode and a second electrode extending in the second direction and spaced apart from each other in the first direction, and
wherein, in the first pixel column, the first and the second electrodes of one first pixel group among the first pixel groups are spaced from the first and the second electrodes of other first pixel group adjacent to the one first pixel group in the second direction among the first pixel groups in the second opening.

20. The display device according to claim 19,
wherein, in the first pixel column, one first pixel group of the plurality of first pixel groups and the second opening are alternately located along the second direction,
wherein, in the second pixel column, one second pixel group of the plurality of second pixel groups and the second opening are alternately located along the second direction, and
wherein, in the third pixel column, one third pixel group of the plurality of third pixel groups and the second opening are alternately located along the second direction.

* * * * *